(12) United States Patent
Kern et al.

(10) Patent No.: US 8,935,590 B2
(45) Date of Patent: Jan. 13, 2015

(54) CIRCUITRY AND METHOD FOR MULTI-BIT CORRECTION

(71) Applicant: Infineon Technologies AG, Neubiberg (DE)

(72) Inventors: Thomas Kern, Munich (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 13/664,495

(22) Filed: Oct. 31, 2012

(65) Prior Publication Data

US 2014/0122967 A1    May 1, 2014

(51) Int. Cl.
*G11C 29/00* (2006.01)
*G06F 11/10* (2006.01)
*G11C 7/10* (2006.01)

(52) U.S. Cl.
CPC ............ *G06F 11/10* (2013.01); *G06F 11/1076* (2013.01); *G06F 11/1068* (2013.01); *G11C 7/1006* (2013.01); *G06F 11/1044* (2013.01)
USPC ............................. 714/763; 714/758; 714/807

(58) Field of Classification Search
CPC .......... G11C 7/24; G11C 11/56; G11C 29/52; G11C 2211/4016; G11C 2211/5641; G11C 7/1006; G06F 11/1008; G06F 11/1076; G06F 11/1068; G06F 11/1044
USPC .................. 714/763, 752, 781, 758, 766, 807
See application file for complete search history.

(56) References Cited

U.S. PATENT DOCUMENTS

| | | | | |
|---|---|---|---|---|
| 4,415,992 A | * | 11/1983 | Adlhoch | 365/94 |
| 4,809,227 A | * | 2/1989 | Suzuki et al. | 365/168 |
| 5,163,021 A | * | 11/1992 | Mehrotra et al. | 365/185.03 |
| 5,432,735 A | * | 7/1995 | Parks et al. | 365/168 |
| 5,621,682 A | * | 4/1997 | Tanzawa et al. | 365/185.03 |
| 5,719,888 A | | 2/1998 | Tanzawa et al. | |
| 5,901,152 A | * | 5/1999 | Tanaka et al. | 714/718 |
| 6,269,028 B1 | * | 7/2001 | Togami | 365/189.05 |
| 6,728,124 B1 | * | 4/2004 | Ichiriu et al. | 365/49.15 |
| 6,978,343 B1 | | 12/2005 | Ichiriu | |
| 7,283,397 B2 | * | 10/2007 | Harari et al. | 365/185.22 |
| 2006/0208930 A1 | * | 9/2006 | Harada | 341/50 |
| 2007/0245168 A1 | * | 10/2007 | Noda et al. | 714/6 |
| 2009/0003041 A1 | * | 1/2009 | Kajigaya | 365/151 |
| 2012/0079343 A1 | | 3/2012 | Goessel et al. | |

* cited by examiner

*Primary Examiner* — Albert Decady
*Assistant Examiner* — Osman Alshack
(74) *Attorney, Agent, or Firm* — Eschweiler & Associates, LLC

(57) ABSTRACT

A circuitry is provided that includes a memory including a plurality of memory cells, wherein at least one of the plurality of memory cells of the memory is configured to take on one of at least three different states. The circuitry also includes a first subcircuit BT configured to generate a plurality of ternary output values based on a sequence of binary values, a second subcircuit LH configured to transform one or more ternary state values into binary auxiliary read values based on the one or more state values, and an encoder configured to generate one or more binary check bits, wherein the encoder is configured to store each of the generated one or more check bits in a different memory cell.

45 Claims, 21 Drawing Sheets

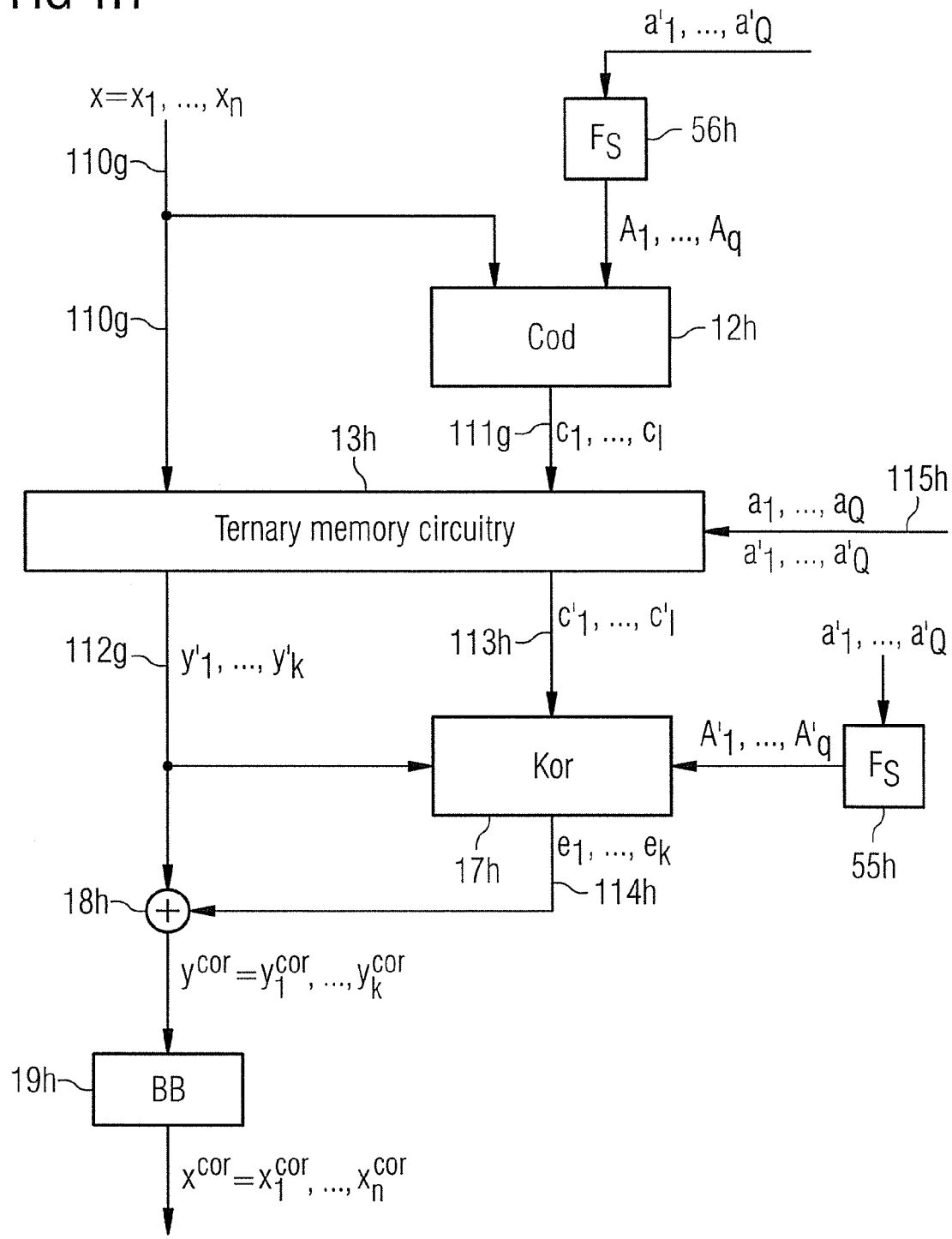

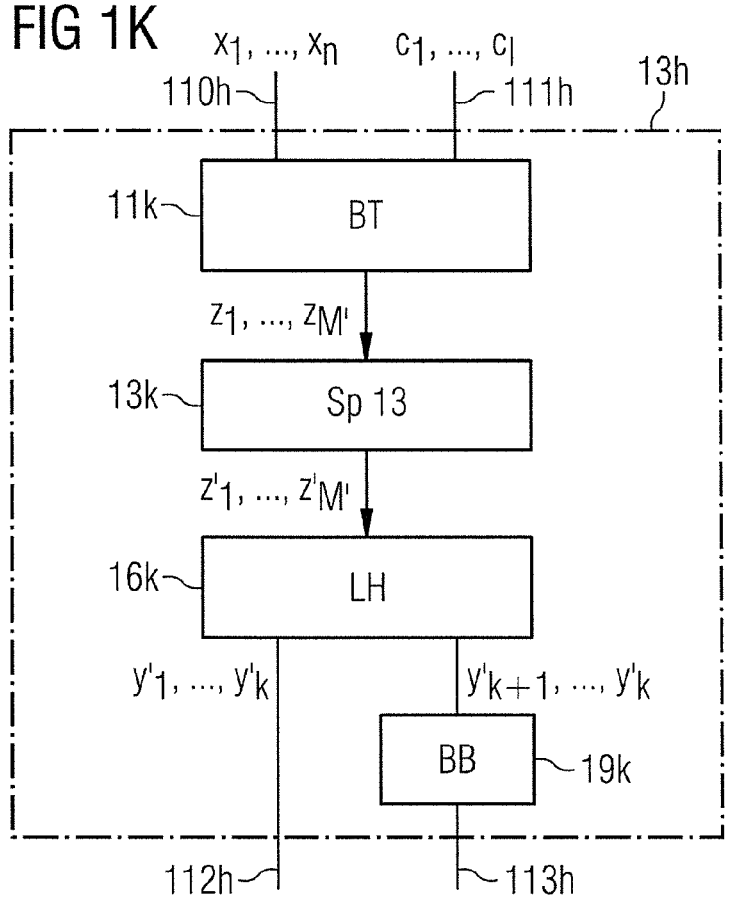
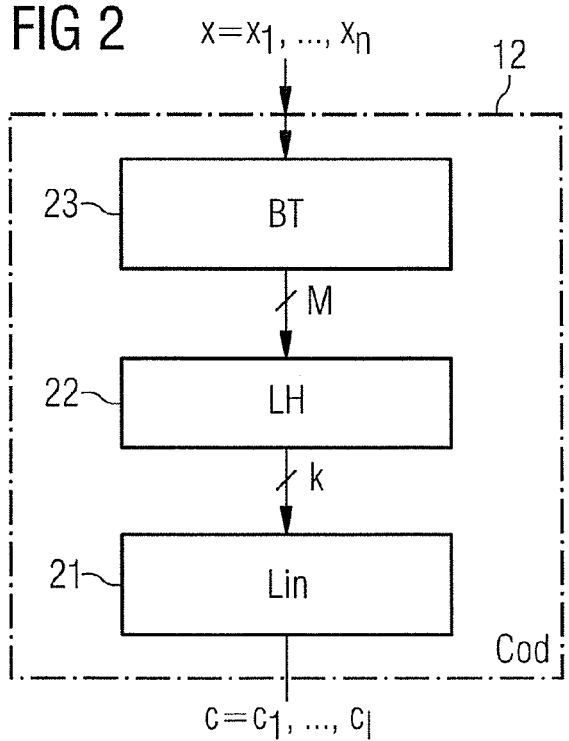

CIRCUITRY AND METHOD FOR MULTI-BIT CORRECTION

FIELD

The present invention relates to error correction and error detection, and, in particular, to an apparatus and method for correction of errors of memories with memory cells with more than two states.

BACKGROUND

Error correction and error detection techniques play an important role. Not only in the field of computer networks and data transmission over wired and wireless networks but also in the field of protection of memory content, error correction and error detection techniques are widely employed.

While conventional memories comprise binary memory cells, in the last years, ternary memory cells, which can take on three different values have become increasingly important.

It would be highly beneficial if improved concepts for correction of errors in memories with memory cells with more than two states would be provided.

SUMMARY

According to an embodiment, a circuitry is provided. The circuitry comprises a memory comprising a plurality of memory cells, wherein one or more of the plurality of memory cells of the memory are each adapted to take on one of at least three different states. The circuitry further comprises a first subcircuit BT configured to generate a plurality of output values, based on a sequence of binary values, wherein a nonempty subset of the plurality of output values has one of at least three different values of the nonempty subset of output values, and wherein the first subcircuit BT is configured to store each of the output values as a state value in a different one of the one or more memory cells which are each adapted to take on one of the at least three different states. The circuitry also comprises a second subcircuit LH configured to read one or more of the state values from at least one of the memory cells which are adapted to take on one of the at least three different states, wherein each of the one or more state values has one of at the at least three different basic values, and wherein the second subcircuit LH is furthermore configured to determine binary auxiliary read values based on the one or more state values. Lastly, the circuitry comprises an encoder configured to generate one or more binary check bits based on at least some values of the sequence of binary values, wherein an error-correcting code comprises a plurality of codewords, and wherein the encoder is configured to generate the one or more binary check bits so that the binary auxiliary read values and the one or more binary check bits together form one of the codewords of the error-correcting code, when the binary auxiliary read values $y_1', \ldots, y_k'$ and the one or more binary check bits $c_1, \ldots, c_j$ are error-free. The encoder is configured to store each of the generated one or more check bits in one or more of the memory cells of the memory, such that each of the one or more check bits is stored in a different one of the memory cells of the memory, wherein each one of the memory cells in which a check bit is stored is adapted to take on one of at least two different states.

Moreover, a circuitry according to another embodiment is provided. The circuitry comprises a memory comprising a plurality of memory cells, wherein one or more of the plurality of memory cells of the memory are ternary memory cells each being adapted to take on one of three different states. The circuitry further comprises a first subcircuit BT configured to generate a plurality of output values, based on a sequence of binary values, wherein a nonempty subset of the plurality of output values has one of three different basic values, wherein the first subcircuit is configured to store each of the output values of the nonempty subset of output values as a state value in a different one of the one or more ternary memory cells which are each adapted to take on one of the three different states, and the remaining output values in memory cells configured to store at least two different values. The circuitry also comprises a second subcircuit LH configured to read one or more of the state values from the memory cells, wherein the second subcircuit LH is furthermore configured to determine binary auxiliary read values based on the one or more state values. The circuitry also comprises an encoder configured to generate one or more binary check bits based on at least some values of the sequence of binary values, wherein an error-correcting code comprises a plurality of codewords, and wherein the encoder is configured to generate the one or more binary check bits so that the binary auxiliary read values and the one or more binary check bits together form one of the codewords of the error-correcting code, when the binary auxiliary read values $y_1', \ldots, y_k'$ and the one or more binary check bits $c_1, \ldots, c_j$ are error-free. The encoder is configured to store each of the generated one or more check bits in one or more of the memory cells of the memory, such that each of the one or more check bits is stored in a different one of the memory cells of the memory, wherein each one of the memory cells in which a check bit is stored is adapted to take on one of at least two different states. The circuitry further comprises a corrector Cor, a combinational circuit Vkn, and a third subcircuit BB, wherein the second subcircuit LH is configured to feed the binary auxiliary read values into the corrector Cor and into the combinational circuit Vkn. The corrector Cor is configured to read the one or more check bits from one or more of the memory cells of the memory, wherein the corrector Cor is configured to generate the error correction bits based on the binary auxiliary read values and the one or more check bits, and wherein the corrector Cor is configured to feed the error correction bits into the combinational circuit Vkn. The combinational circuit Vkn is configured to conduct error correction on the binary auxiliary read values based on the error correction bits to obtain binary auxiliary error-free, e.g. corrected, read values, and the third subcircuit BB is configured to transform of the binary auxiliary error-free read values into binary corrected data bits.

Furthermore, a circuitry according to another embodiment is provided. The circuitry is configured to store sequences of binary values $x_1, \ldots, x_n$ in a memory Sp comprising memory cells, wherein $n \geq 3$, wherein each of the memory cells of the memory is either adapted to take on one of three state values or to take on one of two state values, and wherein at least one of the memory cells of the memory is adapted to take on one of three state values. The circuitry comprises a first subcircuit BT having n binary inputs and M outputs, wherein the first subcircuit BT is adapted to transform n binary input values $x_1, \ldots, x_n$ into M output values $z_1, \ldots, z_m, z_{m+1}, \ldots, z_M = BT(x_1, \ldots, x_n)$, wherein $2 \leq m \leq M$, wherein $M < n$, and wherein $n \geq 4$, wherein each of the output values $z_1, \ldots, z_m$ has one of three different values depending on the binary input values. Each of the output values $z_{m+1}, \ldots, z_M$ has one of at most two different values depending on the binary input values, wherein the first subcircuit BT has M outputs which are connected with M data inputs of the memory Sp, wherein, when writing into the memory Sp, the output values $z_1, \ldots, z_m$ of the first subcircuit BT are stored into the memory cells of the memory, which are adapted to take on one of three states, and wherein the output values $z_{m+1}, \ldots, z_M$ are stored in memory cells which are adapted to take on one of at least two state values. The circuitry further comprises a second subcircuit LH for determining binary auxiliary read values $y_1', \ldots, y_k' = LH(z_1', \ldots, z_m', z_{m+1}', \ldots, z_M')$, wherein the second subcircuit LH has M inputs and k outputs, wherein, when reading from the memory, m first inputs of the inputs of the second subcircuit LH are connected to the data outputs of the memory cells of memory Sp, into which, when writing, the ternary values $z_1, \ldots, z_m$ are written, and from which, when reading, the possibly erroneous ternary values $z_1', \ldots, z_m'$ are read out. Further, M−m inputs of the second subcircuit LH are connected to the data outputs of the memory cells into which, when writing, the values $z_m, \ldots, z_M$ are written, and from which, when reading, the possible erroneous values $z_{m+1}', \ldots, z_M'$ are read out, and wherein the second subcircuit LH outputs k possibly erroneous binary auxiliary read values $y_1', \ldots, y_k'$ with k≥m+M at its k outputs. The circuitry also comprises an encoder Cod with n binary inputs and l binary outputs for determining l binary check bits $c_1, \ldots, c_l$ from the n binary input values $x_1, \ldots, x_n$ with $c_1, \ldots, c_l =$ Cod $(x_1, \ldots, x_n)$, wherein at n binary inputs of the encoder Cod, the binary input values $x_1, \ldots, x_n$ are applied, and at l binary outputs of the encoder, binary check bits $c_1, \ldots, c_l$ determined by the binary input values $x_1, \ldots, x_n$ are output. The encoder is configured, so that it determines the check bits $c_1, \ldots c_l$ from the binary input values $x_1, \ldots, x_n$ so that bits $y_1, \ldots, y_k$, $c_1, \ldots, c_l$ form a codeword of an error-correcting code C of the length k+l with k data bits and l check bits, where $y_1, \ldots, y_k$ are the k binary error free auxiliary read values.

According to another embodiment, a method is provided. The method comprises generating a plurality of output values based on a sequence of binary values, wherein each of the plurality of output values has one of at least three different basic values. The method further comprises storing each of the output values as a state value in a different one of one or more memory cells of a plurality of memory cells of a memory, wherein the one or more memory cells, in which the output values are stored, are each adapted to take on one of at least three different states. The method also comprises reading one or more of the state values from at least one of the memory cells which are adapted to take on one of the at least three different states, wherein each of the one or more state values has one of the at least three different basic values, wherein the binary auxiliary read values are determined based on the one or more state values. The method continues by generating one or more binary check bits so that the binary auxiliary read values and the one or more binary check bits together form one of the codewords of the error-correcting code, when the binary auxiliary read values $y_1', \ldots, y_k'$ and the one or more binary check bits $c_1, \ldots, c_l$ are error-free, and storing each of the generated one or more check bits in one or more of the memory cells of the memory, such that each of the one or more check bits is stored in a different one of the memory cells of the memory, wherein each one of the memory cells in which a check bit is stored is adapted to take on one of at least two different states.

Before embodiments of the present invention are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

BRIEF DESCRIPTION OF THE DRAWINGS

FIG. 1h illustrates circuitry according to an embodiment, wherein data bits are stored in memory cells of a ternary memory circuitry, FIG. 1k illustrates ternary memory circuitry according to a further embodiment, FIG. 2 illustrates an implementation of a coder according to an embodiment.

DETAILED DESCRIPTION

Figure 1A:
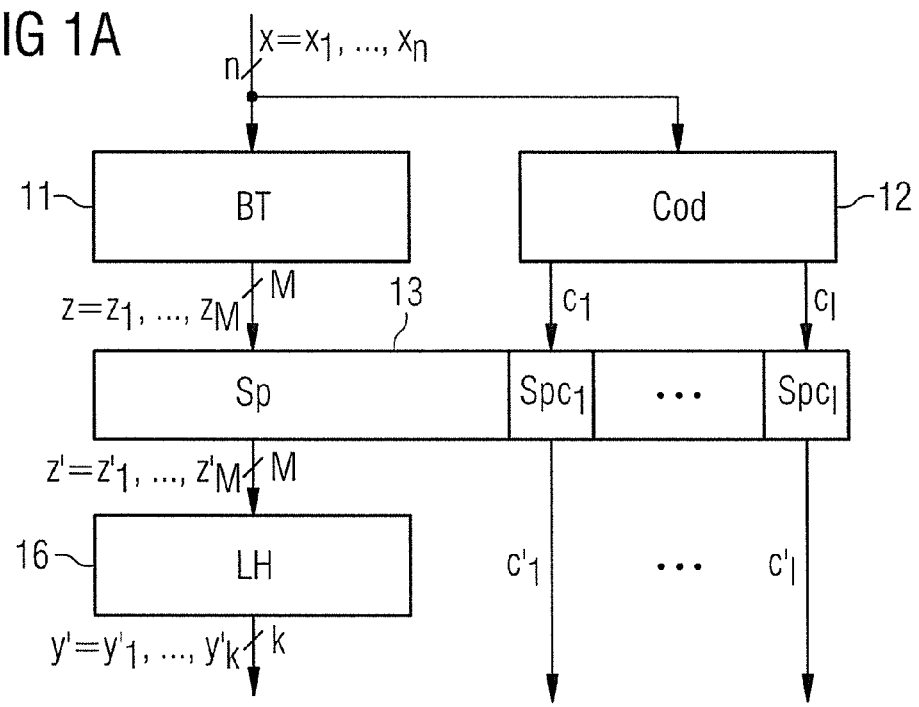
FIG. 1a illustrates circuitry for error correction according to an embodiment.

FIG. 1a illustrates a circuitry according to an embodiment.

The circuitry comprises a memory Sp 13 comprising a plurality of memory cells, wherein one or more of the plurality of memory cells of the memory are each adapted to take on one of at least three different states.

Thus, at least one of the memory cells of the memory is adapted to take on one of at least three different states. For example, a ternary memory cell is adapted to take on one of exactly three different states. (e.g. the state may represent exactly one of the values 0, 1 or 2). Instead of a ternary memory cell, the memory may comprise at least one multi-valued memory cell, wherein such a multi-valued memory cell may be adapted to take on one of four or more different states (e.g. the state may represent exactly one of the values 0, 1, 2 or 3). The memory comprises at least one memory cell which is adapted to take on one of at least three different states (e.g. a ternary memory cell or a multi-valued memory cell which can take on one of more than three different states). The memory may, however, also comprise memory cells which are adapted to take on one of only two different states, e.g. the memory may also comprise one or more binary memory cells. However, at least one of the memory cells of the memory is adapted to take on at least one of three different states. In some of the embodiments, however, all memory cells of the memory may take on one of at least three different states.

The circuitry of FIG. 1a comprises a first subcircuit BT 11 configured to generate a plurality of output values $z_1, \ldots, z_M$, based on a sequence of binary values $x_1, \ldots, x_n$, wherein each of the plurality of output values $z_1, \ldots, z_M$ has one of at least three different basic values, (e.g. one value of the basic values 0, 1, 2), wherein the first subcircuit BT 11 is configured to store each of the output values $z_1, \ldots, z_M$ in a different one of the one or more memory cells which are each adapted to take on one of the at least three different states. Each of the output values stored in the memory 13 can be considered as a state value of the corresponding memory cells. By this, the plurality of output values stored in memory represents a plurality of state values.

Furthermore, the circuitry comprises a second subcircuit LH 16 configured to read one or more of the state values $z_1', \ldots, z_M'$ from at least one of the memory cells, the memory cells being adapted to take on one of the at least three different states, wherein each of the one or more state values $z_1', \ldots, z_M'$ has one of the at least three different basic values (e.g. one of the values 0, 1, 2), wherein the second subcircuit LH 16 is furthermore configured to determine binary auxiliary read values $y_1', \ldots, y_k'$ based on the one or more state values $z_1', \ldots, z_M'$.

Moreover, the circuitry comprises an encoder Cod 12 configured to generate one or more binary check bits $c_1, \ldots, c_l$ based on at least some values of the sequence of binary values, wherein an error-correcting code comprises a plurality of codewords, and wherein the encoder Cod 12 is configured to generate the one or more binary check bits $c_1, \ldots, c_l$ so that the binary auxiliary read values $y_1', \ldots, y_k'$ and the one or more binary check bits $c_1, \ldots, c_l$ together form one of the codewords of the error-correcting code, when the binary auxiliary read values $y_1', \ldots, y_k'$ and the one or more binary check bits $c_1, \ldots, c_l$ are error-free.

The encoder 12 is configured to store each of the generated one or more check bits in one or more of the memory cells of the memory 13, such that each of the one or more check bits is stored in a different one of the memory cells of the memory, wherein each one of the memory cells in which a check bit is stored is adapted to take on one of at least two different states.

Basic values may, for example, be all the values, e.g. all the numbers, of a set of values that, for example, an output value or a state value can take on. For example, basic values may be all the numbers that a value, e.g. an output value, a state value or a value of a sequence can take on.

If, for example, an output value is a ternary value, then the output value can take on one of three values. For example, the output value can take on one value of the set of values {0, 1, 2}. Then, the three different basic values are 0, 1 and 2.

If, for example, a value of a sequence of binary values is to be determined, then, for example, a value of the sequence can take on one value of the set of two numbers, e.g. of the set {0, 1}. Then, the value can take on one of two different basic values, and the two different basic values are 0 and 1.

In an embodiment, the one or more of the plurality of memory cells of the memory, which are each adapted to take on one of at least three different states, may be ternary memory cells. In such an embodiment, the first subcircuit BT 11 may be configured to generate the plurality of output values such that each of the plurality of output values has one of exactly three different basic values, wherein the first subcircuit is configured to store each of the output values in a different one of the ternary memory cells. Moreover, the second subcircuit LH 16 may be configured to read the one or more state values from at least one of the ternary memory cells, wherein each of the one or more state values has one of exactly three different basic values, and wherein the second subcircuit LH 16 is furthermore configured to determine binary auxiliary read values based on the one or more state values.

Figure 1B:
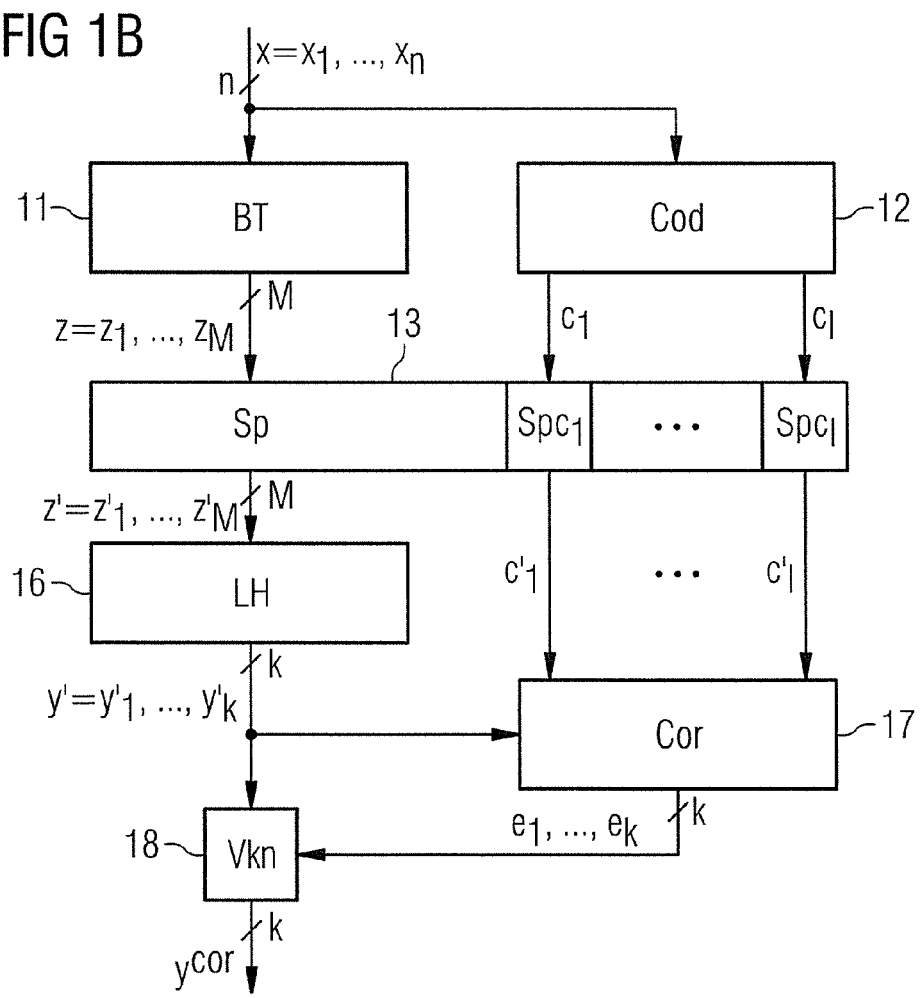
FIG. 1b illustrates circuitry for error correction according to another embodiment.

FIG. 1b illustrates circuitry according to another embodiment. Compared with the embodiment of FIG. 1a, the circuitry of the embodiment of FIG. 1b furthermore comprises a corrector Cor 17 and a combinational circuit Vkn 18.

The second subcircuit LH 16 is configured to feed the binary auxiliary read values $y_1', \ldots, y_k'$ into the corrector Cor 17 and into the combinational circuit Vkn 18.

The corrector Cor 17 is configured to read the one or more check bits $c' = c_1', \ldots, c_l'$ from one or more of the memory cells $Spc_1, \ldots, Spc_l$ of the memory, wherein the corrector Cor 17 is configured to generate the error correction bits $e_1, \ldots, e_k$ based on the binary auxiliary read values and the one or more check bits. The corrector Cor 17 is configured to feed the error correction bits $e_1, \ldots, e_k$ into the combinational circuit Vkn 18.

The combinational circuit Vkn 18 is configured to conduct error correction on the binary auxiliary read values $y_1', \ldots, y_k'$ based on the error correction bits $e_1, \ldots, e_k$ to obtain binary auxiliary error-free read values $y^{cor}$.

In an embodiment, the combinational circuit Vkn 18 is configured to conduct error correction such that the binary auxiliary error-free read values $y^{cor}$ and the one or more check bits $c' = c_1', \ldots, c_l'$ form one of the codewords of the error-correcting code.

Figure 1C:
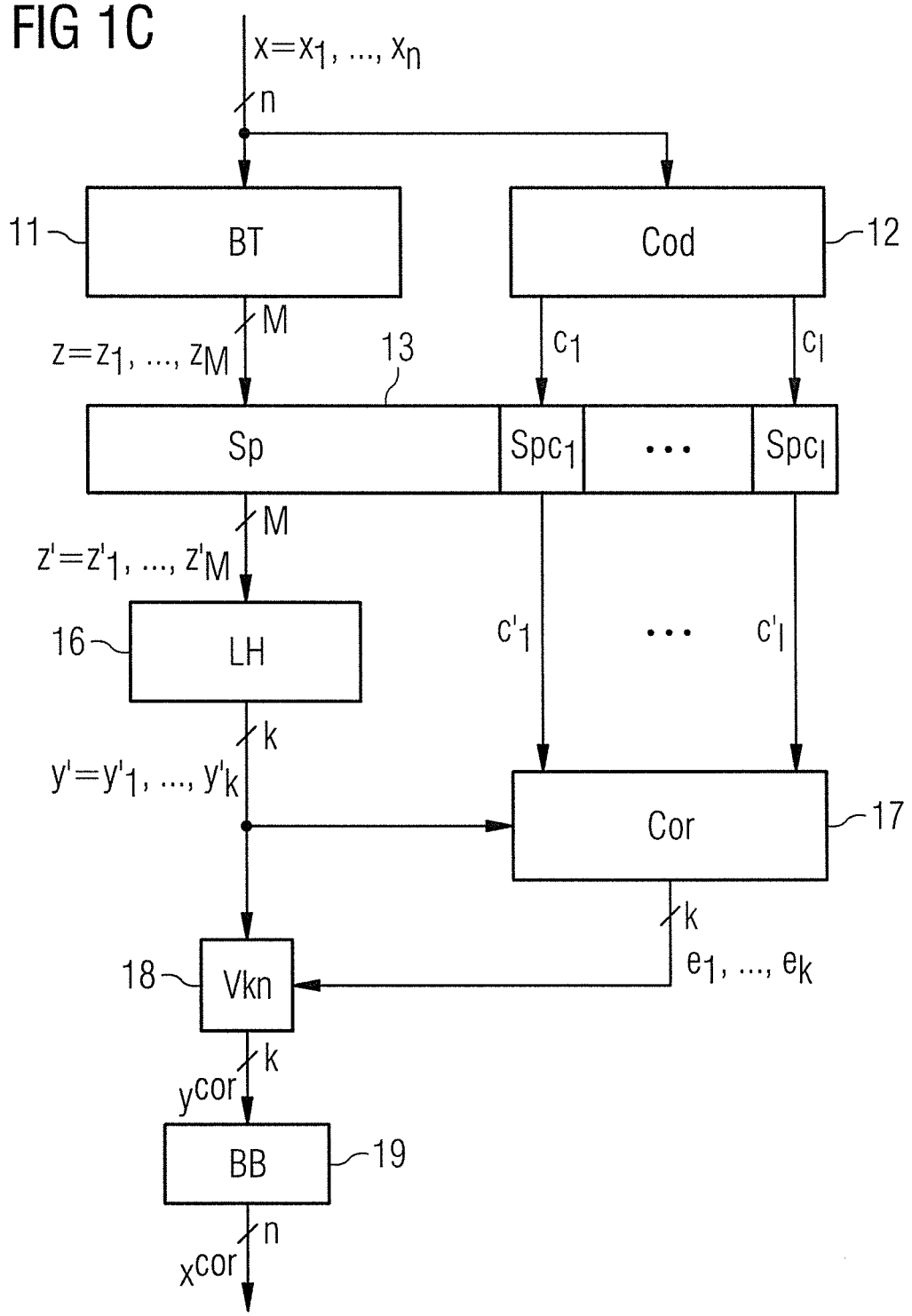
FIG. 1c illustrates circuitry for error correction according to a further embodiment.

FIG. 1c illustrates circuitry according to a further embodiment. Compared with the embodiment of FIG. 1b, the circuitry of the embodiment of FIG. 1c further comprises a third subcircuit BB 19. The third subcircuit BB 19 is configured to transform the binary auxiliary error-free read values $y^{cor}$ into n binary error-corrected data bits $x^{cor}$.

Figure 1D:
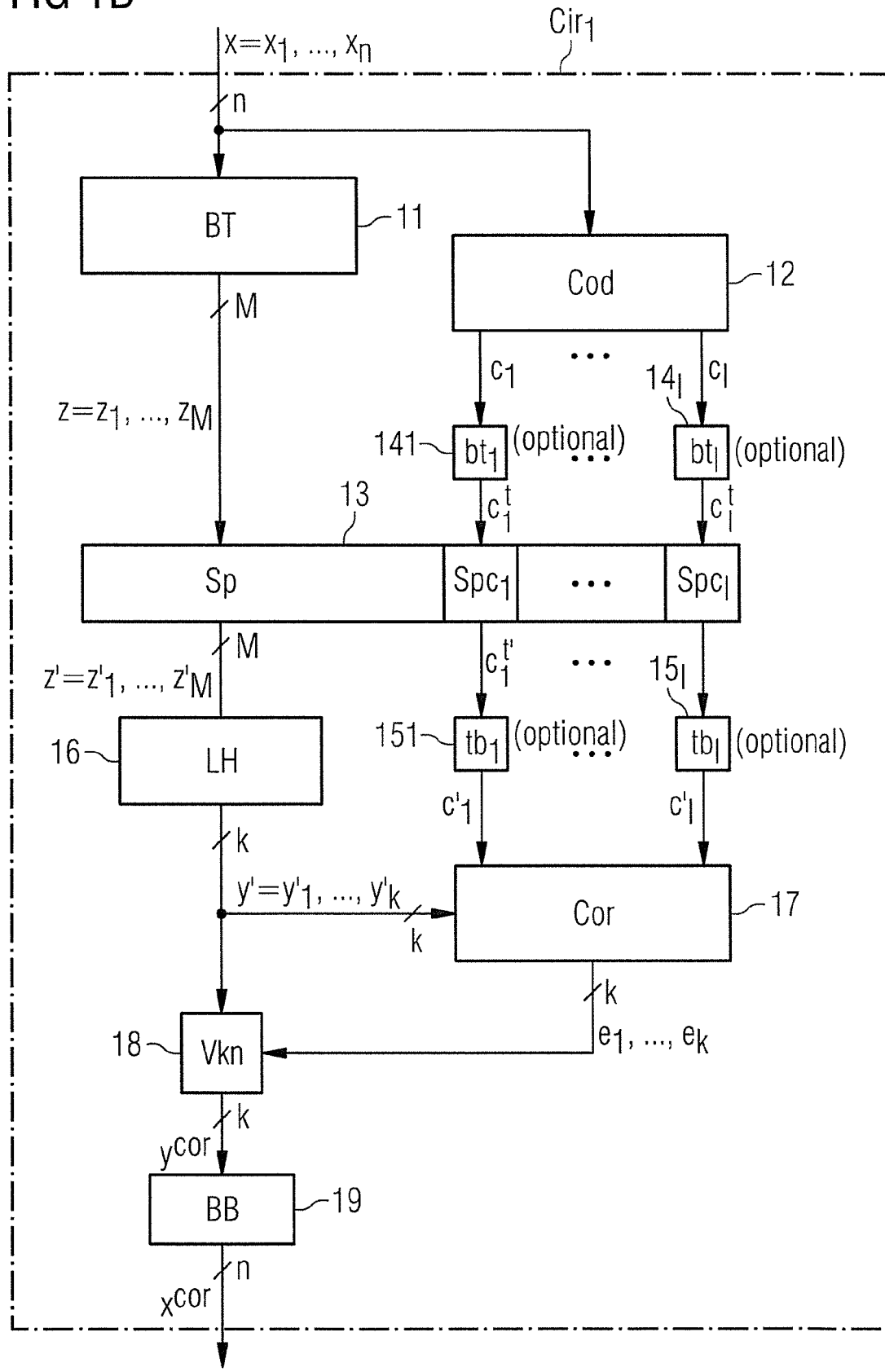
FIG. 1d illustrates circuitry for error correction according to a further embodiment.

FIG. 1d illustrates circuitry $Cir_1$ according to a further embodiment. The circuitry $Cir_1$ may comprise the following subcircuits:

1. A subcircuit BT 11 for the transformation of a sequence of n binary input values or data bits $x = x_1, \ldots, x_n$ into a sequence of M output values $z = z_1, \ldots, z_m, z_{m+1}, \ldots, z_M$, $$z_1, \ldots z_m, z_{m+1} \ldots, z_M = BT(x_1, \ldots, x_n),$$

may exist, wherein $2 \leq m \leq M$ and $M < n$, $n \geq 3$ applies. Here, each of the output values $z_1, \ldots, z_m$, may take on three different values depending on the binary values $x_1, \ldots, x_n$. Depending on the binary values $x_1, \ldots, x_n$, each of the output values $z_{m+1}, \ldots, z_M$ may take on at most two different values. The subcircuit BT 11 is implemented so that different sequences of n binary input values are transformed into different sequences of M binary output values.

2. An encoder Cod 12 with n binary inputs and l binary outputs for determining l binary check bits $c_1, \ldots, c_l$ may exist with $$c_1, \ldots, c_l = Cod(x_1, \ldots, x_n),$$

wherein at the n binary inputs, the binary input values $x_1, \ldots, x_n$, are applied and at the binary outputs the corresponding check bits $c_1, \ldots, c_l$ are output.

3. A memory Sp 13 may exist for storing the values $z_1, \ldots z_m, z_{m+1}, \ldots, z_M$, and $c_1, \ldots, c_l$, wherein each of the memory cells for storing the values $z_1, \ldots z_m$ may take on three different values as states, and wherein each of the memory cells for storing the values $z_{m+1}, \ldots, z_M, c_1, \ldots, c_l$ may take on at least two different values as states. The memory cells which serve for storing the check bits $c_1, \ldots, c_l$ are designated by $Spc_1, \ldots, Spc_l$. In FIG. 1d, the case is illustrated that the memory cells $Spc_1, \ldots, Spc_l$ may take on three different states.

For $j = 1, \ldots, l$, the j-th output of the encoder 12 which carries the checkbit $c_j$ is connected when writing to the data input of the memory cell $Spc_j$ via a subcircuit $bt_j$ 14j with a binary input and a ternary output for the transformation of the binary value $c_j$ into a ternary value $c_j^t = bt_j(c_j)$. Here, the subcircuit $bt_j$ 14j may transform for example a minimum binary value designated as $0_{bin}$ into a minimum ternary value designated as $0_{ter}$, and may transform a maximum binary value designated as $1_{bin}$ into a maximum ternary value designated as $2_{ter}$. The subcircuit $bt_j$ 14j may for example also transform a minimum binary value designated as $0_{bin}$ into a maximum ternary value designated as $2_{ter}$ and a maximum binary value designated as $1_{bin}$ into a minimum ternary value designated as $0_{ter}$.

According to an embodiment, the binary value $c_j$, $j = 1, \ldots, l$ of the check bits is each stored as a transformed value $c_j^t = bt_j(c_j)$ in a separate memory cell $Spc_j$ of the memory Sp 13, while the individual data bits $x_1, \ldots, x_n$ are generally not stored in a separate memory cell of the ternary memory.

By this, the sequence of the n data bits $x_1, \ldots, x_n$ is transformed into M values $z_1, \ldots z_m, z_{m+1}, \ldots, z_M$ with $M < n$ by the subcircuit BT, wherein $z_1, \ldots z_m$ are ternary values each stored in a ternary memory cell. Here, for example, three binary values $x_{i1}, x_{i2}, x_{i3}$ of the data bits are transformed into two ternary values $z_{i1}, z_{i2}$ by the subcircuit BT 11, so that then the information of three data bits may be stored in two ternary memory cells as will be described in more detail later.

4. A subcircuit LH 16 may exist for the transformation of the possibly erroneous state values $z_1', \ldots, z_M'$, which are read out of the memory Sp 13 into k binary auxiliary read values $$y_1', \ldots, y_k' = LH(z_1', \ldots, z_M'),$$

wherein the subcircuit LH 16 is configured so that different sequences of M state values, which are read out of the memory, are assigned to different sequences of k binary auxiliary read values, wherein to each ternary state component $z_i'$, $i = 1, \ldots, m$ at least two binary auxiliary read values are assigned, and wherein to each binary state component $z_j'$, $j = \overline{m}+1, \ldots, M$, at least one binary auxiliary read value is assigned, and wherein $k > M$ applies.

As already indicated, at least two binary auxiliary read values are assigned to one ternary value $z_i'$, $1 \leq i \leq m$.

If, for example, a pair $y_{i1}, y_{i2}$ of auxiliary read values is assigned to the 3-value state component $z_i$, then this pair of binary auxiliary read values only takes on three of four basically possible binary values.

The encoder 12 is implemented so that it determines check bits $c_1, \ldots, c_l$ so that $c_1, \ldots, c_l y_1', \ldots, y_k'$ is the codeword of an error-correcting code C when no error occurred. As stated, the pairs of auxiliary read values $[y_1', y_2'], [y_3', y_4'], \ldots$ each only take on three different values of four basically possible binary values each, so that each of these pairs may be assigned to a memory state of a ternary memory cell.

In contrast to that, depending on the value of the data bits, the pairs of check bits, for example $[c_1, c_2], [c_3, c_4], \ldots$ take on any of the possible four different value combinations, as can be seen when considering concrete codes, like linear codes, and as will be explained later for an embodiment. The check bits are here determined so that they are an XOR combination of corresponding bits of the auxiliary read values according to the used code C.

According to an embodiment, as indicated above, the check bits of the auxiliary read values generated by the encoder are each stored in a separate memory cell, while, for example, triples of data bits may be stored in two ternary memory cells, so that an error in a memory cell, that stores a check bit, may only affect one single check bit. As the number of the check bits is often low compared to the data bits or the number of the auxiliary read values, the required effort for storing the each of the check bits in a separate memory cell is also low.

5. A corrector Cor 17 with l first binary inputs and k second binary inputs and k binary outputs may exist, which is configured so that depending on the binary, possibly erroneous check bits $c' = c_1', \ldots, c_l'$ applied at its first inputs and that depending on its binary possibly erroneous auxiliary read values $y' = y_1', \ldots, y_k'$ applied to its k binary inputs, the corrector Cor 17 outputs at its k binary outputs a k-component correction vector $e = e_1, \ldots e_k$ for correcting the bits $y_1', \ldots, y_k'$ of the auxiliary read values. Then, the correction bits $e_1, \ldots, e_k$ are here described as a correction error $e = e_1, \ldots, e_k$.

For $j = 1, \ldots, l$ when reading from the memory Sp 13, the data output of the memory cell $Spc_j$ is connected to the input of a subcircuit $tb_j$ 15j, whose output is connected to the j-th input of the l first inputs of the corrector Cor 17. The subcircuit $tb_j$ 15j transforms the ternary, possibly erroneous value $c_j^{t'}$ output by the memory cell $Spc_j$ into the binary value $c_j' = tb_j(c_j^{t'})$.

6. A combinational circuit Vkn 18 with $2 \cdot k$ binary inputs and k binary outputs may exist, which outputs, when inputting $y_1', \ldots, y_k'$ at its first k inputs and $e_1, \ldots, e_k$ at its second k inputs at its k bit output the corrected auxiliary read values $$y^{cor} = y_1^{cor}, \ldots, y_k^{cor} = [y_1'op_1e_1], \ldots, [y_k'op_ke_k] = y'ope$$

wherein $op_1, \ldots, op_k$ are each uniquely invertible binary operations.

Here, the corrector Cor 17 and the combinational circuit Vkn 18 are implemented so that $$y = y_1, \ldots, y_k = [y_1'op_1e_1], \ldots, [y_k'op_ke_k] = y'ope$$

applies, when an error, which may be corrected by the code C, exists. The bits $y_1, \ldots, y_k$ are here determined by the subsequent transformations of the data bits $x_1, \ldots, x_n$ by the subcircuits BT 11 and LH 16 as $$y_1, \ldots, y_k = LH[BT(x_1, \ldots, x_n)].$$

7. A subcircuit BB 19 may exist for the transformation of the k bit corrected binary auxiliary read values $y_1^{cor}, \ldots, y_k^{cor}$ into the corrected binary output values $$x_1^{cor}, \ldots, x_n^{cor} = BB(y_1^{cor}, \ldots, y_k^{cor}),$$

wherein $x_1^{cor}, \ldots, x_n^{cor} = x_1, \ldots, x_n$ applies when an error exists which may be corrected by the code C.

The subcircuits BT 11, LH 16 and BB 19 are configured so that $$BB\{LH[BT(x_1, \ldots, x_n)]\} = x_1, \ldots, x_n$$

applies, so that subsequent transformations of the data bits $x_1, \ldots, x_n$ by the subcircuits BT 11, LH 16 and BB 19 reproduces the data bits.

If no error occurred, a zero-correction vector $e^0 = e_1^0, \ldots, e_k^0$ with $y_i op_i e_i^0 = y_i$ is output at the k outputs of the corrector Cor 17.

The following examples provide embodiments with slight modifications:

The encoder Cod 12 may be modified so that it determines the check bits $c_1, \ldots, c_l$ so that $c^{i1}, \ldots, c_l^{il}$ and $y_1^{j1}, \ldots, y_k^{jk}$ with $y_1, \ldots, y_k = LH[Tr1(x_1, \ldots, x_n)]$ form a codeword of an error-correcting code C with k data bits and l check bits. Here, $y_j^0 = \overline{y}_j$ and $y_j^1 = y_j$ and accordingly $c_j^0 = \overline{c}_j$ and $c_j^1 = c_j$ so that the components of the auxiliary read values and the check bits may either be provided inverted or non-inverted.

The corrector Cor 17 may be modified so that it provides the correction vector in the form of $e_1^{i1}, \ldots, e_k^{ik}$, for example by inverters being connected to individual outputs of the same.

If all bits of the correction vector are provided non-inverted and if all auxiliary read values are also provided non-inverted, then the operations $op_i$ may be chosen to be an XOR operation $\oplus$. If all bits of the correction vector are provided inverted and if all auxiliary read values are provided non-inverted, then the operations $op_i$ may be chosen to be an XNOR operation.

In an embodiment, it may be further possible to exchange the order of different bits.

In order to make the description as easily understandable as possible, in the following the check bits, the bits of the correction vector and the bits of the auxiliary read values are regarded to be non-inverted. In other embodiments, bits of the correction vector and/or bits of the auxiliary read values may be inverted.

If the error-correcting code C is a linear code which may be characterized by a (k, k+l)-generator matrix or a G-matrix $G = (1_k, P_{k,l})$, the following applies $$c = c_1, \ldots, c_l = Cod(x_1, \ldots, x_n) = (y_1, \ldots, y_k) \cdot P = LH[BT(x_1, \ldots, x_n)] \cdot P,$$

wherein $1_k$ is the k-dimensional binary identity matrix and $P_{k,l}$ is a binary (k, l) matrix which is called the parity matrix of the code C. In this case, the check bits $c_1, \ldots, c_l$ also result by multiplication of the error-free auxiliary read values $y_1, \ldots, y_k$, which have been determined from the data values $x_1, \ldots, x_n$, with the parity matrix P. As illustrated in FIG. 2, the encoder Cod 12 then comprises a linear circuit Lin 21, downstream from the subcircuit LH 22 and the subcircuit BT 23. The subcircuit LH 22 is equal to the subcircuit LH 16 of FIG. 1*d* and the subcircuit BT 23 is equal to the subcircuit BB 11 of FIG. 1*d*. The subcircuit Lin 21 realizes the multiplication of the error-free auxiliary read values $y_1, \ldots, y_k = LH[BT(x_1, \ldots, x_n)]$ with the parity matrix P.

A person skilled in the art may optimize the series connection of the circuits of LH and BT together.

The corrector Cor 17 is configured so that in case of an error, which may be corrected by the code C in the auxiliary read values $y_1', \ldots, y_k'$ and the check bits $c_1', \ldots, c_l'$ is determined by the correction bits $e_1, \ldots, e_k$ of the auxiliary read values $y_1', \ldots, y_k'$ for the considered error-correcting code C, wherein $y_1', \ldots, y_k'$ are possibly erroneous auxiliary read values determined by the circuit LH 16 of the reading out possibly erroneous state values $z_1', \ldots, z_m', z_{m+1}', \ldots, z_M'$ from the memory 13. The bits $c_1', \ldots, c_l'$ are the check bits which are possibly erroneous after reading out of the memory 13.

Now, the functioning of the circuitry of FIG. 1*d* is to be described. The sequence $x_1, \ldots, x_n$ of binary data to be stored is applied both to the n bit input of the subcircuit BT 11 and also to the n bit input of the encoder Cod 12. At its M outputs the subcircuit BT 11 outputs the values $z_1, \ldots, z_m$ to be stored in the memory Sp 13. Here, the values $z_1, \ldots, z_m$ are each analog values, which are interpreted as three different values, e.g. as ternary values, depending on their assignment to one of three different non-overlapping intervals.

In order to emphasize that these are ternary or binary values, ternary values are designated as $ter_1$, $ter_2$, $ter_3$ or as $0_{ter}$, $1_{ter}$, $2_{ter}$ while binary values are designated as $0_{bin}$ and $1_{bin}$. If ternary values or states are written into different memory cells A and B or read from the same, they are also designated as $A_0$, $A_1$, $A_2$ or $B_0$, $B_1$, $B_2$ to be able to differentiate the same better.

Here, the ternary values $0_{ter}$, $1_{ter}$, $2_{ter}$ are designated so that the analog values corresponding to $0_{ter}$ and $1_{ter}$ belong to intervals which are adjacent just like the analog values which correspond to $1_{ter}$ and $2_{ter}$ also belong to adjacent or neighboring intervals. In this respect, the ternary values $0_{ter}$ and $1_{ter}$ just like the ternary values $1_{ter}$ and $2_{ter}$ are neighboring values. The ternary values $0_{ter}$ and $2_{ter}$ are not neighboring.

The ternary values $z_1, \ldots z_m$ are stored into memory cells of the memory Sp 13 with ternary states.

The output values $z_{l+1}, \ldots, z_M$ of the subcircuit BT 11 are such output values which only each take on at most two different values. It is here possible that $z_j$ for $j \in \{m+1, \ldots, M\}$ takes on two of the three basically possible three ternary values, for example, the ternary values $0_{ter}$ and $2_{ter}$ or also two binary values 0 and 1.

If $z_j$ takes on binary values 0, 1, then $z_j$ may be stored in a binary memory cell of the memory Sp 13. $z_j$ may also be stored in a ternary memory cell of the memory Sp 13. Then, only two different ternary values are written into the corresponding ternary memory cell. Based on a possible error, in principle also the third memory state may be taken on by the considered memory cell.

The memory cells for storing the values $z_1, \ldots, z_m$ are thus memory cells whose states may take on ternary values, and the memory cells for storing the values $z_{m+1}, \ldots, z_M$ are memory cells whose states may take on at least two different values.

At its l bit wide output, the encoder Cod 12 outputs l binary check bits $c_1, \ldots, c_l$, which are also stored in the memory Sp 13 in memory cells, which may take on at least two different states.

Depending on the implementation, binary memory cells or ternary memory cells may be used, whose state when writing each only takes on two different values.

In FIG. 1d, the case is illustrated that the check bits $c_1, \ldots, c_l$ output by the encoder 12 are stored in ternary memory cells.

For $j=1, \ldots, l$, the j-th output of the encoder Cod 12, which carries the binary value $c_j$, is fed into the input of a subcircuit $bt_j$ 14j which outputs a corresponding ternary value $c_j{}^t = bt_j(c_j)$ at its outputs, which is stored in the ternary memory cell $Spc_j$ when writing. If no error is present, then only two of the possible three ternary values may occur as states of the memory cell $Spc_j$. Due to an error also the third possible third ternary value may be stored as a state.

When reading, from the memory Sp 13 the possibly erroneous values $z_1', \ldots, z_m', z_{m+1}', \ldots, z_M'$ and the possibly erroneous check bits $c_1{}^{t'}, \ldots, c_l{}^{t'}$ are read out which may differ from the corresponding correct values due to errors which may, for example have occurred during storing.

For $j=1, \ldots, l$, the output of the memory cell $Spc_j$ which carries the signal $c_j{}^{t'}$ when reading, is connected to the input of the subcircuit $tb_j$ 15j, which transforms the ternary signal $c_j{}^{t'}$ into the binary signal $c_j' = tb_j(c_j{}^{t'})$.

If no error occurred, then the check bit $c_j$ is provided by the encoder at the output of the subcircuit $tb_j$ 15j, which is connected to the j-th input of the first l inputs of the corrector Cor 17.

The values $z_1', \ldots, z_m', z_{m+1}', \ldots, z_M'$ read out of the memory Sp 13 are transformed by the subcircuit LH 16 into k binary auxiliary read values $y' = y_1', \ldots y_k'$.

The binary auxiliary read values $y' = y_1', \ldots y_k'$ are fed into the second k binary inputs of the corrector Cor 17.

The corrector Cor 17 outputs at its k binary outputs the correction values $e = e_1, \ldots, e_k$ for the auxiliary read values $y' = y_1', \ldots y_k'$, which are corrected in the combinational circuit Vkn 18 into the corrected auxiliary read values $$y^{cor} = y_1{}^{cor}, \ldots, y_k{}^{cor} = [y_1' op_1 e_1], \ldots, [y_k' op_k e_k]$$

and which are input into the subcircuit BB 19.

The subcircuit BB 19 transforms the corrected auxiliary read values $y^{cor} = y_1{}^{cor}, \ldots, y_k{}^{cor}$ into the corrected output values $$x^{cor} = x_1{}^{cor}, \ldots, x_n{}^{cor} = BB(y_1{}^{cor}, \ldots, y_k{}^{cor}).$$

If no error is present, the following applies $$z_1', \ldots, z_M' = z_1, \ldots, z_M,$$
$$c_1', \ldots, c_l' = c_1, \ldots, c_l,$$
$$y_1', \ldots, y_k' = y_1, \ldots, y_k = LH(z_1, \ldots, z_M) = LH[BT(x_1, \ldots, x_n)],$$
$$e = e_1, \ldots, e_k = \underbrace{0, \ldots, 0}_{k},$$
$$y_1{}^{cor}, \ldots, y_k{}^{cor} = y_1, \ldots, y_k \text{ and}$$
$$x^{cor} = x_1{}^{cor}, \ldots, x_n{}^{cor} = x_1, \ldots, x_n = x,$$

and the output of the stored sequence x is error-free.

If errors occur in the data, read out of the memory Sp 13, then the output of the stored sequence $x^{cor}$ is error-free, if the errors in the check bits $c_1', \ldots, c_l'$ and the errors caused by the errors in the output values $z_1', \ldots, z_M'$ in the binary auxiliary read values $y_1', \ldots, y_k'$ are correctable by the code C, and if the errors are corrected.

The correction is done by the corrector Cor 17 which forms a k-digit correction value $e = e_1, \ldots, e_k$, which depends on the check bits $c_1' \ldots c_l'$ read out of the memory Sp 13 and the auxiliary read values $y_1', \ldots, y_k'$, wherein the corrector Cor 17 forms the correction values $e_1, \ldots, e_k$ which are component-wise combined with $y_1', \ldots, y_k'$ in the combinational circuit Vkn 18, wherein the auxiliary read values $y^{cor} = y_1{}^{cor}, \ldots, y_k{}^{cor}$ are transformed by the subcircuit BB 19 into the n-digit binary output sequence $x_1{}^{cor}, \ldots, x_n{}^{cor}$.

When memory errors occur, ternary states of the memory cells may change. The correction of possible memory errors of the ternary memory Sp 13 is executed, as described above, by the correction of the binary auxiliary read values $y' = y_1', \ldots, y_k'$ using binary check bits $c_1', \ldots, c_l'$. The binary auxiliary read values are read out of the ternary memory with possibly erroneous ternary state values $z_1', \ldots, z_M'$. According to embodiments, the associated binary check bits for the auxiliary read values are formed by the encoder Cod 12 directly as binary check bits $c_1, \ldots, c_l$ from the binary input sequence $x_1, \ldots, x_n$.

According to embodiments, they are each stored in a separate memory cell as ternary values $c_1{}^t, \ldots, c_l{}^t$ and read out of the memory cells $Spc_1, \ldots, Spc_l$ as possibly erroneous ternary values $c_1{}^{t'}, \ldots, c_l{}^{t'}$ and transformed by the subcircuits $tb_1, \ldots, tb_l$ into possibly erroneous checkbits $c_1', \ldots, c_l'$.

Again, it should be noted here, that a pair of binary auxiliary read values assigned to a ternary memory state only takes on three different binary values and may thus be read out as information from one single ternary memory cell. A pair of binary check bits, however, generally takes on four different values so that the binary check bits according to embodiments are each stored in a separate memory cell (ternary or binary).

Thus, it is possible for correcting errors in a three-value memory to sensibly use binary error-correcting codes, like e.g. binary Hamming codes, binary Hsiao codes, binary BCH codes for error-correcting errors in ternary memories.

A person skilled in the art understands that equivalent transformations, like, for example, inverting bits in the circuitry $Cir_1$ do not change the nature of the embodiments. For example, it is thus possible that the corrector Corr 17 outputs partially inverted components, instead of outputting the components $e_1, \ldots, e_k$ of the correction vector e for the possibly erroneous auxiliary read values $y_1' \ldots y_k'$, e.g. instead of component $e_1$, component $\bar{e}_1$, which is then combined with $y_1'$ to $y_1{}^c = \overline{y_1' \oplus e_1}$. If for example the combination $op_1$ is originally realized as an XOR operation or combination, then it is to be replaced by an XNOR operation when the component $e_1$ is replaced by the component $\bar{e}_1$.

Likewise, it is, for example, possible that the encoder Cod 12 outputs partially inverted check bits, whose inversion is balanced by the implementation of the corrector Corr 17.

Apart from that, it is, for example, possible jointly to optimize different circuit parts together like using a hardware description language as is conventional in circuits design.

Figure 1E:
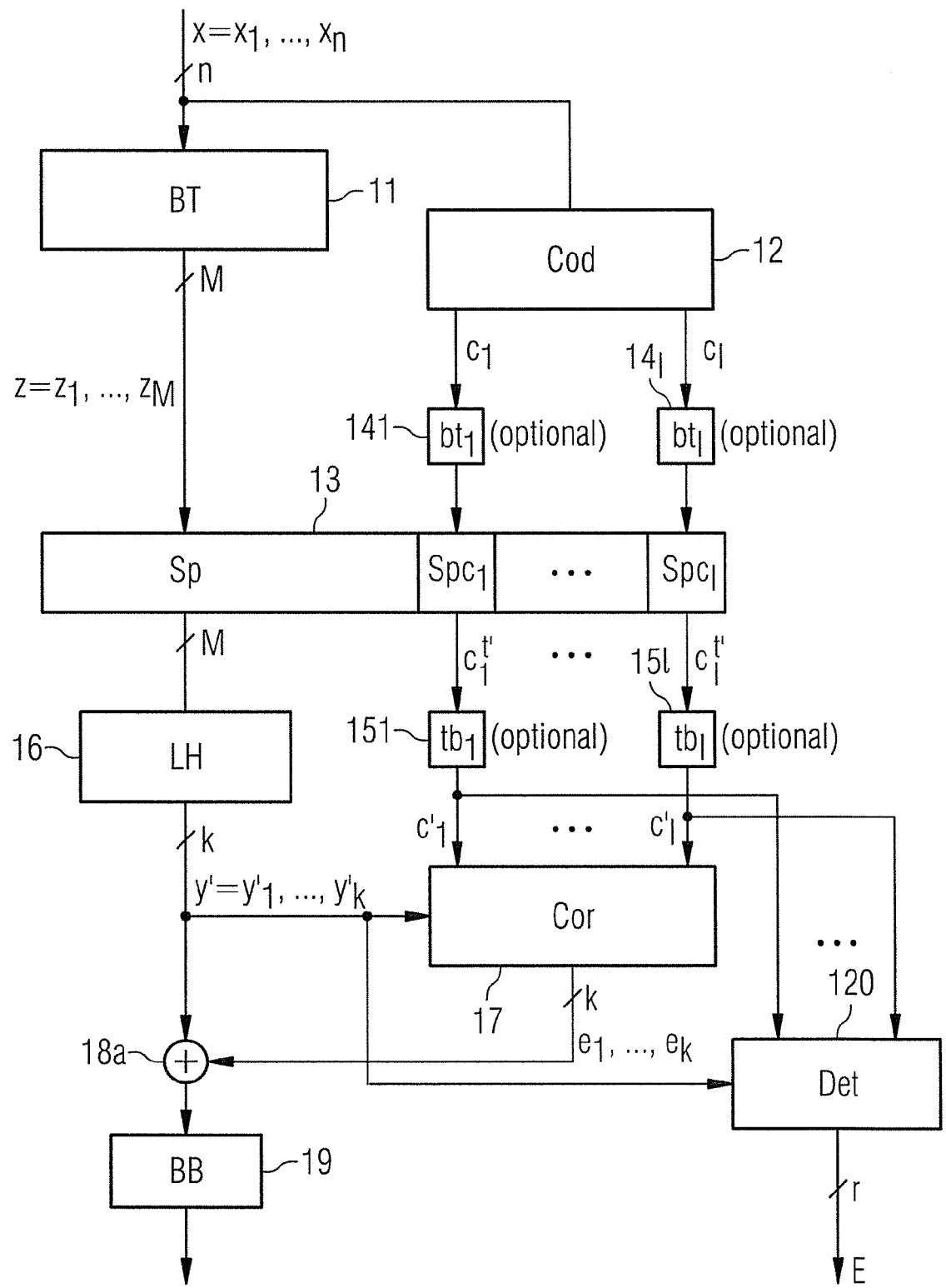
FIG. 1e illustrates circuitry for error correction, moreover providing additional error detection, according to an embodiment.

FIG. 1e depicts circuitry according to an embodiment comprising a circuitry according to FIG. 1d which is supplemented by an error detection circuit Det 120. In the embodiment of FIG. 1e, the combinational circuit Vkn 18 of FIG. 1d is realized as an XOR circuit 18a.

The subcircuits of FIG. 1e which correspond to the subcircuits in FIG. 1d are marked with the same reference numerals and have already been described above. The error detection circuit Det 120 comprises k+l binary inputs and an r bit wide binary output carrying the error signal E, wherein $r \geq 1$. k first inputs of the error detection circuit are connected to the k outputs of the subcircuit LH 16, which carry the auxiliary read values $y' = y_1', \ldots, y_k'$. The further l binary inputs are connected to the outputs of the subcircuits $tb_1$, 151 . . . , $tb_l$, 15$l$, which carry the read out check bits $c_1'$, . . . , $c_l'$ when reading.

The r bit wide output of the error detection circuit Det 120 carries an error signal E, wherein the value of the error signal E indicates whether $y_1'$, . . . , $y_k'$, $c_1'$, . . . , $c_l'$ is a code word of the code C (no detectable error) or whether $y_1'$, . . . , $y_k'$, $c_1'$, . . . , $c_l'$ is no codeword of the code C (detectable error).

If for example r=1, the error detection circuit, Det may be configured so that E=0 indicates that no detectable error is present in the auxiliary read values $y_1'$, . . . , $y_k'$ and the check bits $c_1'$, . . . , $c_l'$ and that E=1 indicates that a detectable error exists in these bits.

If, for example, r=2, the value E=(1,0) or E=(0,1) may indicate that no detectable error occurred, and the value E=(0, 0) or E=(1,1) may indicate that a detectable error occurred.

It is further possible to design the error detection circuit Det so that the output error signal E is different for different types of errors, like 1 bit errors, 2 bit errors, . . . , as it is obvious to a person skilled in the art for different codes and as it will be described later for a concrete code.

The error detection circuit Det 120 and the corrector Korr 16 comprise the same input values and they may also be jointly optimized, as it is conventional in circuit design and may automatically be executed by a design compiler when the design is for example executed using a hardware description language.

Now, the formation of the auxiliary read values $$y' = y_1', \ldots, y_k' = LH(z_1', \ldots, z_m', z_{m+1}', \ldots, z_{m'}')$$

by a subcircuit LH 16 is described.

For example, by the subcircuit LH 16, to each ternary component $z_i'$ with $i \in \{1, \ldots, M\}$ a $t_i$-tuple $L(z_i')$ binary values may be assigned, forming the auxiliary read values $$y' = y_1', \ldots, y_k' = L^1(z_1'), \ldots, L^M(z_M')$$

Here, $2 \leq t_i$ for $1 \leq i \leq m$ and $1 \leq t_i$ for $m+1 \leq i \leq M$. If, for example, $t_i = 2$, then such an assignment of $z_i'$ to a tuple $L^i(z_i') = L_1^i(z_i'), L_2^i(z_i')$ of binary values may easily be realized by a component-wise analog-to-digital conversion. Thus, for example, a ternary value of a component $z_i'$ representing an analog physical value and belonging to a certain non-overlapping interval may simply be digitized into two binary values.

For q=3 possible values this may, for example, simply be executed using q−1=2 comparator with reference values $R_1$, $R_2$ with $R_2 < R_1$. If $z_i' > R_1$ then $L_1^i(z_i') = 1$. If $z_i' \leq R_1$ then $L_1^i(z_i') = 0$, if $z_i' > R_2$ then $L_2^i(z_i') = 1$, if $z_i' \leq R_2$ then $L_1^i(z_i') = 0$. In this simple way to a value $z_i'$ a tuple of binary values may be assigned designated as auxiliary read values, so that the following applies $$L^i(z_i') = L_1^i(z_i'), L_2^i(z_i') = 0,0 \text{ for } z_i' \leq R_2$$

$$L^i(z_i') = L_1^i(z_i'), L_2^i(z_i') = 0,1 \text{ for } R_2 < z_i' \leq R_1$$

$$L^i(z_i') = L_1^i(z_i'), L_2^i(z_i') = 1,1 \text{ for } z_i' \geq R_1.$$

In this case, a binary coding of the analog values result with the characteristic that two analog values which only slightly differ regarding the analog value and which belong to the neighboring intervals, digital tuples are assigned which only differ in one bit. Such an assignment of analog values to digital values is conventionally used by a person skilled in the art of digitizing analog values so that with a small change of the analog values the associated digital value only changes by one bit which was, for example, proposed in Steinbuch, K., Rupprecht, W. Nachrichtentechnik, Springer Verlag, Berlin/Heidelberg/New York 1967, page 339.

A further assignment possibility may, for example, be that to a ternary value said $z_i'$ a triple of binary auxiliary read values $L^i(z_i') = L_1^i(z_i'), L_2^i(z_i'), L_3^i(z_i')$ is also assigned by an analog-to-digital conversion, wherein the different triples form a 1 of 3 code.

This may, for example, also be done using two comparisons with two reference values $R_1$, $R_2$ with $R_2 < R_1$.

If $z_i' > R_1$, then $L(z_i')$ may be determined to be 1,0,0. If $R_2 < z_i' \leq R_1$, $L(z_i')$ may be determined to be 0,1,0, and if $z_i' \leq R_2$, $L(z_i')$ may be determined to be 0,0,1. In this simple way then to a ternary value $z_i'$, a triple of binary values is assigned so that each of the triples of binary values comprises exactly one 1 and the following applies $$L(z_i') = 1,0,0 \text{ für } z_i' > R_1$$

$$L(z_i') = 0,1,0 \text{ für } R_2 < z_i' \leq R_1$$

$$L(z_i') = 0,0,1 \text{ für } z_i' \leq R_2.$$

It is illustrated in FIG. 1$f$ that the memory Sp 13 comprises a ternary memory $Sp_{ter}$ 131 of memory cells which may take on three different values and a binary memory $Sp_{bin}$ 132 of memory cells which may take on two different values. The outputs of the encoder Cod 12 which carry the binary check bits $c = c_1, \ldots, c_l$ are, when writing, directly connected to the data inputs of the corresponding memory cells of the binary memory $Sp_{bin}$, while when reading, the data outputs of the memory cells which carry the possibly erroneous check bits $c_1', \ldots, c_l'$ are directly connected to the corresponding inputs of the corrector Corr 17.

FIG. 1$f$ illustrates that the output values $z_1, \ldots, z_m$, $z_{m+1}, \ldots, z_M$ of the subcircuit BT 11 are stored in memory cells of the ternary memory $Spei_{tern}$ 131, while the binary output values $c_1, \ldots, c_l$ of the encoder Cod 12 are stored in cells of the binary memory $Spei_{bin}$ 132. Storing should be realized in one embodiment so that the output values $z_1, \ldots, z_m, z_{m+1} \ldots, z_M$ of the subcircuit BT 11 and the associated binary output values $c_1, \ldots, c_l$ of the encoder Cod 12 are stored in the memory $Sp_{ter}$ 131 and the memory $Sp_{bin}$ 132 at the same address.

As the values $z_{m+1}, \ldots, z_M$ only take on two different values each, in another embodiment, these values may also be stored in a binary memory $Sp_{bin}$.

Possible implementations of the subcircuit BT 11 of FIG. 1$a$ are now to be explained in more detail.

FIG. 3$a$ shows, for n=9 and M=6, one possible realization of the subcircuit BT 11. At its nine binary inputs, the binary values $x_1, x_2, \ldots, x_9$ are applied, and at its six ternary outputs, six ternary values $z_1, \ldots, z_6$ are output. The realization is set up from three subcircuits $BT_1$ 31, $BT_2$ 32 and $BT_3$ 33 for realizing three functions $f_1$, $f_2$ and $f_3$, wherein these subcircuits each comprise three binary inputs and two ternary outputs.

The subcircuit 31 realizes the function $f_1$ with $f_1(x_1, x_2, x_3) = z_1, z_2$.

The subcircuit 32 realizes the function $f_2$ with $f_2(x_4, x_5, x_6) = z_3, z_4$.

The subcircuit 33 realizes the function $f_3$ with $f_3(x_7, x_8, x_9) = z_5, z_6$.

As there are eight different binary triples of values of three variables and nine tupels of values of two ternary variables, the eight possible binary input values are each mapped by the functions $f_1$, $f_2$ and $f_3$ to eight different pairs of ternary output values each. Mapping is executed so that different triples of binary input values correspond to different tupels of ternary output values. Concrete implementations are explained later.

Figure 3A:
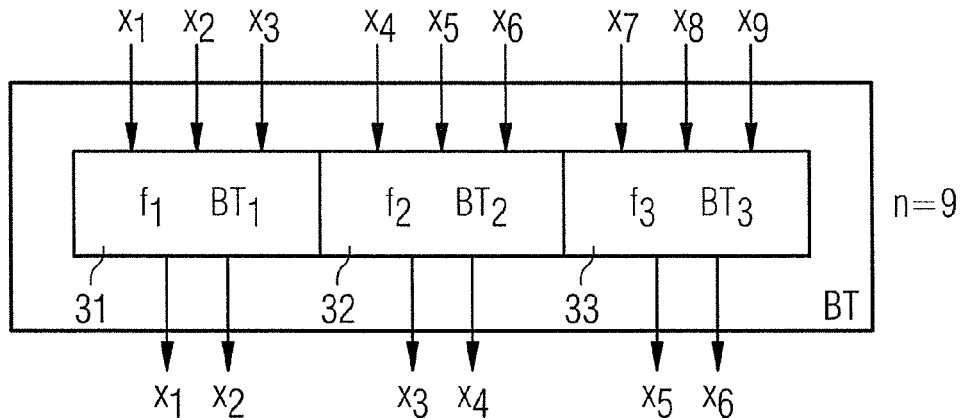
FIGS. 3a-3c depict implementations of subcircuits for the transformation of binary input values into ternary state values according to an embodiment.
Figure 3B:
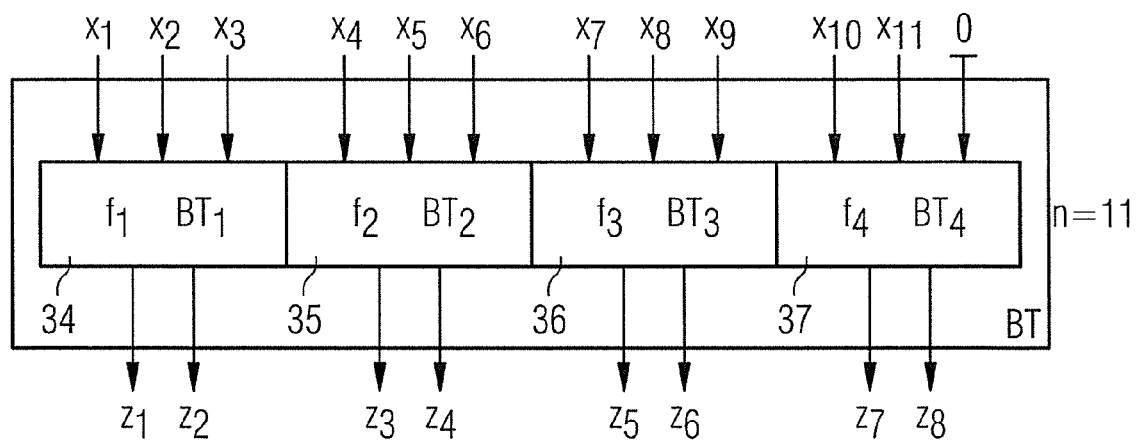

FIG. 3b shows for n=11 and M=8, a further possible realization of the subcircuit BT 11. At its eleven binary inputs, the binary values $x_1, x_2, \ldots, x_{11}$ are applied and at its eight ternary outputs the eight ternary values $z_1, \ldots, z_8$ are output. The realization is set up from four subcircuits $BT_1$ 34, $BT_2$ 35, $BT_3$ 36 and $BT_4$ 37 for realizing four functions $f_1, f_2, f_3$ and $f_4$, wherein these subcircuits each comprise three binary inputs and two ternary outputs.

The subcircuit 34 realizes the function $f_1$ with $f_1(x_1, x_2, x_3) = z_1, z_2$.

The subcircuit 35 realizes the function $f_2$ with $f_2(x_4, x_5, x_6) = z_3, z_4$.

The subcircuit 36 realizes the function $f_3$ with $f_3(x_7, x_8, x_9) = z_5, z_6$.

The subcircuit 37 realizes the function $f_4$ with $f_4(x_{10}, x_{11}, 0) = z_7, z_8$.

In FIG. 3b for the subcircuit $BT_4$ 37 which realizes the function $f_4(x_{10}, x_{11}) = z_7, z_8$ and which depends on the two binary variables $x_{10}, x_{11}$, a further input is plotted which carries the constant value 0. By this, it is to be illustrated that the subcircuit 37 may for example be derived from subcircuit 36 for realizing the function $f_3$, by, for example, constantly setting the value, for example, of the third input variable to 0, so that the following formula applies:

$$f_4(x_{10}, x_{11}) = f_3(x_{10}, x_{11}, 0).$$

Figure 3C:
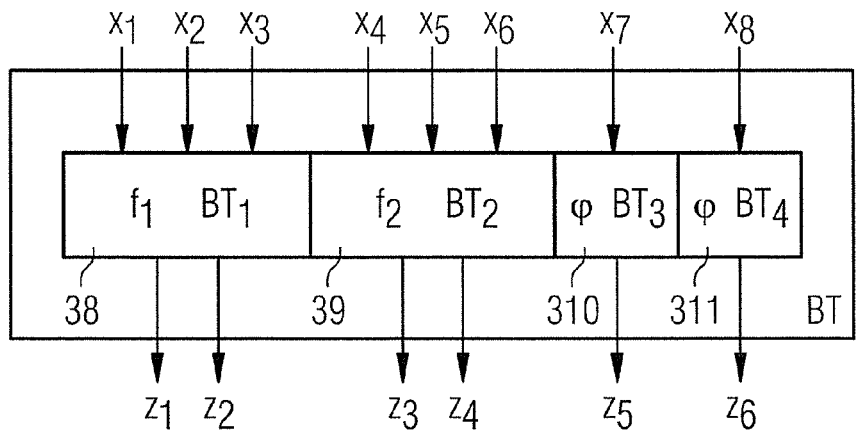

FIG. 3c shows, for n=8 and M=6, a further possible realization of the subcircuit BT 11. At its eight binary inputs the binary values $x_1, x_2, \ldots, x_8$ are applied and at its six ternary outputs the six ternary values $z_1, \ldots, z_6$ are output. The realization is set up from four subcircuits $BT_1$ 38, $BT_2$ 39, $BT_3$ 310 and $BT_4$ 311 for realizing two functions $f$ and $\phi$, wherein the function $f$ is realized by subcircuits 38 and 39 and the function $\phi$ is realized by subcircuits 310 and 311. The subcircuits 38 and 39 for realizing the function f comprise three binary inputs and two ternary outputs. The subcircuits 310 and 311 for realizing the function $\phi$ comprise each one binary input and an output which may take on two different values.

The subcircuits 38 and 39 realize the same function f with $f(x_1, x_2, x_3) = z_1, z_2$ and $f(x_4, x_5, x_5) = z_3, z_3$ and the subcircuits 310 and 311 each realize the function $\phi$ with $\phi(x_7) = z_5$ and $\phi(x_8) = z_6$. The following applies here $$z_{m+1} = z_5 \text{ and } Z_M = z_6.$$

Accordingly, the circuits 310 and 311 may be implemented for realizing the function $\phi$ so that, for example, $\phi(0_{bin}) = 0_{ter}$ and $\phi(1_{bin}) = 2_{ter}$ or $\phi(0_{bin}) = 0_{ter}$ and $\phi(1_{bin}) = 1_{tern} = 1_{bin}$. If $\phi(1_{bin}) = 2_{tern}$, then the binary value $1_{bin}$ is transformed by the subcircuits 310 and 311 for realizing the function $\phi$ into the ternary value $2_{ter}$, so that the values $z_5$ and $z_6$ output at the respective output of the subcircuit 210 and 211 are stored into memory cells of the memory Sp 13 whose states take on ternary values.

If $\phi(1_{bin}) = 1_{ter} = 1_{bin}$, then the values $z_5$ and $z_6$ output at the output of the subcircuits may be stored both in memory cells of the memory Sp 13 which take on ternary values as well as in memory cells which take on binary values.

The auxiliary read values $y' = y_1', \ldots, y_k'$:

$$y' = y_1', \ldots, y_k' = LH(z_1', \ldots, z_m', z_{m+1}', \ldots, z_M')$$

are formed by the subcircuit LH 16 from the state values $z_1', \ldots, z_m', z_{m+1}', \ldots, z_M'$ output from the memory Sp 13.

Figure 4:
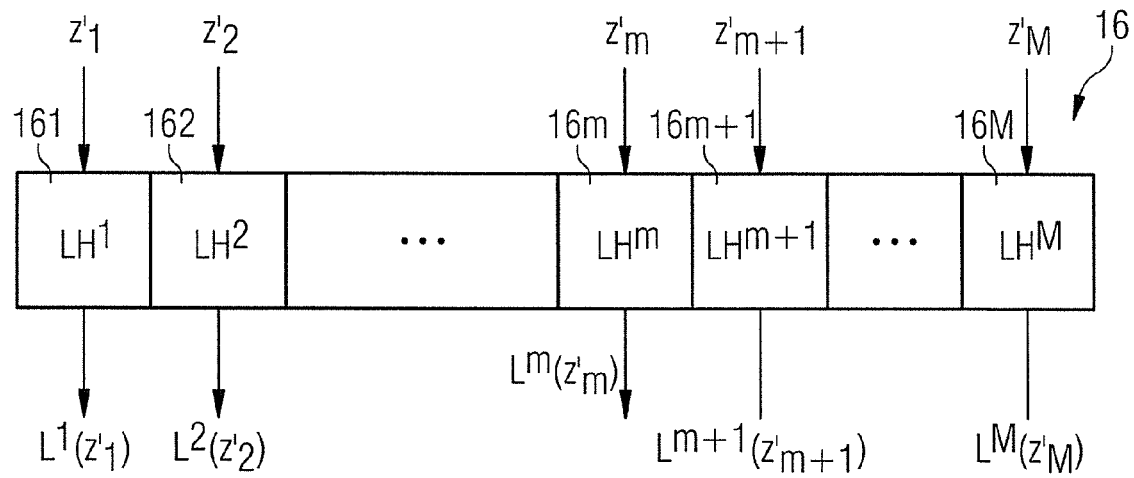
FIG. 4 depicts an implementation of a subcircuit for the transformation of ternary state values into binary auxiliary read values according to an embodiment.

It is illustrated in FIG. 4, how in one embodiment the subcircuit LH 16 for forming the auxiliary read values may be set up from M subcircuits $LH^1$ 161, ..., $LH^m$ 16m, $LH^{m+1}$ 16(m+1), ..., $LH^M$ 16M.

In the embodiment illustrated by FIG. 4, for i=1, ..., M, a $t_i$ tuple $L^i(z_i')$ of binary values is associated with the component $z_i'$ by the subcircuit $LH^i$ 16i, wherein the binary values form the auxiliary read values are $$y' = y_1', \ldots, y_k' = L^1(z_1'), \ldots, L^M(z_M').$$

Here, $2 \le t_i$ for $1 \le i \le m$ and $1 \le t_i$ for $m+1 \le i \le M$.

First of all the case is considered that $1 \le i \le m$.

If for example $t_i = 2$ or $i = 1, \ldots, m$, then such an assignment of $z_i'$ to a tuple $L^i(z_i') = L_1^i(z_i'), L_2^i(z_i)$ of binary auxiliary read values may simply be realized by an analog-to-digital conversion of $z_i$ by a subcircuit $LH^i$ 16i. Thus, for example, a ternary value of a component $z_i'$ which represents an analog physical value and which belongs to a certain non-overlapping interval may simply be digitized into two binary values.

This may, for example, simply be done using two comparators having reference values $R_1, R_2$ with $R_2 < R_1$. If $z_i' > R_1$ then $L_1^i(z_i') = 1$. If $z_i' \le R_1$ then $L_1^i(z_i') = 0$. If $z_i' > R_2$ then $L_2^i(z_i') = 1$. If $z_i' \le R_2$ then $L_1^i(z_i') = 0$. By this, a tuple of binary values may be associated to a value $z_i'$, wherein the binary values are designated as auxiliary read values, so that the following applies $$L^i(z_i') = L_1^i(z_i'), L_2^i(z_i') = 0,0 \text{ for } z_i' \le R_2.$$

$$L^i(z_i') = L_1^i(z_i'), L_2^i(z_i') = 0,1 \text{ for } R_2 < z_i' \le R_1.$$

$$L^i(z_i') = L_1^i(z_i'), L_2^i(z_i') = 1,1 \text{ for } z_i' \ge R_1.$$

It is also possible to do the assignment, so that the following applies $$L^i(z_i') = L_1^i(z_i'), L_2^i(z_i') = 0,0 \text{ for } z_i' \le R_2.$$

$$L^i(z_i') = L_1^i(z_i'), L_2^i(z_i') = 1,0 \text{ for } R_2 < z_i' \le R_1.$$

$$L^i(z_i') = L_1^i(z_i'), L_2^i(z_i') = 1,1 \text{ for } z_i' \ge R_1.$$

A further assignment possibility may for example be that to a ternary value $z_i'$ by a subcircuit $LH^i$ 16i a triple or binary value $L^i(z_i') = L_1^i(z_i'), L_2^i(z_i'), L_3^i(z_i')$ is also assigned by analog-to-digital conversion, wherein the different triples, for example, form a 1 of 3 code.

For example, this may also be done using two comparators with two reference values $R_1, R_2$ with $R_2 < R_1$ as it was already described, so that the following applies $$L^i(z_i') = 1,0,0 \text{ for } z_i' > R_1$$

$$L^i(z_i') = 0,1,0 \text{ for } R_2 < z_i' \le R_1$$

$$L^i(z_i') = 0,0,1 \text{ for } z_i' \le R_2$$

It is also possible to assign a triple of binary values to a ternary value $z_i$ so that each triple of binary values contains exactly one 0 and for example the following applies $$L^i(z_i') = 1,1,0 \text{ for } z_i' > R_1$$

$$L^i(z_i') = 0,1,1 \text{ for } R_2 < z_i' \le R_1$$

$$L^i(z_i') = 1,0,1 \text{ for } z_i' \le R_2$$

It is also possible that for $1 \le i \le m$, all subcircuits $LH^1$ 161, ..., $LH^m$ 16m are equal.

Now the case is considered that $m+1 \le j \le M$. $z_j'$ is input into the subcircuit $LH^j$, wherein $z_j'$ only takes on two different values when writing in, and thus $z_j' = z_j$ in the error-free case when reading out.

Differences result depending on whether $z_j$ is stored in a ternary memory cell or in a binary memory cell.

First of all, the case is considered that $z_j'$ is stored in a ternary memory cell with three possible state values. Although the value $z_j$ which was written in may only take on two different values, in this case the read out value $z_j'$, due to a memory error, may take on three different values.

If the binary values $0_{bin}$ and $1_{bin}$ were encoded by the subcircuit $BT_3$ 310 or $BT_4$ 311 in FIG. 3c as $0_{ter}$ and $2_{ter}$, respectively, the corresponding subcircuit $LH^j$ may for example realize the mapping $L^j(0_{ter})=0_{bin}$, $LH^j(1_{ter})=1_{bin}$ and $LH^j(2_{ter})=1_{bin}$. Such a realization has the advantage that a memory error which corrupts the ternary value $2_{ter}$ into $1_{ter}$ is tolerated as it has no effect at the output of the circuit $L^j$.

The subcircuit $L^j$ may, for example, be realized using a comparator which compares the value $z_j$ to a reference value $R_1$, so that the following applies $$LH^j(z_j)=0_{bin} \text{ for } z_j' \leq R_1.$$

$$LH^j(z_j)=1_{bin} \text{ for } z_j' > R_1.$$

If, on the other hand, $z_j$ is stored in a binary memory, the state of the memory cell may only take on two different values. In this case, both the value $z_j$ written into the binary memory cell and also the value $z_j'$ read out of this memory cell are binary, so that this read out value $z_j'$ may directly serve as an auxiliary read value and the corresponding subcircuit $LH^j$ may consist of a line which directly connects its input to its output.

Figure 5A:
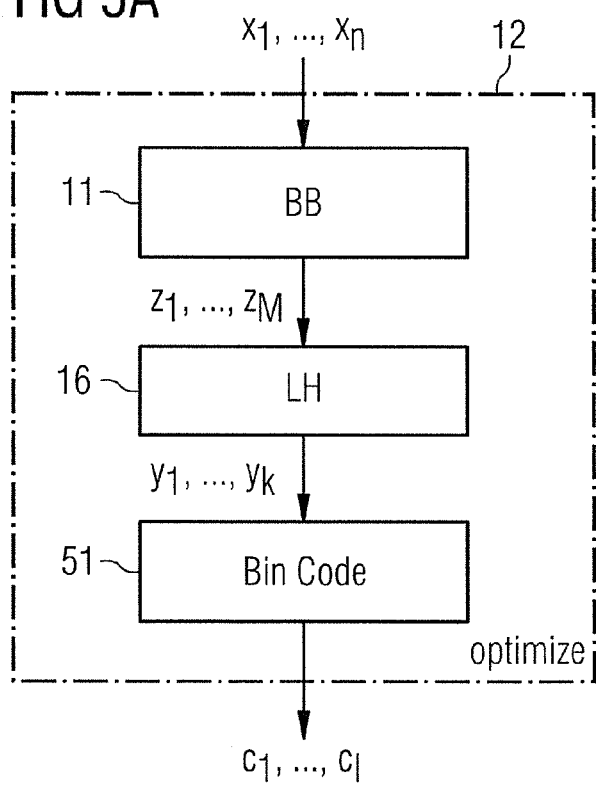
FIG. 5a illustrates an implementation of a coder according to an embodiment.

FIG. 5a illustrates how the encoder Cod 12 is functionally realized. Functionally, the encoder 12 includes a series connection of the subcircuit BB 11, LH 16 and a subcircuit BinCod 51 having k binary inputs and l binary outputs. As the subcircuit BB 11 and LH have already been described, here only the subcircuit BinCod 51 is to be described.

The subcircuit BinCod 51 is implemented so that it forms the l binary check bits $c_1, \ldots, c_l$ from the binary values $y_1, \ldots, y_k$ applied at its input. Here, the values $y_1, \ldots, y_k$ are the k information bits of a binary code BinC and $c_1, \ldots, c_l$ are the associated check bits, so that the subcircuit BinCod 51 simply forms the corresponding binary check bits $c_1, \ldots, c_l$ of the information bits $y_1, \ldots, y_k$ of the code C. The code C may here be a linear or a non-linear code.

A person skilled in the art may optimize the circuit functionality described by FIG. 5a using a synthesis tool as it is conventional in circuit design.

Figure 5B:
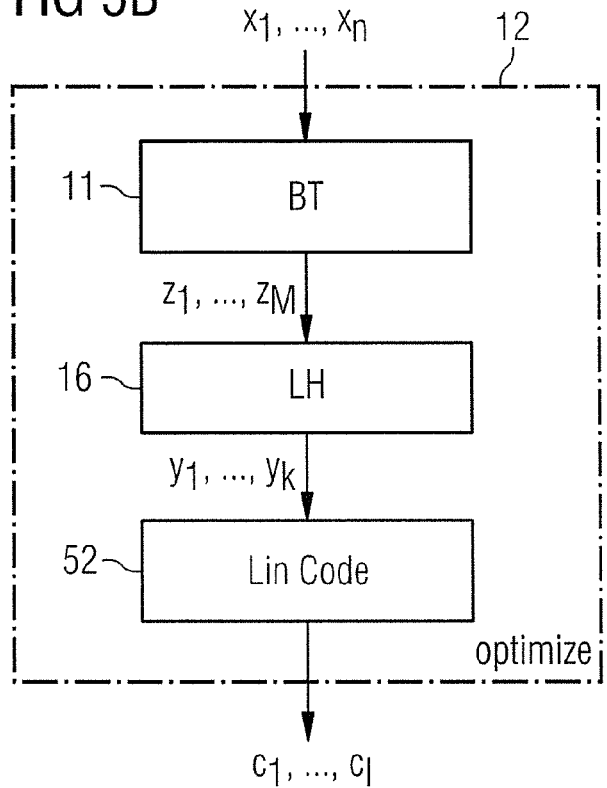
FIG. 5b depicts an implementation of a coder for a linear error-correcting code according to an embodiment.

It is illustrated in FIG. 5b how the encoder Cod 12 may functionally be realized when the error-correcting code C is a linear code which may be described by a (k, k+l)-G-matrix $G=(1_k, P_{k,l})$. Here, $1_k$ is a (k)-dimensional identity matrix and $P_{k,l}$ is a (k, l) matrix which is to be referred to as a parity matrix.

In contrast to FIG. 5a, the subcircuit BinCode 51 is replaced by the subcircuit LinCode 52. The subcircuit Lin-Code 52 is implemented so that it forms the binary check bits $c_1, \ldots, c_l$ output at its l binary outputs according to the relation $$c_1, \ldots, c_l = (y_1, \ldots, y_k) \cdot P,$$

from the values $y_1, \ldots, y_k$ applied to its inputs. It may be gathered that the subcircuit LinCode is a conventional circuit for determining the check bits $c_1, \ldots, c_l$ of the linear error-correcting code C from the bits $y_1, \ldots, y_k$ with the generator matrix $G=(1_k, P_{k,l})$. In this sense, the bits $y_1, \ldots, y_k$ are the information bits of the code C. The code C may for example be a Hamming code, a Hsiao code, a BCH code or another linear error-correcting code.

A person skilled in the art will optimize the circuit functionally described by FIG. 5b for example using a synthesis tool as it is conventional in circuit design.

Figure 5C:
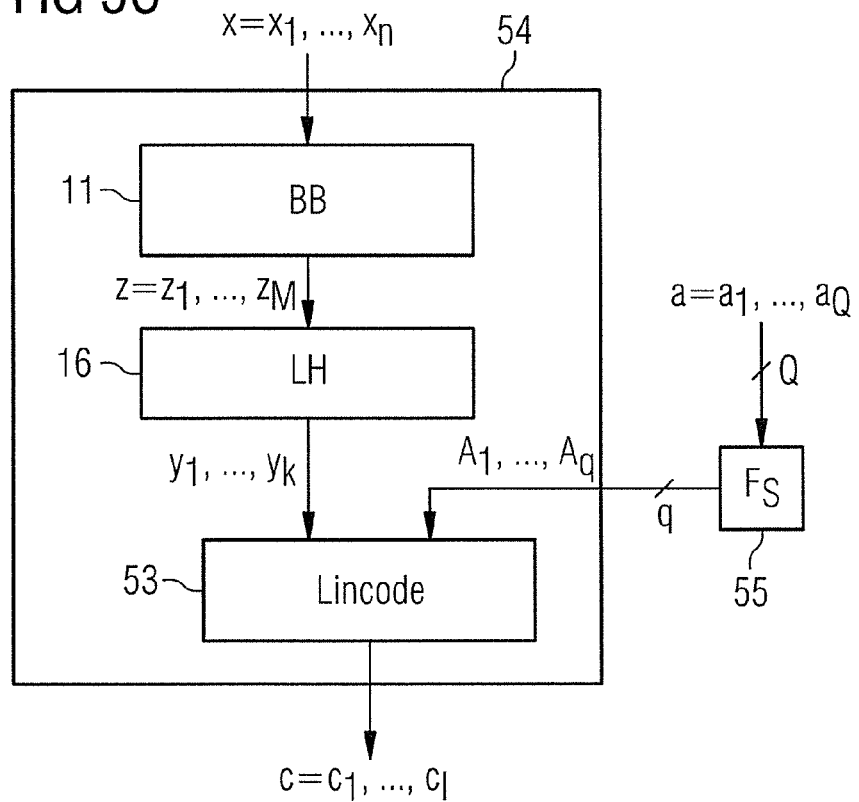
FIG. 5c illustrates an implementation of a coder using address bits according to an embodiment.

It is illustrated in FIG. 5c how the encoder Cod 12 may be functionally realized when the check bits $c_1, \ldots, c_l$ also depend on the address bits of the write address $a=a_1, \ldots, a_Q$. The error-correcting code C was assumed to be a linear code which may be described by a (k+q, k+q+l)-G matrix $G=(1_{k+q}, P_{k+q,l})$. Here, $1_{k+q}$ is a (k+q)-dimensional identity matrix and $P_{k+q,l}$ a (k+q, l)-matrix which is to be referred to as a parity matrix. Apart from the data bits $x=x_1, \ldots, x_n$, the check bits $c_1, \ldots, c_l$ also depend on q bits $A_1, \ldots, A_q$, which are determined from the address bits $a_1, \ldots, a_Q$ as $$A_1, \ldots, A_q = F(a_1, \ldots, a_Q)$$

Here, $a=a_1, \ldots, a_Q$ is the address under which $z_1, \ldots, z_m$, $z_{m+1}, \ldots, z_M$ and the check bits $c=c_1, \ldots, c_l$ are written into the memory Sp 13. Q is the word width of the write address a and $q \leq Q$ applies. F describes a unique mapping of the Q bits of the write address to q bits $A_1, \ldots, A_q$.

The corresponding encoder is illustrated in FIG. 5c. In FIG. 5c, the subcircuit Lincode 53 comprises k first inputs to which the auxiliary read values $y_1, \ldots, y_k$ output by the subcircuit LH are applied, and q second inputs connected to the q outputs of the subcircuit $F_S$. At its l outputs, the subcircuit $F_S$ 55 outputs the bits $A_1, \ldots, A_q$, determined by the function F from the address bits $a=a_1, \ldots, a_Q$, wherein the subcircuit $F_S$ 55 realizes the function F. At its l binary outputs, the subcircuit Lincode 53 outputs the check bits $c_1, \ldots, c_l$.

In contrast to this, the subcircuit Lincode 52 of FIG. 5b only comprises k inputs to which the auxiliary read values $y_1, \ldots, y_k$ are applied.

For a linear code which may be described by a (k+q, k+q+l)-G-matrix $G=(1_{k+q}, P_{k+q,l})$, the l binary check bits $c_1, \ldots, c_l$ are determined according to the relation $$c_1, \ldots, c_l = (y_1, \ldots, y_k, A_1, \ldots, A_q) \cdot P.$$

If, for example, q=1 and $A_1 = a_1 \oplus \ldots \oplus a_Q$, then $A_1$ is the parity of the write address and for the check bits $c_1, \ldots, c_l$ the following applies $$c_1, \ldots, c_l = (y_1, \ldots, y_k, A_1) \cdot P,$$

wherein the G matrix G is a (k+1, k+l+1) matrix and P is a (k+1, l) matrix.

Figure 5D:
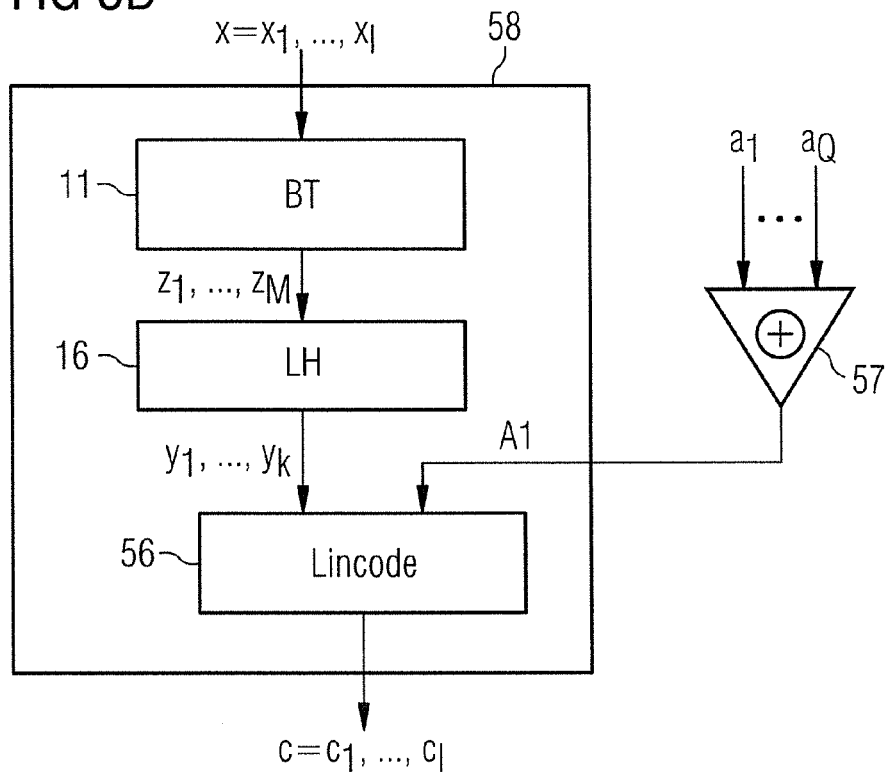
FIG. 5d depicts an implementation of a coder for a linear error-correcting code using the parity of address bits according to an embodiment.

In FIG. 5d, the corresponding encoder 58 is illustrated. The subcircuit 56 has k+1 inputs, wherein the k auxiliary read values $y_1, \ldots, y_k$ are applied to k first inputs. The (k+1)th input is connected to the 1-bit wide output of an XOR circuit 57 which outputs at its output the parity $A_1 = a_1 \oplus \ldots \oplus a_Q$ of the address bits.

If q=Q and $A_1, \ldots, A_Q = a_1, \ldots, a_Q$, then the check bits $c_1, \ldots, c_l$ depend on all bits of the write address a. For a linear code which may be described by a (k+Q, k+Q+l)-G-matrix $G=(1_k+Q, P_{k+Q,l})$, the l binary check bits $c_1, \ldots, c_l$ are determined according to the relation $$c_1, \ldots, c_l = (y_1, \ldots, y_k, a_1, \ldots, a_Q) \cdot P.$$

Figure 5E:
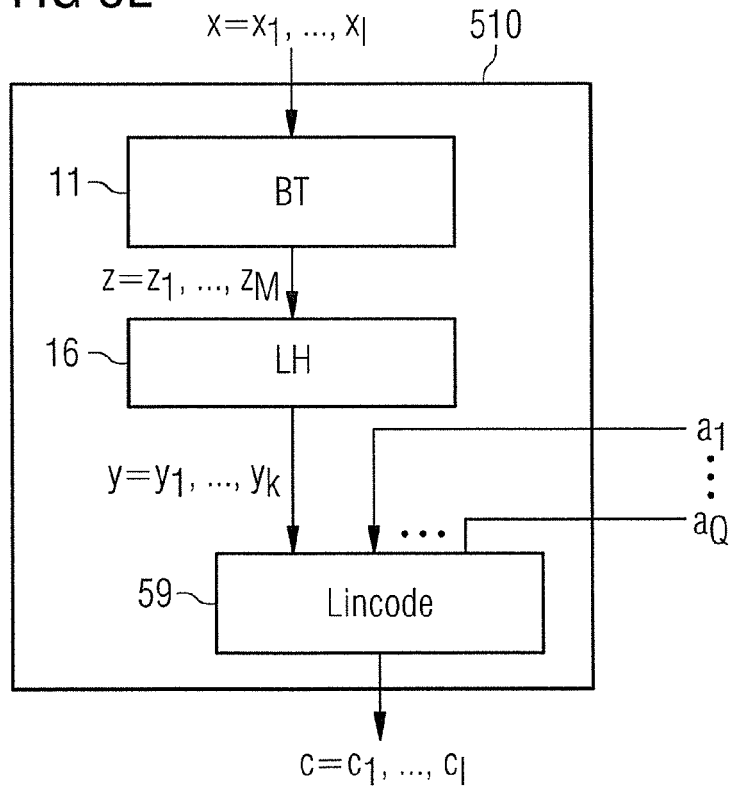
FIG. 5e shows an implementation of a coder for a linear correcting code using all address bits according to an embodiment.

In FIG. 5e the corresponding encoder 510 is illustrated. The subcircuit 59 Lincode comprises k+Q inputs, wherein to k first inputs k auxiliary read values $y_1, \ldots, y_k$ are applied. At the Q second inputs the address bits $a_1, \ldots, a_Q$ of the write address are applied.

A person skilled in the art understands that when the check bits also depend on address bits of the write address, a non-linear error-correcting code may be used instead of a linear code.

Figure 6A:
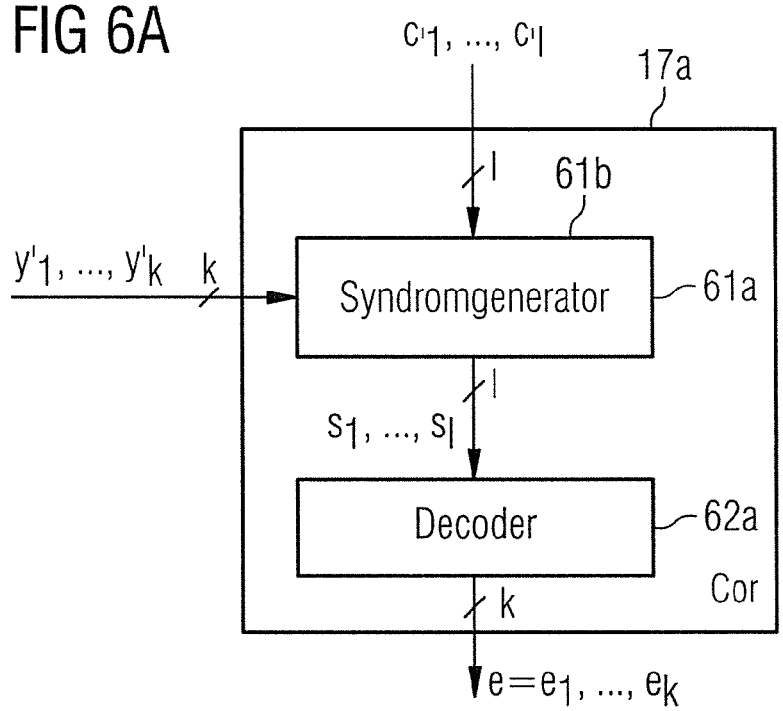
FIG. 6a illustrates an implementation of a corrector according to an embodiment.

FIG. 6a shows a conventional realization of a corrector for a linear error-correcting code C. The code C of the length k+l with k information bits, here the auxiliary read values $y_1', \ldots, y_k'$, and l check bits, here the check bits $c_1', \ldots, c_l'$, may be described by a corresponding H matrix H, which may exist in a systematic form $H=(P^T, 1_l)$ or in a non-systematic form.

The corrector Cor 17a for the considered linear error-correcting code C in FIG. 6a comprises a syndrome generator 61a conventional for linear codes having l+k binary inputs and l binary outputs and a decoder 62a with l binary inputs and k binary outputs. The l data outputs of the memory Sp 13 which carry the possibly erroneous values $c_1', \ldots, c_l'$ of the check bits, when reading, are fed into l first inputs of the syndrome generator 61a, while the k outputs of the subcircuits LH 16 which carry the possibly erroneous auxiliary read values $y'=y_1', \ldots, y_k'$ are connected to the further k inputs of the syndrome generator 61a. The l outputs of the syndrome generator 61a are connected to the l inputs of the decoder 62a which outputs the k component correction vector $e=e_1, \ldots, e_k$ at its k outputs. The syndrome generator 61a is implemented, so that at its l binary outputs it outputs the components $s_1, \ldots, s_l$ of the error syndrome s, which is determined by $$s_1, \ldots, s_l = H \cdot [y_1', \ldots, y_k', c_1', \ldots, c_l']^T.$$

If the code C is a K bit error-correcting code, then to each M bit error with M≤K a separate error syndrome is associated and the error may be corrected on the basis of the syndrome.

The decoder 62a may be implemented as a combinational circuit which outputs the k-digit correction vector $e=e_1, \ldots, e_k$ when inputting the syndrome. If M≤K, then exactly those components of the correction vector $e=e_1, \ldots, e_k$ are equal to 1 at which an error occurred and which are corrected.

The correction takes place in the combinational circuit Vkn 18 which in the embodiments of FIG. 1e is implemented as an XOR circuit 18a, so that $y_1' \oplus e_1 \ldots, y_k' \oplus e_k = y_1^c, \ldots, y_k^c$ is formed.

Figure 6B:
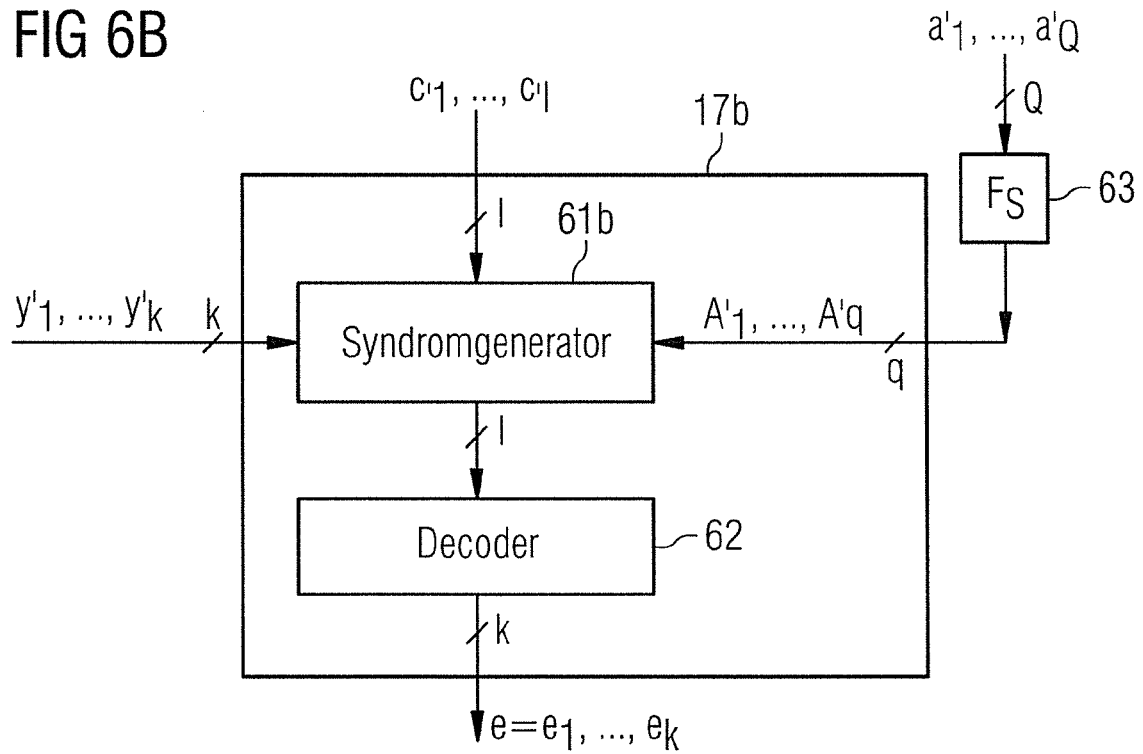
FIG. 6b shows an implementation of a corrector using address bits according to an embodiment.

It is illustrated in FIG. 6b how the corrector may be functionally realized as Cor 17b, wherein the check bits $c_1, \ldots, c_l$ also depend on the address bits of the write address $a=a_1, \ldots, a_Q$. Apart from the auxiliary read values $y_1', \ldots, y_k'$ and the check bits $c_1', \ldots, c_l'$, in FIG. 6b, the error syndrome $s=s_1, \ldots, s_l$ also depends on q bits $A_1', \ldots, A_q'$, which are determined from the address bits $a'=a_1', \ldots, a_Q'$ of the read address a' as $$A_1', \ldots, A_q' = F(a_1', \ldots, a_Q').$$

Here, $a'=a_1', \ldots, a_Q'$ the address under which the auxiliary read values $y_1', \ldots, y_k'$ and the check bits $c'=c_1', \ldots, c_l'$ are read from the memory Sp 13. Q is the word width of the read address a', and the following applies q≤Q. F describes the same unique mapping of the Q bits of the read address $a'=a_1', \ldots, a_Q'$ to q bits $A_1', \ldots, A_q'$, as it was used in mapping the write address $a=a_1, \ldots, a_Q$ to the bits $A_1, \ldots, A_q$.

The syndrome generator 61b is now implemented so that it outputs at its l binary outputs the components $s_1, \ldots, s_l$ of the error syndrome s, which is determined by $$s_1, \ldots, s_l = H \cdot [y_1', \ldots, y_k', c_1', \ldots, c_l', A_1', \ldots, A_q']^T$$

If q=Q and $A_1', \ldots, A_q' = a_1', \ldots, a_Q'$ then the syndrome is determined by $$s_1, \ldots, s_l = H \cdot [y_1', \ldots, y_k', c_1', \ldots, c_l', a_1', \ldots, a_Q']^T$$

wherein $a_1', \ldots, a_Q'$ is the complete read address.

If $F(a_1', \ldots, a_Q') = a_1' \oplus \ldots \oplus a_Q' = A_1'$ applies, then the syndrome depends on the parity of the components of the read address and the following applies $$s_1, \ldots, s_l = H \cdot [y_1', \ldots, y_k', c_1', \ldots, c_l', A_1']^T$$

The syndrome generator 61b comprises l first inputs to which the possibly erroneous check bits $c_1', \ldots, c_l'$ are applied. It comprises k second inputs to which the possibly erroneous auxiliary read values $y_1', \ldots, y_k'$ apply and it comprises q further inputs to which the outputs of the subcircuit $F_S$ 63 for determining the bits $A_1', \ldots, A_q'$ from the bits $a_1', \ldots, a_Q'$ of the read address a' are connected. The subcircuit $F_S$ is implemented so that it forms the bits $A_1', \ldots, A_q'$ from the bits of the read address a'. If, for example, Q=q and $A_1', \ldots, A_Q' = a_1, \ldots, a_q$, the subcircuit $F_S$ simply consists of q connecting lines which connect its inputs to its outputs. If, for example, q=1 and $A_1' = a_1' \oplus \ldots \oplus a_Q'$, then $F_S$ is an XOR tree which outputs the parity of its input values at its output.

The subcircuit BB 19 is a combinational circuit. It forms, from the corrected auxiliary read values $y^c = y_1^c, \ldots, y_k^c$, the corrected input values $x^c = x_1^c, \ldots, x_k^c$. If no error occurs or if an error occurs which may be corrected by the code C, then $x^c = x$.

Possible realizations of the subcircuit BB 19 are now to be explained in more detail for different implementations of embodiments.

Figure 7A:
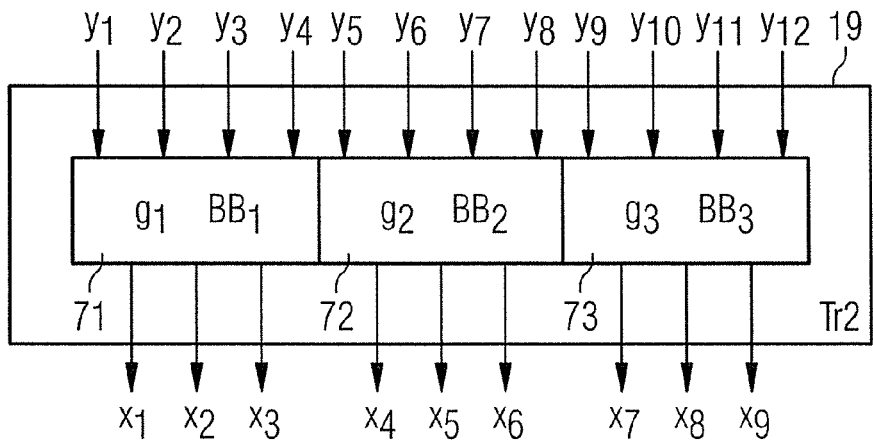
FIG. 7a depicts an implementation of the transformation of the binary auxiliary read values into binary output values according to an embodiment.

FIG. 7a illustrates an embodiment of how the subcircuit BB 19 of FIG. 1d for 12 auxiliary read values $y_1, \ldots, y_{12}$ and 9 binary input values $x_1, \ldots, x_9$ may be implemented as a parallel circuit of the combinational subcircuits $BB_1$ 71, $BB_2$ 72 and $BB_3$ 73, which realize the combinational functions $g_1$, $g_2$ and $g_3$ each comprising 4 binary inputs and 3 binary outputs.

Figure 8:
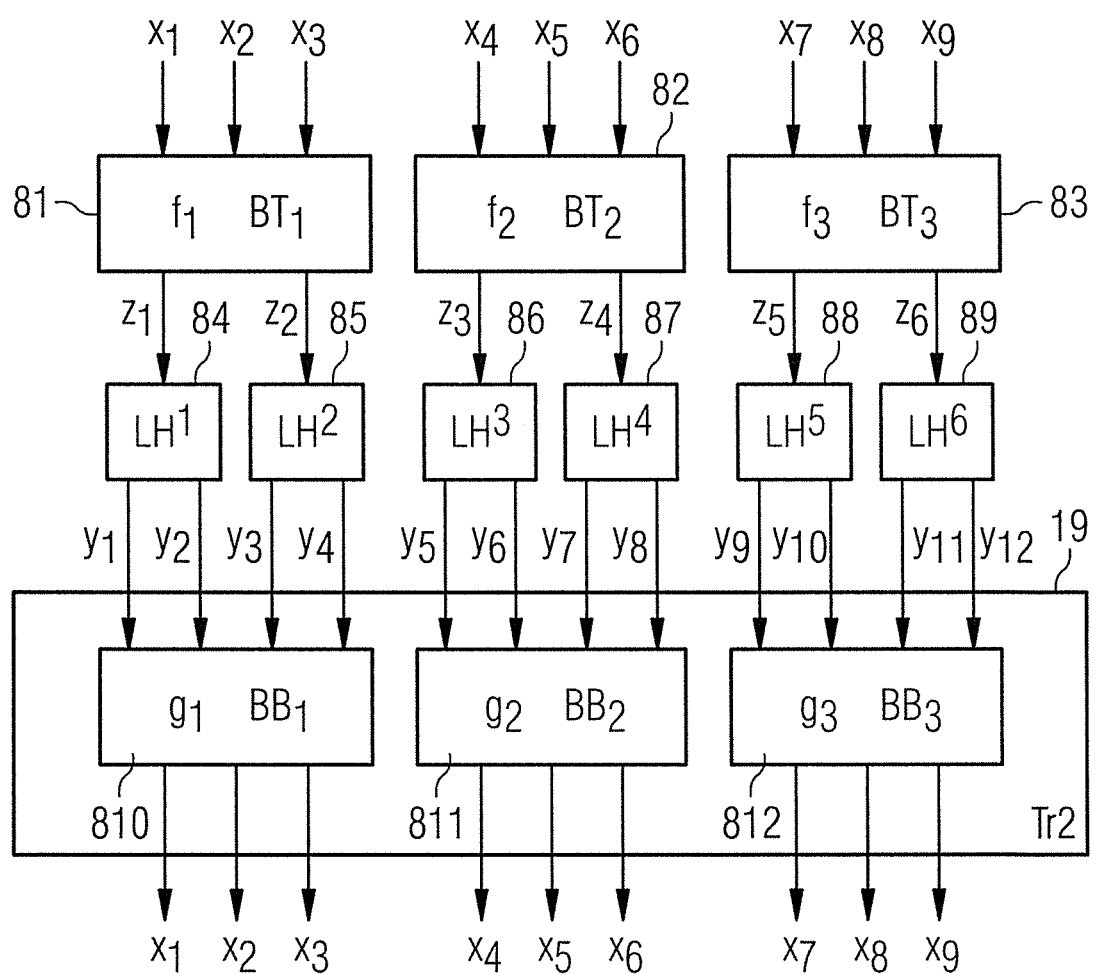
FIG. 8 illustrates a functional block diagram for explaining a subcircuit according to an embodiment.

FIG. 8 serves for explaining how these subcircuits $BB_1$ 71, $BB_2$ 72 and $BB_3$ 73 may be determined.

In FIG. 8, a functional block diagram is illustrated, which serves for illustrating how the subcircuit BB 19 may be determined for an embodiment of a circuitry $Cir_1$ having 9 binary inputs $x_1, x_2, \ldots, x_9$.

In FIG. 8, as well as in FIG. 3a, the subcircuit BT 11 with 9 binary inputs is in turn realized from three subcircuits $BT_1$ 81 (31 in FIG. 3a), $BT_2$ 82 (32 in FIG. 3a) and $BT_3$ 83 (33 in FIG. 3a) which implement the functions $f_1$, $f_2$ and $f_3$ each having three binary inputs and two ternary outputs, which carry the ternary state values $z_1, \ldots, z_6$. These ternary state values $z_1, \ldots, z_6$ are transformed by functions $LH^1$ 84 ..., $LH^6$ 89 into the binary auxiliary read values $y_1, \ldots, y_{12}$. The functions $LH^1$ 84, ..., $LH^6$ 89 are the functions realized by the subcircuit LH 16. The binary read values $y_1, \ldots, y_{12}$ are now in turn transformed by the subcircuit BB 19 again into the binary input values $x_1, \ldots, x_9$. In this respect, three functions $g_1$, $g_2$ and $g_3$ are determined each transforming back four binary auxiliary read values $y_1, y_2, y_3, y_4$; $y_5, y_6, y_7, y_8$ and $y_9, y_{10}, y_{11}, y_{12}$ into three binary values $x_1, x_2, x_3$; $x_4, x_5, x_6$ and $x_7, x_8, x_9$, each. The subcircuit BB 19 is a circuit which in turn includes the three subcircuits $BB_1$ 810 for realizing the function $g_1$, $BB_2$ 811 for realizing the function $g_2$ and $BB_3$ 812 for realizing the function $g_3$.

First, the determination of function $g_1$ is considered. This function is determined from $f_1$, $LH^1$ and $LH^2$.

In the following tables, the values 0, 1 in columns designated by $x_i$ or $y_i$ designate binary values while the values 0, 1, 2 which are in columns marked by $z_k$ represent ternary values.

An embodiment is described, wherein function $f_1$ is given by table 1.

TABLE 1

| | | $(f_1(x_1, x_2, x_3))$ | | |
|---|---|---|---|---|
| $x_1$ | $x_2$ | $x_3$ | $z_1$ | $z_2$ |
| 0 | 0 | 0 | 0 | 0 |
| 0 | 0 | 1 | 0 | 1 |
| 0 | 1 | 0 | 0 | 2 |
| 0 | 1 | 1 | 1 | 0 |
| 1 | 0 | 0 | 1 | 1 |
| 1 | 0 | 1 | 1 | 2 |
| 1 | 1 | 0 | 2 | 0 |
| 1 | 1 | 1 | 2 | 1 |

According to table 1, $z_1$, $z_2$ is simply a ternary representation of the values $x_1 x_2 x_3$ interpreted as a binary number.

The function $LH^1$ is described by table 2.

TABLE 2

| | $(LH^1(z_1))$ | |
|---|---|---|
| $z_1$ | $y_1$ | $y_2$ |
| 0 | 0 | 0 |
| 1 | 0 | 1 |
| 2 | 1 | 1 |

The function $LH^2$ is described by table 3.

TABLE 3

| | $(LH^2(z_2))$ | |
|---|---|---|
| $z_2$ | $y_3$ | $y_4$ |
| 0 | 0 | 0 |
| 1 | 1 | 0 |
| 2 | 1 | 1 |

By now determining the ternary state values $z_1$, $z_2$ from the input values $x_1$, $x_2$, $x_3$ according to table 1, and subsequently determining, from the state values $z_1$, $z_2$ according to table 2 and table 3, the corresponding auxiliary read values $y_1$, $y_2$, $y_3$, $y_4$, the auxiliary read values $y_1$, $y_2$, $y_3$, $y_4$ are determined from the input values $x_1$, $x_2$, $x_3$ by a function $k_1(x_1, x_2, x_3)$ as illustrated in table 4.

TABLE 4

| | | | $(k_1(x_1, x_2, x_3))$ | | | |
|---|---|---|---|---|---|---|
| $x_1$ | $x_2$ | $x_3$ | $y_1$ | $y_2$ | $y_3$ | $y_4$ |
| 0 | 0 | 0 | 0 | 0 | 0 | 0 |
| 0 | 0 | 1 | 0 | 0 | 1 | 0 |
| 0 | 1 | 0 | 0 | 0 | 1 | 1 |
| 0 | 1 | 1 | 0 | 1 | 0 | 0 |
| 1 | 0 | 0 | 0 | 1 | 1 | 0 |
| 1 | 0 | 1 | 0 | 1 | 1 | 1 |
| 1 | 1 | 0 | 1 | 1 | 0 | 0 |
| 1 | 1 | 1 | 1 | 1 | 1 | 0 |

A description of function $g_1$ is now easily obtained from table 4 by regarding the output values $y_1$, $y_2$, $y_3$, $y_4$ of table 4 as input values of the function $g_1$, and by interpreting the associated input values $x_1$, $x_2$, $x_3$ of table 4 as output values of the function $g_1$. This way, table 5 is obtained which determines the function $g_1$ for the tupels of values indicated in table 5. For all values not indicated in table 5, the function $g_1$ may be determined randomly. This characteristic may be used advantageously for circuit optimization of the function $g_1$.

TABLE 5

| | | | $(g_1(y_1, y_2, y_3, y_4))$ | | | |
|---|---|---|---|---|---|---|
| $y_1$ | $y_2$ | $y_3$ | $y_4$ | $x_1$ | $x_2$ | $x_3$ |
| 0 | 0 | 0 | 0 | 0 | 0 | 0 |
| 0 | 0 | 1 | 0 | 0 | 0 | 1 |
| 0 | 0 | 1 | 1 | 0 | 1 | 0 |
| 0 | 1 | 0 | 0 | 0 | 1 | 1 |
| 0 | 1 | 1 | 0 | 1 | 0 | 0 |
| 0 | 1 | 1 | 1 | 1 | 0 | 1 |
| 1 | 1 | 0 | 0 | 1 | 1 | 0 |
| 1 | 1 | 1 | 0 | 1 | 1 | 1 |

The subcircuit $BB_1$ 810 is now simply a combinational circuit for realizing the function $g_1$ with 4 binary inputs $y_1$, $y_2$, $y_3$, $y_4$ and 3 binary outputs $x_1$, $x_2$, $x_3$ whose functioning is determined by table 5, wherein the output values for values of $y_1$, $y_2$, $y_3$, $y_4$ not listed in table 5 may be selected randomly. For example, all of these output values may be set to 0. The realization of a function given by a table of values is no difficulty for a person skilled in the art, for example using a synthesis tool and it is not to be described here in detail.

Now the determination of the function $g_2$ is considered. This function is determined from $f_2$, $LH^3$ and $LH^4$.

It is assumed that the function $f_2$ is given by table 6.

TABLE 6

| | | $(f_2(x_4, x_5, x_6))$ | | |
|---|---|---|---|---|
| $x_4$ | $x_5$ | $x_6$ | $z_3$ | $z_4$ |
| 0 | 0 | 0 | 1 | 1 |
| 0 | 0 | 1 | 2 | 1 |
| 0 | 1 | 0 | 1 | 0 |
| 0 | 1 | 1 | 2 | 0 |
| 1 | 0 | 0 | 0 | 1 |
| 1 | 0 | 1 | 0 | 2 |
| 1 | 1 | 0 | 0 | 0 |
| 1 | 1 | 1 | 1 | 2 |

Function $LH^3$ is described by table 7.

TABLE 7

| | $(LH^3(z_3))$ | |
|---|---|---|
| $z_3$ | $y_5$ | $y_6$ |
| 0 | 0 | 0 |
| 1 | 0 | 1 |
| 2 | 1 | 1 |

Function $LH^4$ is described by table 8.

TABLE 8

| $(LH^4(z_4))$ | | |
| --- | --- | --- |
| $z_4$ | $y_7$ | $y_8$ |
| 0 | 0 | 0 |
| 1 | 0 | 1 |
| 2 | 1 | 1 |

Here, $LH^3=LH^4$.

By now determining the ternary state values $z_3$, $z_4$ from the input values $x_4$, $x_5$, $x_6$ according to table 6 and subsequently determining the corresponding auxiliary read values $y_5$, $y_6$, $y_7$, $y_8$ from the state values $z_3$, $z_4$ according to tables 7 and 8, the auxiliary read values $y_5$, $y_6$, $y_7$, $y_8$ are determined from the input values $x_4$, $x_5$, $x_6$ presented by a function $k_2(x_4, x_5, x_6)$ as in table 9.

TABLE 9

| $(k_2(x_4, x_5, x_6))$ | | | | | | |
| --- | --- | --- | --- | --- | --- | --- |
| $x_4$ | $x_5$ | $x_6$ | $y_5$ | $y_6$ | $y_7$ | $y_8$ |
| 0 | 0 | 0 | 0 | 1 | 0 | 1 |
| 0 | 0 | 1 | 1 | 1 | 0 | 1 |
| 0 | 1 | 0 | 0 | 1 | 0 | 0 |
| 0 | 1 | 1 | 1 | 1 | 0 | 0 |
| 1 | 0 | 0 | 0 | 0 | 0 | 1 |
| 1 | 0 | 1 | 0 | 0 | 1 | 1 |
| 1 | 1 | 0 | 0 | 0 | 0 | 0 |
| 1 | 1 | 1 | 0 | 1 | 1 | 1 |

A description of function $g_2$ is now simply obtained from table 9 by regarding the output values $y_5$, $y_6$, $y_7$, $y_8$ of table 9 as input values of the function $g_2$ and by interpreting the associated input values $x_4$, $x_5$, $x_6$ of table 9 as output values of the function $g_2$. This way, table 10 is obtained which describes the function $g_2$ for the values indicated in table 9. For all values not listed in table 10 the function $g_2$ may take on arbitrary values. This characteristic may advantageously be used for circuit optimization of the function $g_2$.

TABLE 10

| $(g_2(y_5, y_6, y_7, y_8))$ | | | | | | |
| --- | --- | --- | --- | --- | --- | --- |
| $y_5$ | $y_6$ | $y_7$ | $y_8$ | $x_4$ | $x_5$ | $x_6$ |
| 0 | 1 | 0 | 1 | 0 | 0 | 0 |
| 1 | 1 | 0 | 1 | 0 | 0 | 1 |
| 0 | 1 | 0 | 0 | 0 | 1 | 0 |
| 1 | 1 | 0 | 0 | 0 | 1 | 1 |
| 0 | 0 | 0 | 1 | 1 | 0 | 0 |
| 0 | 0 | 1 | 1 | 1 | 0 | 1 |
| 0 | 0 | 0 | 0 | 1 | 1 | 0 |
| 0 | 1 | 1 | 1 | 1 | 1 | 1 |

The subcircuit $BB_2$ 811 is now simply a combinational circuit for realizing the function $g_2$ with four binary inputs $y_5$, $y_6$, $y_7$, $y_8$ and three binary outputs $x_4$, $x_5$, $x_6$, whose functioning is determined by table 10, wherein the output values for the occupations not listed in table 10 may be selected randomly by $y_5$, $y_6$, $y_7$, $y_8$. For example, all of these output values may be set equal to 0 or also equal to 1.

The subcircuit $BB_3$ 812 for realizing a function $g_3$ with four binary inputs $y_9$, $y_{10}$, $y_{11}$, $y_{12}$ and three binary outputs $x_7$, $x_8$, $x_9$ may be determined completely analogously. It is for example also possible to select the subcircuits $BB_3$ equal to the subcircuit $BB_2$ 811.

It is also possible to use equal subcircuits $BB_1$, $BB_2$ and $BB_3$ by selecting $f_1=f_2=f_3$ and $LH^1=LH^2=\ldots=LH^6$ and determining one of the subcircuits as described, like e.g. $BB_2$ and selecting the subcircuits $BB_1$ and $BB_3$ equal to $BB_2$.

FIG. 3b illustrates how the subcircuit BT 11 may be implemented with 11 binary input values $x_1, \ldots, y_{11}$ from subcircuits $BT_1$ 34 for realizing a function $f_1$, $BT_2$ 35 for realizing a function $f_2$, $BT_3$ 36 for realizing a function $f_3$ and $BT_4$ 37 for realizing a function $f_4$. The subcircuit for realizing the functions $f_1$, $f_2$ and $f_3$ each comprise three binary inputs at which each three variable binary values $x_1$, $x_2$, $x_3$; $x_4$, $x_5$, $x_6$ and $x_7$, $x_8$, $x_9$ are applied. The subcircuit $BT_4$ for realizing the function $f_4(x_{10}, x_{11})$ comprises only two binary inputs at the inputs of which variable values $x_{10}$ and $x_{11}$ are applied.

Figure 7B:
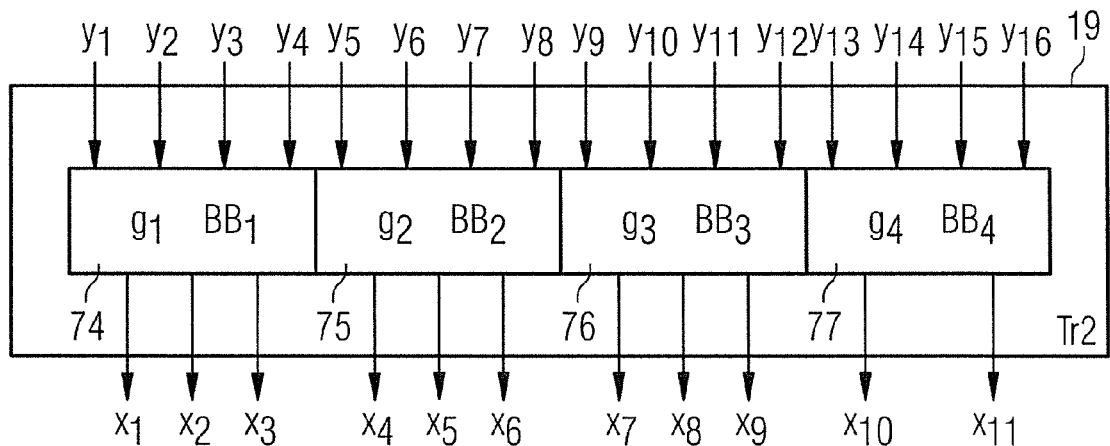
FIG. 7b shows a further implementation of a transformation of the binary auxiliary read values into binary output values according to an embodiment.

FIG. 7b depicts the setup of subcircuit BB 19 from the subcircuits $BB_1$ 74 $BB_2$ 75, $BB_3$ 76 and $BB_4$ 77. The corresponding subcircuits $BB_1$, $BB_2$, $BB_3$ for realizing the functions $g_1$, $g_2$ and $g_3$ may be determined in a completely analog way, like it was described for 9 input values $x_1, \ldots, x_9$. The subcircuit $BB_4$ for realizing the function $g_4(y_{13}, y_{14}, y_{15}, y_{16})$ may simply be determined by determining a subcircuit for realizing a corresponding function $g_4'$ having three output variables and e.g. setting the third component constant, e.g. to 0.

For explanation purposes, the function $g_4'(y_{13}, y_{14}, y_{15}, y_{16})=g_2(y_{13}, y_{14}, y_{15}, y_{16})$ with the output variables $x_{10}$, $x_{11}$, $x_{12}$ is used as it is illustrated in table 10 for the input variables $y_5$, $y_6$, $y_7$, $y_8$ and for the output variables $x_4$, $x_5$, $x_6$. The following applies then

TABLE 11

| $(g'_4(y_{13}, y_{14}, y_{15}, y_{16}))$ | | | | | | |
| --- | --- | --- | --- | --- | --- | --- |
| $y_{13}$ | $y_{14}$ | $y_{15}$ | $y_{16}$ | $x_{10}$ | $x_{11}$ | $x_{12}$ |
| 0 | 1 | 0 | 1 | 0 | 0 | 0 |
| 1 | 1 | 0 | 1 | 0 | 0 | 1 |
| 0 | 1 | 0 | 0 | 0 | 1 | 0 |
| 1 | 1 | 0 | 0 | 0 | 1 | 1 |
| 0 | 0 | 0 | 1 | 1 | 0 | 0 |
| 0 | 0 | 1 | 1 | 1 | 0 | 1 |
| 0 | 0 | 0 | 0 | 1 | 1 | 0 |
| 0 | 1 | 1 | 1 | 1 | 1 | 1 |

(Table 11 for function $g_4'$ was determined completely analog like table 10 for function $g_2$.)

By now selecting the lines of table 11 for which $x_{12}=0$, and by deleting all of the remaining lines and by deleting the column for $x_{12}$, table 12 is acquired which describes the searched function $g_4(y_{13}, y_{14}, y_{15}, y_{16})$, which is realized by subcircuit $BB_4$.

TABLE 12

| $(g_4(y_{13}, y_{14}, y_{15}, y_{16}))$ | | | | | |
| --- | --- | --- | --- | --- | --- |
| $y_{13}$ | $y_{14}$ | $y_{15}$ | $y_{16}$ | $x_{10}$ | $x_{11}$ |
| 0 | 1 | 0 | 1 | 0 | 0 |
| 0 | 1 | 0 | 0 | 0 | 1 |
| 0 | 0 | 0 | 1 | 1 | 0 |
| 0 | 0 | 0 | 0 | 1 | 1 |

It is illustrated in FIG. 3c how the subcircuit BT having 8 binary input values $x_1, \ldots, x_8$ may be implemented from subcircuits $BT_1$ 38 for realizing a function f, $BT_2$ 39 for realizing the same function f, $BT_3$ 310 for realizing a function $\phi$ and $BT_4$ 311 for realizing the same function $\phi$. The subcircuits $BT_1$ 28 and $BT_2$ 29 for realizing the function f each have three binary inputs and two ternary outputs, while subcircuits $BT_3$ 310 and $BT_4$ 311 each comprise a single binary input and a single ternary output for realizing the function $\phi$.

Figure 7C:
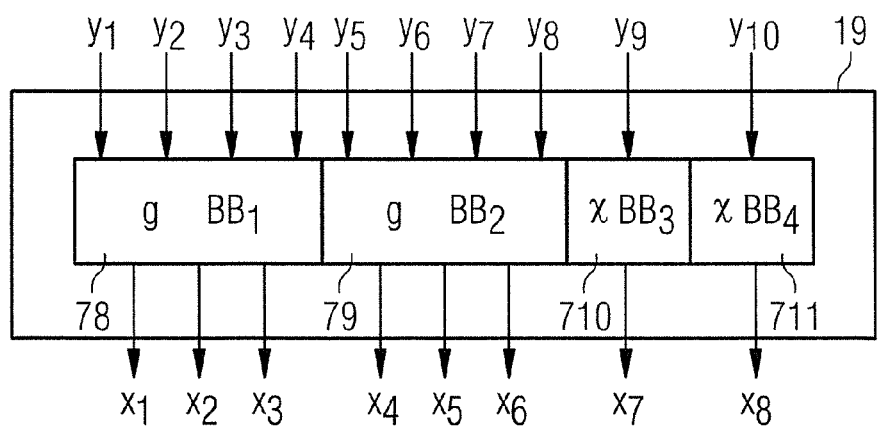
FIG. 7c is a further implementation of a transformation of the binary auxiliary read values into binary output values according to an embodiment.

The subcircuit BB 19, which realizes the corresponding subcircuits $BB_1$ 78, $BB_2$ 79, $BB_3$ 710 and $BB_4$ 711 are illustrated in FIG. 7c. The following applies $BB_1=BB_2$ and $BB_3=BB_4$. The subcircuits $BB_1$ and $BB_2$ each serve for realizing the function g, and the subcircuits $BB_3$ and $BB_4$ each serve for realizing a function $\chi$ with a single binary input and a binary output. Determining the function g may be done completely analogously as it was already described for functions $g_1$ or $g_2$ or for the subcircuit BB 19 of FIG. 7a and is thus not to be explained again.

One advantageous implementation of the subcircuit $BB_3$ 710 which realizes the function $\chi$ is now to be described.

In FIG. 3c, the subcircuit $BT_3$ 310 forms the binary value $x_7$ into the ternary value $z_5$. In one embodiment, the following may apply for the associated function $\phi$:

$$\phi(0_{bin})=0_{ter} \text{ and } \phi(1_{bin})=2_{ter}.$$

If now the subcircuit $LH^5$ 165 in FIG. 4 for m=4 and M=6 is implemented for determining the auxiliary read values $LH^5(z_5)$ so that $$LH^5(0_{ter})=0_{bin}, LH^5(1_{tern})=LH^5(2_{ter})=1_{bin},$$

then $\chi(0)=0$ and $\chi(1)=1$, and the subcircuit for realizing the function $\chi$ then simply consists of a connecting line.

The considered implementation is error-tolerant for memory errors in which a ternary value $z_5=2_{tern}$ stored in the memory is corrupted into a ternary value $z_5'=1_{ter}$. A binary value 1 which was written into the ternary memory as a ternary value $2_{ter}$ is read out as a binary value $1_{bin}$ independent of whether the ternary value $2_{ter}$ in the memory Sp 13 erroneously was corrupted into the ternary value $1_{ter}$ or not. Likewise it is possible to store the binary value $x_7$ as a binary value unchanged as $z_5=x_7$ into the memory Sp 13. In this case it is also possible to use binary memory cells for storing $z_5$ and $z_6$, while the ternary values $z_1, \ldots, z_m$ with m=4 are stored in the memory cells with ternary state values.

Figure 1F:
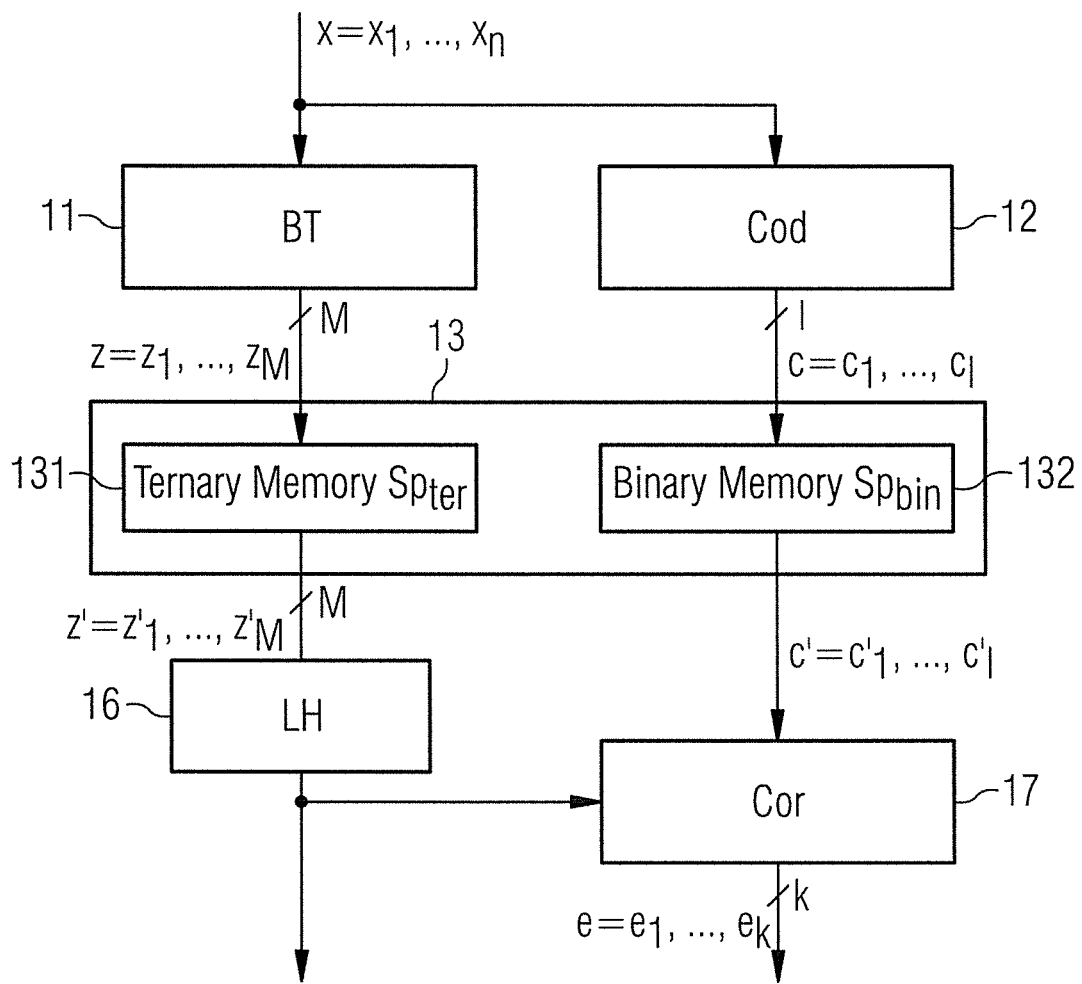
FIG. 1f depicts circuitry having a binary partial memory according to an embodiment.

Advantageously, the memory Sp 13 may comprise a ternary partial memory $Sp_{ter}$ 131 and a binary partial memory $Sp_{bin}$ 132, as it is illustrated in FIG. 1f, wherein the binary check bits $c_1, \ldots, c_l$ are stored as binary values in a binary partial memory $Sp_{bin}$ 122, while the ternary state values $z_1, \ldots, z_m$ and the state values $z_{m+1}, \ldots, z_M$ are stored in a ternary partial memory $Sp_{ter}$.

Storing the check bits $c_1, \ldots, c_l$ generated by the coder Cod 12 in the memory Sp 13 and reading out the stored check bits from the memory Sp 13 is now to be explained again in more detail when the memory cells $Spc_1, \ldots, Spc_l$ are either ternary memory cells or binary memory cells.

First of all the case is described that these memory cells are ternary memory cells and may take on three different states. In order to avoid confusion, here, the ternary values are designated by $0_{ter}$, $1_{ter}$ and $2_{ter}$ and the binary values are designated by $0_{bin}$, $1_{bin}$.

For j=1, ..., l, the binary check bit $c_j$ output at the j-th output of the encoder Cod 12 is applied to the input of the subcircuit $bt_j$ 14j with a binary input and a ternary output. The subcircuit $bt_j$ 14j outputs a ternary value $bt_j(c_j)=c_j'$ at its output.

In one embodiment, the subcircuit $bt_j(c_j)$ is determined so that the following applies $$c_j'=bt_j(c_j) \text{ with } bt_j(0_{bin})=0_{ter} \text{ and } bt_j(1_{bin})=2_{ter}.$$

The subcircuits $tb_1, \ldots, tb_l$ 15j transform the possibly erroneous ternary values $c_1^{t'}, \ldots, c_l^{t'}$ read out from the memory component after component into binary values $c_1'=tb_1(c_1^{t'}), \ldots, c_l'=tb_l(c_l^{t'})$ so that for j=1, ..., l, the following applies:

$$c_j'=tb_j(c_j^{t'}) \text{ with } tb_j(0_{ter})=0_{bin} \text{ and } tb_j(1_{ter})=tb_j(2_{ter})=1_{bin}.$$

If a ternary value 2 is corrupted into a ternary value 1 in memory cells of the ternary memory Sp 13 in which values $c_j', \ldots, c_l'$ were written, this error has no effect at the corresponding output of the subcircuit TrTB 16, as by the function $tb_j$ both the ternary value $2_{ter}$ and also the ternary value $1_{ter}$ are mapped into the binary value $1_{bin}$. This is advantageous.

If the memory cells $Spc_1, \ldots, Spc_l$ are binary memory cells, then both the subcircuits $bt_1$, 141, ..., $bt_l$ 14l and also the subcircuits $tb_1$ 151, ..., $tb_l$ 151 may be realized as a connection of their inputs to their respective outputs. The check bits $c_1, \ldots c_l$ output by the coder Cod 12 are then written binarily into the memory cells $Spc_1, \ldots, Spc_l$ and read out as binary possibly erroneous check bits $c_1', \ldots, c_l'$ which are provided at the corresponding inputs of the corrector Cor 17.

Figure 1G:
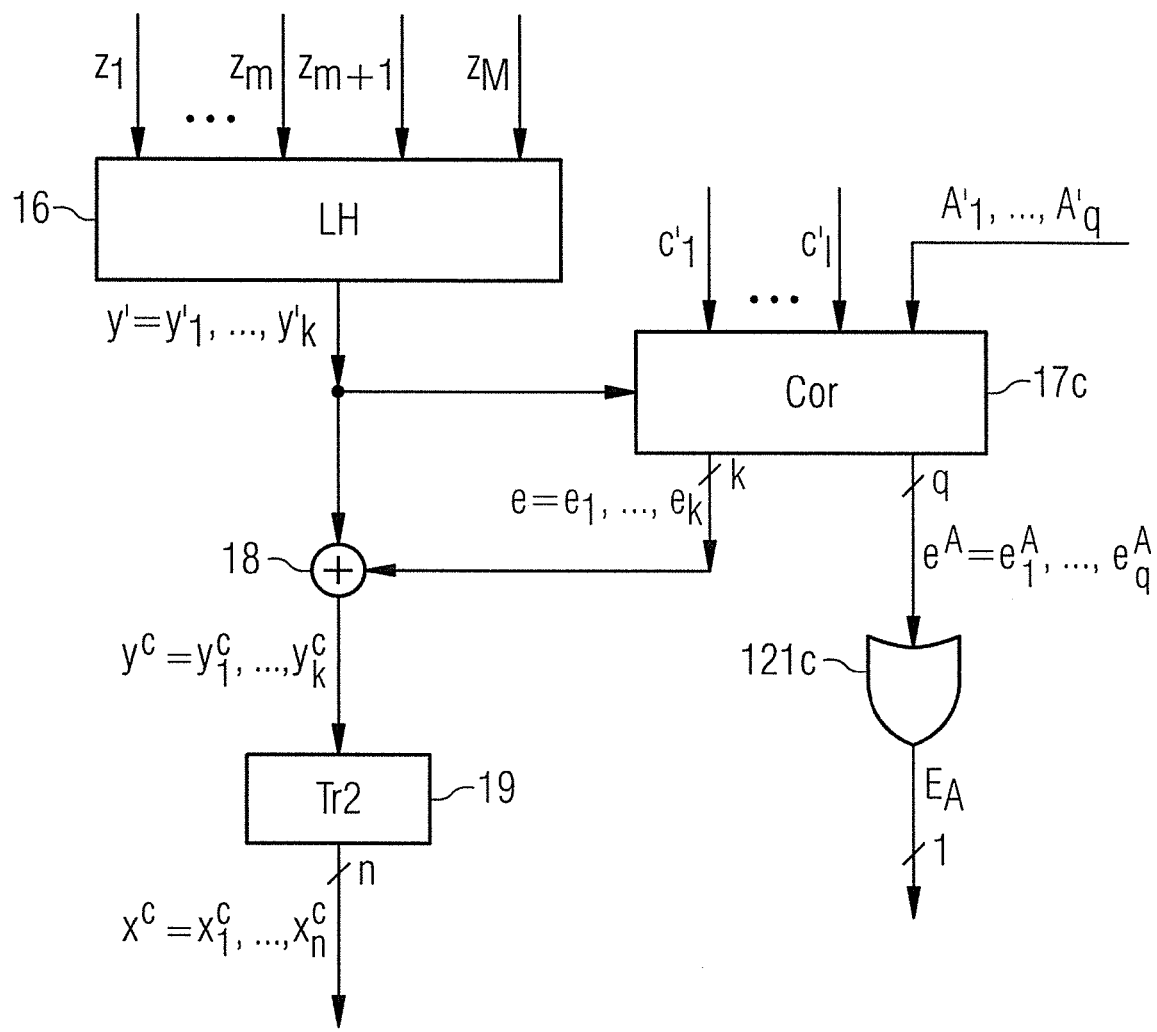
FIG. 1g illustrates an implementation for additional error detection of address errors according to an embodiment.

In the following, now, a special implementation of the corrector Cor 17 is to be explained which is illustrated in FIG. 1g. In FIG. 1g, the special implementation of the corrector Cor is designated by 17c. The corrector Cor 17c comprises l first inputs for inputting the possibly erroneous check bits $c_1', \ldots, c_l'$, k second inputs for inputting the possibly erroneous auxiliary read values $y_1', \ldots, y_k'$ and q further inputs for inputting the bits $A_1', \ldots, A_q'=F(a_1', \ldots, a_Q')$ which were formed from the bits $a_1', \ldots, a_Q$ of the read address $a'=a_1', \ldots, a_Q$. The corrector Cor 17c also comprises k first outputs for outputting a correction vector $e=e_1, \ldots, e_k$ for correcting the auxiliary read values $y_1', \ldots, y_k'$ and q further outputs for outputting a correction vector $e^A=e_1^A, \ldots, e_q^A$ for correcting the bits $A_1', \ldots, A_q'$ derived from the address bits.

The q outputs which carry the component of the correction vector $e^A$ are connected to the q inputs of an OR circuit 121c having q inputs and to a single output, wherein the output outputs the error signal $E_A$ when at least one bit of the correction vector $e^A$ is equal to 1, which indicates an error in the read address a'.

If $E_A=1$, then the read address a' is different from the write address a, so that data is not valid.

If q=Q and $a_1', \ldots, a_Q'=A_1', \ldots, A_q'$, then it is indicated by the correction vector $e^A$ for each address bit whether there is an error in this bit. If the corrector, as described in FIG. 6b, determines an error syndrome, an error message may be generated for an address error when the error syndrome corresponds to an address error.

It is also possible to implement the corrector so that in addition to the correction bits $e_1, \ldots, e_k, e_{a1}, \ldots, e_{kQ}$ for correcting the auxiliary read values and the address bits it also generates correction values $e_1^c, \ldots, e_l^c$ of the check bits.

According to an embodiment, a circuitry for storing binary data $x_1, \ldots, x_n$ and for error correction with a binary code C is provided, the comprising the following features:

1. A ternary memory circuitry 13h exists, comprising a ternary memory Sp 13 with ternary memory cells, wherein the binary data $x_1, \ldots x_n$ are written in memory cells having three states at a write address $a_1, \ldots, a_Q$ as encoded ternary states $z_1, \ldots, z_M$, and wherein a coder 12h writes certain binary check bits $c_1, \ldots, c_l$ in memory cells, and wherein, when the check bits $c_1, \ldots, c_l$ are check bits of the data bits $x_1, \ldots, x_n$ which are written at write address $a_1, \ldots, a_Q$, the check bits are also written at the same write address of the corresponding data bits, and wherein, when reading at a read address $a_1', \ldots, a_Q'$ of memory cells of the ternary memory, which are adapted to take on three different values, possibly erroneous state values $z_1', \ldots, z_M'$ are output which are transformed into possibly erroneous binary auxiliary read values $y_1', \ldots, y_k'$, and wherein, furthermore, possibly erroneous check bits $c_1', \ldots c_l'$ are output, and wherein, when the write address is equal to the read address and when no error is present, error-free auxiliary read values $y_1, \ldots, y_k$ and error-free check bits $c_1, \ldots, c_l$ are output, 2. A coder Cod 12h exists comprising a first n-bit wide first input for input of data bits $x_1, \ldots, x_n$ and a further q-bit wide input for input of bits $A_1, \ldots, A_q$ and an l-bit wide output for output of check bits $c_1, \ldots, c_l$, wherein the bits $A_1, \ldots, A_q$ are determined based on the bits of the write address $a_1, \ldots, a_Q$, wherein the data bits $x_1, \ldots, x_n$, and the corresponding check bits are written under said write address $a_1, \ldots, a_Q$, wherein the coder is configured such that the check bits $c_1, \ldots, c_l$ are determined from the data bits $x_1, \ldots, x_n$ and the bits $A_1, \ldots, A_q$, so that $$y_1, \ldots, y_k, A_1, \ldots, A_q, c_1, \ldots, c_l$$

is a codeword of the error-correcting code C, and wherein the bits $A_1, \ldots, A_q$ are uniquely determined from the bits of the write address $a_1, \ldots, a_Q$, so that the bits $A_1, \ldots, A_q$ are output values of a combinational circuitry F with Q binary inputs and q binary outputs, when the write address $a_1, \ldots, a_Q$ is fed into the inputs of said circuitry, wherein $q \leq Q$ applies.

According to a particular embodiment, q=Q, and $a_1, \ldots, a_Q = A_1, \ldots, A_Q$.

In another particular embodiment, $A_1 = a_1 \oplus \ldots \oplus a_Q$.

According to a further embodiment, the code C is a linear code.

In another particular embodiment, the Code C is a linear code with a generator matrix G=(l, P), and wherein l is a (k+q)-identity matrix, and wherein P is a [(k+q), l]-parity matrix, and wherein the check bits $c_1, \ldots c_l$ are defined by $$c_1, \ldots, c_l = (y_1, \ldots, y_k, A_a, \ldots, A_Q) \cdot P$$

FIG. 1h illustrates an embodiment, wherein data bits are stored in memory cells of a ternary memory circuitry 13h, wherein the memory cells of the ternary memory are configured to take on (one of) three different states. The write and read addresses of the ternary memory of the ternary memory circuitry are employed for error handling, e.g. for error detection and/or error correction.

The ternary memory circuitry 13h comprises memory cells, in which data bits can be stored as ternary states.

When writing, input values $x_1, \ldots, x_n$ on the n-bit wide input line 110g are input into the ternary memory circuitry 13h, and check bits $c_1, \ldots, c_l$ on the l-bit wide input line 111g are input into the ternary memory circuitry 13h. Write address $a_1, \ldots, a_Q$ is fed into the Q-bit wide address input line 115h when writing. When reading, read address $a_1', \ldots, a_Q'$ is fed into the Q-bit wide input line 115h. When reading, binary auxiliary read values $y_1', \ldots, y_k'$ are output on the k bit wide output line 112g, and check bits $c_1', \ldots, c_l'$ are output on the l bit wide output line 113h.

The input line 110g is moreover connected to a first n-bit wide input of coder Cod 12h. Bits $A_1, \ldots, A_q$ are input at a q bit wide second input of the coder Cod 12h. The bits $A_1, \ldots, A_q$ are generated by a combinational circuitry $F_S$ 56h at the write address $a_1, \ldots, a_Q$ according to $$A_1, \ldots, Aq = F(a_1, \ldots, a_Q),$$

wherein F is a unique mapping of the Q address bits $a_1, \ldots, a_Q$ to the bits $A_1, \ldots, A_q$ which are derived from the address bits as already explained above.

The k-bit wide output line 112g, which carries the possibly erroneous auxiliary read values $y_1', \ldots, y_k'$, is connected to a first k-bit wide input of a combinational circuitry 18h and is also connected to a first k-bit wide input of a corrector Kor 17h. An output line 113h is connected to a second l-bit wide input of the corrector Kor 17h, wherein the output line 113h carries the possibly erroneous check bits $c_1', \ldots, c_l'$. A q-bit wide output of the circuitry 55h is connected to the third q-bit wide input of the corrector Kor 17h, wherein a q-bit wide value $A_1', \ldots, A_q'$ is output on the q-bit wide output of the circuitry 55h. A binary read address $a_1', \ldots, a_Q'$ is fed into the circuitry $F_S$ 55 at a Q-bit wide input of the circuitry $F_S$ 55h.

The functionality of the circuitry $F_S$ 55h is equal to the functionality of the circuitry $F_S$ 56h, which is the reason for giving both circuitry 55h as well as circuitry 56h the name "$F_S$."

The corrector Kor 17h outputs the correction vector $e_1, \ldots, e_k$ at its k-bit wide output, which is connected to the second input of the combinational circuitry 18h, which is a correction circuitry. In FIG. 1h, the correction circuitry is implemented as an XOR circuitry. In other embodiments, other implementations may be realized, such as e.g. employing a XNOR circuitry.

In the embodiment of FIG. 1h, the XOR circuitry 18h outputs at its k-bit wide output the corrected auxiliary read values $$y^{cor} = y_1^{cor}, \ldots, y_k^{cor} = y_1' \oplus e_1, \ldots, y_k' \oplus e_k$$

which are transformed into corrected data values $x^{cor} = x_1^{cor} \ldots x_n^{cor}$ by a combinational circuitry BB 19h.

If $a_1, \ldots, a_Q = a_1', \ldots, a_Q'$ applies, so that the write address is equal to the read address, and if no error is present in the ternary memory circuitry 13h, the coder 12h and the circuitry $F_S$ 56h, then the auxiliary read values being output on line 112g are referred to as correct auxiliary read values $y_1, \ldots, y_k$.

The possibly erroneous check bits $c_1', \ldots, c_l'$ which are output on output line 113h are defined by the check bits $c_1, \ldots, c_l$. Those check bits $c_1, \ldots, c_l$ are output at output 111g of Coder 12h, are stored at write address $a_1, \ldots, a_Q$ in memory cells of the ternary memory circuitry 13h and are read out at read address $a_1', \ldots, a_Q'$. The check bits may be stored in memory cells which may take on one of three different states as well as in memory cells which may take on one of two different states.

The Coder Cod 12h is configured such that it generates the check bits $c_1, \ldots, c_l$ such that $$y_1, \ldots, y_k, A_1, \ldots, A_q, c_1, \ldots, c_l$$

is a codeword of an error-correcting code C.

If the code C is a linear code with a generator matrix G=(l, P), wherein l is a (k+q)-identity matrix, and wherein P is a [(k+q), l]-parity matrix, then $c_1, \ldots, c_l$ may be determined as $$c_1, \ldots, c_l = (y_1, \ldots, y_k, A_a, \ldots, A_Q) \cdot P.$$

The corrector Kor 17h outputs a correction vector $e = e_1, \ldots, e_k$, so that $$y^{cor} = y_1^{cor}, \ldots, y_k^{cor} = y_1' \oplus e_1, \ldots, y_k' \oplus e_k = y_1, \ldots, y_k$$

applies, when errors which did occur are correctable by the error-correcting code C.

If the code C is, for example, a 1-bit error-correcting code, then each single bit error, for example, in the auxiliary read values or in the check bits can be validly corrected. If the code C is a 2-bit error-correcting code, then each 2-bit error in the auxiliary read values or in the check bits can be corrected.

Figure 1I:
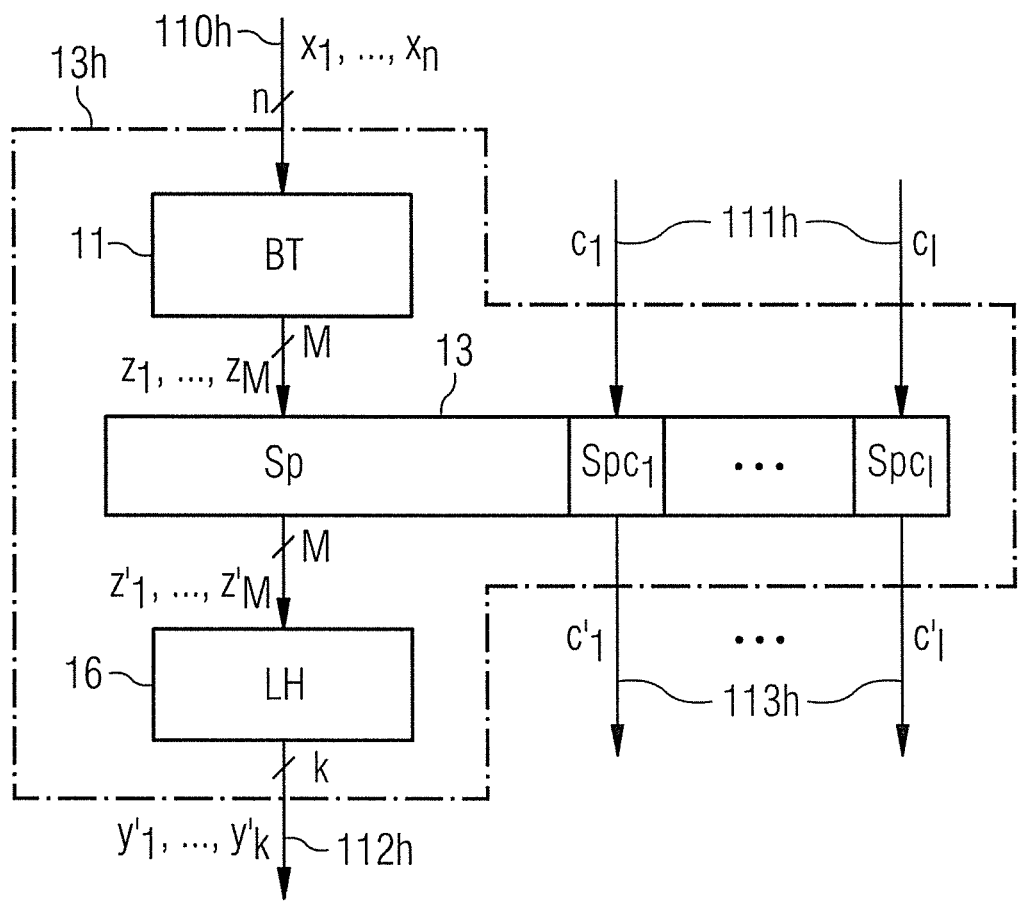
FIG. 1i illustrates ternary memory circuitry according to an embodiment.

A first specific embodiment of the ternary memory circuitry 13h of FIG. 1h is illustrated by FIG. 1i.

The ternary memory circuitry 13h comprises a subcircuit BT 11 for transforming the binary data bits $x_1, \ldots, x_n$ into state values $z_1, \ldots, z_M$ to be stored in memory cells of ternary memory Sp 13, wherein the ternary memory Sp 13 comprises memory cells having ternary state values and wherein the ternary memory Sp 13 comprises memory cells $Spc_1, \ldots, Spc_l$, with at least two states for storing binary check bits $c_1, \ldots, c_l$, and a subcircuit LH 16 for transforming possibly erroneous ternary state values $z_1', \ldots, z_M'$, being read out from the memory Sp 13, into binary auxiliary read values $y_1', \ldots, y_k'$. It is possible that the memory cells $Spc_1, \ldots, Spc_l$ are binary memory cells.

The data bits $x_1, \ldots, x_n$ are input at the n-bit wide input line 110h. The possibly erroneous auxiliary read values $y_1', \ldots, y_k'$ are output on a k-bit wide output line 112h. The possibly erroneous check bits $c_1', \ldots, c_l'$ are output on an l-bit wide output line 113h. As the subcircuits BT 11, Sp 13 and LH 16 have already been described with reference to FIG. 1a, they will be not explained once again.

Figure 1J:
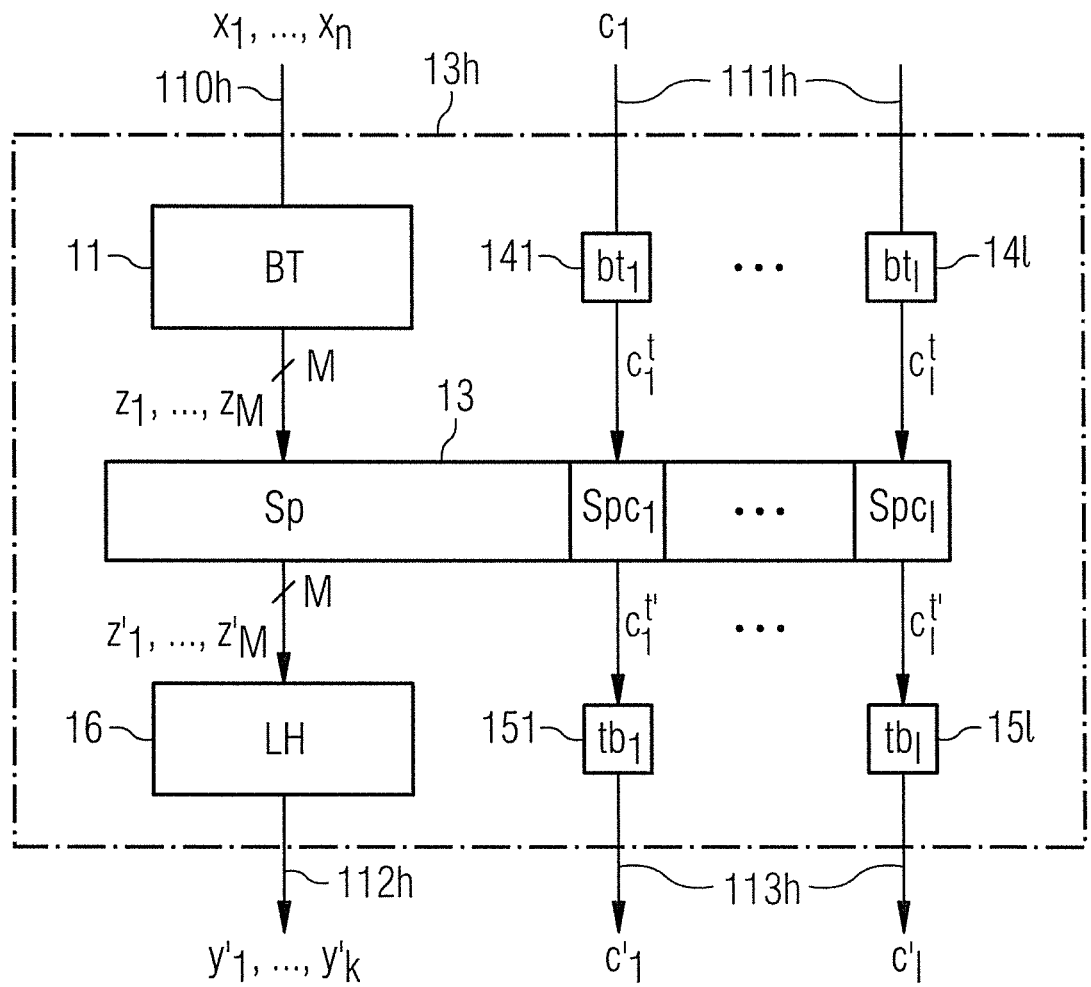
FIG. 1j illustrates ternary memory circuitry according to another embodiment.

A second specific embodiment of the ternary memory circuitry 13h of FIG. 1h is illustrated by FIG. 1j. The ternary memory circuitry in FIG. 1j comprises a subcircuit BT 11 for transforming the binary data bits in state values $z_1, \ldots, z_M$, a memory Sp 13, which here comprises ternary memory cells $Spc_1, \ldots, Spc_l$ for storing the check bits, wherein the check bits $c_1, \ldots, c_l$ are transformed by subcircuits $bt_1$ 141, ..., $bt_l$ 14l into ternary values $c_1^t, \ldots, c_l^t$, a subcircuit LH 16 for transforming possibly erroneous state values $z_1', \ldots, z_M'$, being read out from the memory Sp 13 into possibly erroneous auxiliary read values $y_1', \ldots, y_k'$, and subcircuits $tb_1$ 151, ..., $tb_l$ 15l for transforming the possibly erroneous check bits, being read out from the memory cells $Spc_1, \ldots, Spc_l$.

The data bits $x_1, \ldots, x_n$ are input at an n-bit wide input line 110h. The check bits $c_1, \ldots, c_l$ are input at the l-bit wide input line 111h. The possibly erroneous auxiliary read values $y_1', \ldots, y_k'$ are output at the k-bit wide output line 112h. The possibly erroneous check bits $c_1', \ldots, c_l'$ are output at the l-bit wide output line 113h. The employed subcircuits have already been described with reference to FIGS. 1a and 1d and will not be described once again.

A further specific embodiment of the ternary memory circuitry 13h of FIG. 1h is illustrated by FIG. 1k. The ternary memory circuitry in FIG. 1k comprises a subcircuit BT 11k for transforming the binary data bits and the binary check bits into state values $z_1, \ldots, z_M$, which may take on one of three different values, a ternary memory Sp 13, which here, e.g., only comprises ternary memory cells, a subcircuit LH 16k for transforming the possibly erroneous state values $z_1', \ldots, z_M'$, into possibly erroneous auxiliary read values $y_1', \ldots, y_k'$, $y_{k+m}', \ldots, y_K'$, and a subcircuit BB 19k for transforming the auxiliary read values $y_{k+m}', \ldots, y_K'$ into possibly erroneous check bits $c_1', \ldots, c_l'$. In this embodiment, it is possible that a triple of binary data bits as well as a triple of binary check bits are each stored as a tuple of ternary values in two memory cells of the memory 13k. The data bits $x_1, \ldots, x_n$ are input at the n-bit wide input line 110h. The check bits $c_1, \ldots, c_l$ are input at the l-bit wide input line 111h. The possibly erroneous auxiliary read values $y_1', \ldots, y_k'$ are output at the k-bit wide output line 112h. The possibly erroneous check bits $c_1', \ldots, c_l'$ are output at the l-bit wide output line 113h.

As the subcircuit BT 11k transforms the data bits $x_1, \ldots, x_n$ as well as the check bits, being output by the coder Cod 12h, into ternary state values $z_1, \ldots, z_M$, the input word width of the subcircuit BT 11k is here n+l. The auxiliary read values $y_1', \ldots, y_k'$ being output by the subcircuit LH 16k correspond to the data bits $x_1', \ldots, x_n'$, while the auxiliary read values $y_{k+m}', \ldots, y_K'$ are assigned to the check bits $c_1', \ldots, c_l'$.

Except of the input word widths and the output word widths, the employed subcircuits correspond to the subcircuits already described.

The employed subcircuits have already been described, in particular with reference to FIG. 1a, and are therefore not described once again.

Now a further realization possibility for the subcircuit BT 11 is to be described.

Figure 9A:
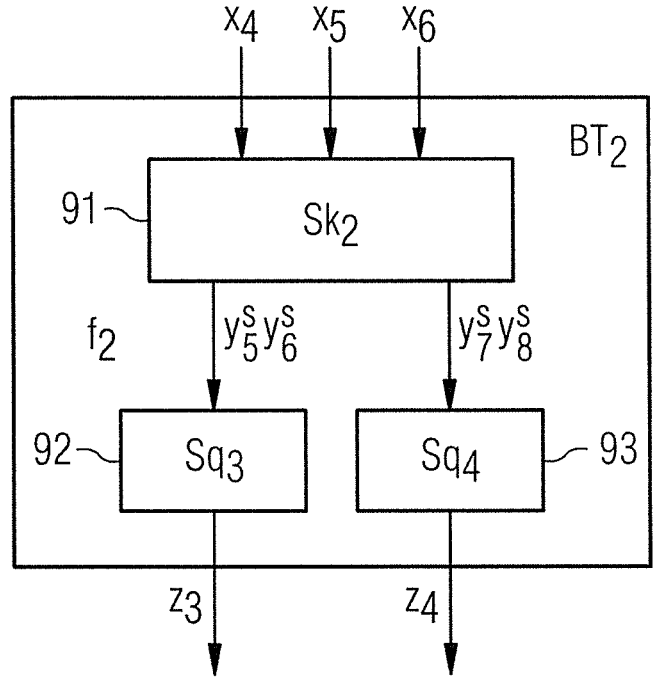
FIG. 9a is an example of a subcircuit for forming binary auxiliary write values and ternary state values according to an embodiment.
Figure 9B:
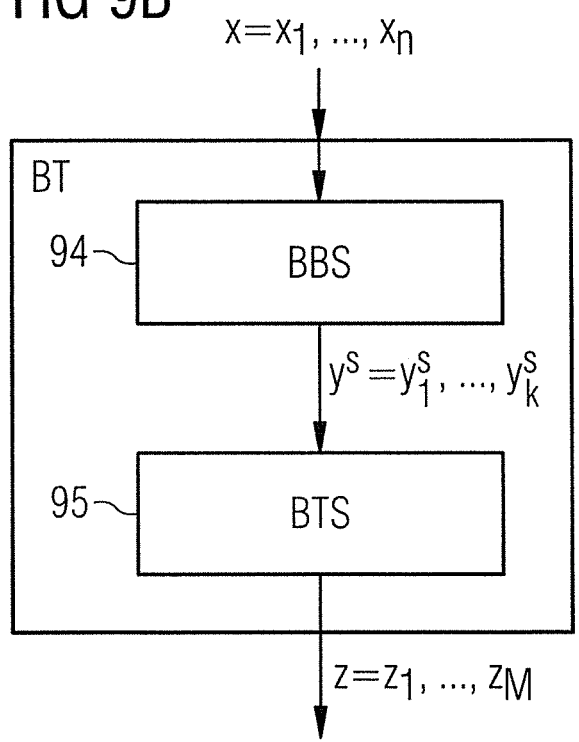
FIG. 9b illustrates an implementation of a subcircuit for the transformation of binary input values into ternary state values according to an embodiment.

The subcircuit BT 11 may be realized as a series connection of a subcircuit BBS 94 for the transformation of binary input values $x_1, \ldots, x_n$ into binary auxiliary write values $y_1^s, \ldots, y_k^s$ and of a subcircuit BTS 95 which transforms the binary auxiliary write values $y_1^s, \ldots, y_k^s$ into the state values $z_1, \ldots, z_m, z_{m+1}, \ldots, z_M$ as it is illustrated in FIG. 9b.

As it is illustrated in FIGS. 3a, 3b and 3c, the subcircuit BT 11 may in turn be setup from subcircuits $BT_j$, j=1, 2, .... As an example, again the realization of the subcircuit $BT_2$ 32 is to be described which converts the binary input values $x_4, x_5, x_6$ into ternary state values $z_3$, and $z_4$ according to table 6. Its currently considered implementation is illustrated in FIG. 9a. The described conversion of the binary input values $x_4, x_5, x_6$ into ternary state values in the illustrative example is executed in two steps. In a first step the three binary input values $x_4, x_5, x_6$ are transformed into four binary auxiliary write values $y_5^S, y_6^S, y_7^S, y_8^S$ with $$y_5^S, y_6^S, y_7^S, y_8^S = k_2(x_4, x_5, x_6).$$

In a second step, a ternary state is assigned to the first pair $y_5^S, y_6^S$, and to the second pair $y_7^S, y_8^S$ of the four binary auxiliary write values.

There are only eight different input values $x_4, x_5, x_6$ and thus only eight different 4-tuples of auxiliary write values $y_5^S, y_6^S, y_7^S, y_8^S$. The transformation of the triple of the input values $x_4, x_5, x_6$ into the auxiliary write values is executed, so that each of the two tuples $y_5^S, y_6^S$ and $y_7^S, y_8^S$ takes on only three different values and may thus in a second step be encoded and stored as a ternary state. Here, $k_2$ is a combinational function with three binary input variables $x_4, x_5, x_6$ and four binary output variables $y_5^S, y_6^S, y_7^S, y_8^S$.

In a second step the first pair $y_5^S, y_6^S$ of the binary auxiliary write values is transformed by a function $q_3$ with two binary input variables $y_5^S, y_6^S$ and a ternary output variable $z_3$ into a first ternary state $z_3$, while the second pair $y_7^S, y_8^S$ of binary auxiliary write values is transformed by a function $q_4$ with two binary input variables and a ternary output variable into a second ternary state $z_4$. The functions $q_3$ and $q_4$ may here be selected equal to each other or different from each other.

The function $q_3$ describes a digital to analog conversion of the digital binary values $y_5^S, y_6^S$ into an analog value, which depending on the assignment to one of three non-overlapping intervals represents one of the three possible ternary values of $z_3$. Accordingly, the function $q_4$ describes a digital to analog conversion of the digital values $y_7, y_8$ into an analog value, which represents one of the possible ternary values of $z_4$.

The described transformation may be realized by a subcircuit $Sk_2$ 91 with three binary inputs and four binary outputs for realizing the function $k_2$ and two downstream subcircuits $Sq_3$ 92 and $Sq_4$ 93 for realizing the functions $q_3$ and $q_4$, as illustrated in FIG. 9a.

At the 3-bit wide input of the subcircuit $Sk_2$ 91, the value $x_4, x_5, x_6$ is applied. The first two binary outputs of the subcircuit $Sk_2$ 91 which carry the auxiliary write values $y_5^S, y_6^S$ are fed into the 2-bit wide binary input of the subcircuit $Sq_3$ 92, while the second binary outputs of the subcircuit $Sk_2$ 91, which carry the auxiliary write values $y_7^S, y_8^S$ are fed into the 2-bit wide binary input of the subcircuit $Sq_4$ 93. The subcircuit $Sq_3$ 92 outputs the value $z_3$ at its ternary output, while the subcircuit $Sq_4$ 93 outputs the value $z_4$ at its ternary output.

It is possible that the auxiliary write values $y_5^S, y_6^S, y_7^S, y_8^S$ are functionally determined from the input values $x_4, x_5, x_6$, just like the auxiliary read values $y_5^S, y_6^S, y_7^S, y_8^S$ are determined from the input values $x_4, x_5, x_6$, and they are equal in the error-free case, as, for example, described in table 9.

It is not necessary that for all input values, here for the 8 possible values of $x_4, x_5, x_6$, the auxiliary write values determined from $x_4, x_5, x_6$ are equal to the auxiliary read values also determined from $x_4, x_5, x_6$.

It may be practical, however, to use such auxiliary write values when storing, which are used as auxiliary read values, when reading out, as it will be explained in more detail later.

Figure 10:
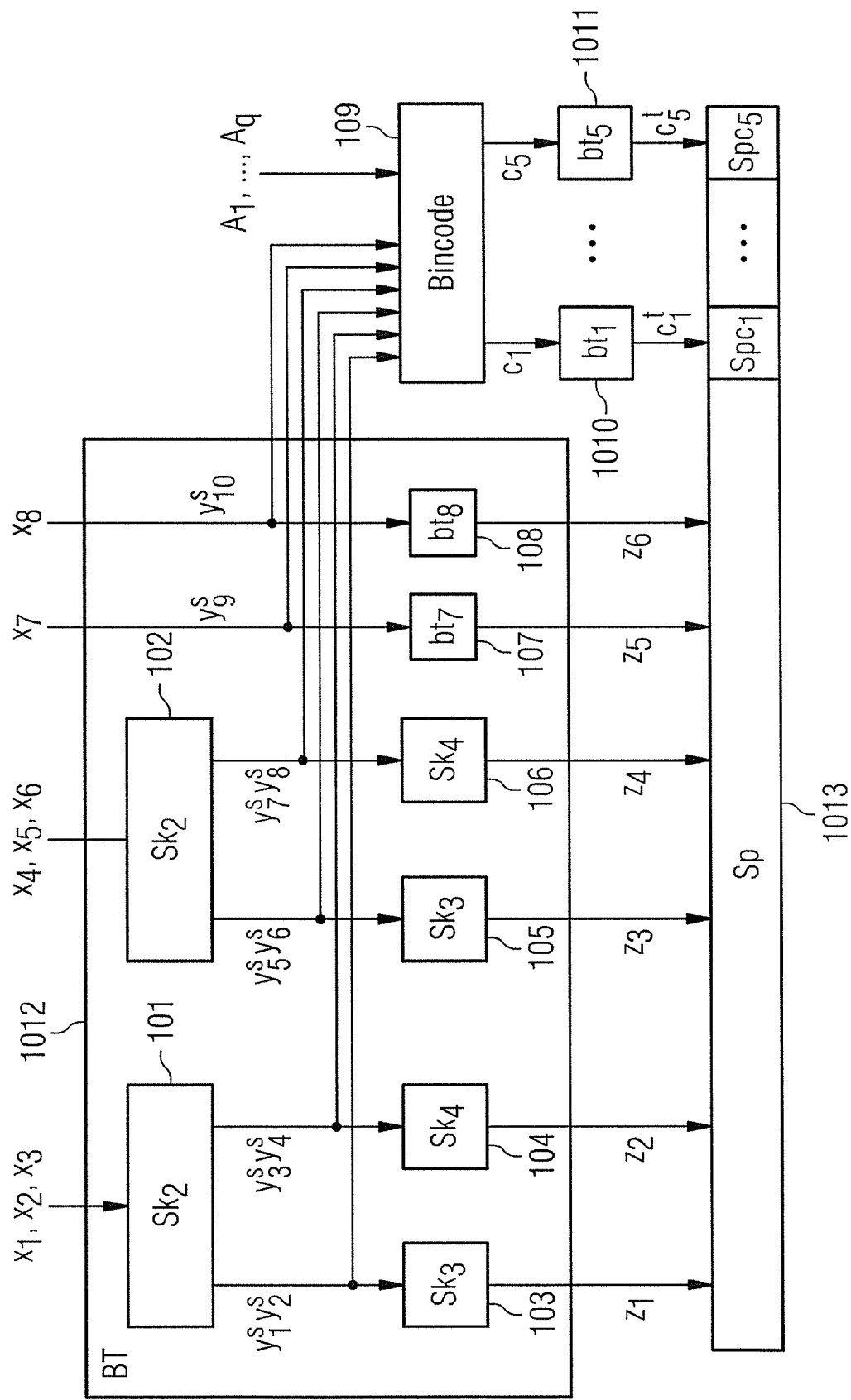
FIG. 10 depicts an implementation of an inventive circuit having 8 binary data bits for forming ternary state values and for realizing a coder using auxiliary write values according to an embodiment.

As an example, here, the case of 8 data bits $x_1, \ldots, x_8$ is considered, and the use of the auxiliary write values is explained also for determining the check bits for an advantageous implementation of the encoder 12, when the auxiliary write values are equal to the auxiliary read values. It is, for example, assumed that the two triples $x_1, x_2, x_3$ and $x_4, x_5, x_6$ are converted into auxiliary write values $y_1^S, y_2^S, y_3^S, y_4^S$, and $y_5^S, y_6^S, y_7^S, y_8^S$ in the same way as it is illustrated in FIG. 10.

The bits $x_1, x_2, x_3$ are transformed into the auxiliary read values $y_1^S, y_2^S, y_3^S, y_4^S$ by the subcircuit $Sk_2$ 101, while the bits $x_4, x_5, x_6$ are transformed into the auxiliary read values $y_5^S, y_6^S, y_7^S, y_8^S$ by the subcircuit $Sk_2$ 102. The two bits $x_7$ and $x_8$ are directly used as auxiliary write values $y_9^S$, and $y_{10}^S$.

The pairs of auxiliary write values $[y_1^S, y_2^S]$, $[y_3^S, y_4^S]$, $[y_5^S, y_6^S]$, $[y_7^S, y_8^S]$ are transformed by the subcircuits $Sk_3$ 103 $Sk_4$ 104 $Sk_3$ 105 $Sk_4$ 106 into the ternary states $z_1, z_2, z_3, z_4$, which are stored in the memory Sp 1013. The auxiliary read value $y_9^S = x_7$ is transformed into the ternary state $z_5$ by the subcircuit $bt_7$ 107. The auxiliary read value $y_{10}^S = x_8$ is transformed into the ternary state $z_6$ by the subcircuit $bt_5$ 108. The states $z_5$ and $z_6$ are also stored in the ternary memory Sp 1013.

The auxiliary write values $y_1^S, \ldots, y_{10}^S$ are also applied to 10 first inputs of the subcircuit Bincode 109, at whose second q inputs the bits $A_1, \ldots, A_q$ derived from the read address $a, \ldots, a_Q$ are applied. In this embodiment, the subcircuit Bincode 109 outputs 5 check bits $c_1, \ldots, c_5$ which are transformed by the subcircuit $bt_1$ 1010, ..., $bt_5$ 1011 into the ternary values $c_1', \ldots, c_5'$, which are each stored in separate memory cells $Spc_1, \ldots, Spc_5$ of the memory Sp 1013.

The subcircuit BT 11 here in turn includes the subcircuits $Sk_2$ 101, $Sk_2$ 102, the subcircuits $Sk_3$ 103, $Sk_4$ 104, $Sk_3$ 105, $Sk_4$ 106, $bt_7$ 107 and $bt_8$ 108.

The coder Cod 12 is setup from the subcircuits $Sk_2$ 101, $Sk_2$ 102 and the subcircuit Bincode 109. The subcircuit BT and the coder Cod 12 are here jointly implemented.

The conversion of the bits $x_4, x_5, x_6$ into the auxiliary write values $y_5^S, y_6^S, y_7^S, y_8^S$ is considered in detail, wherein the auxiliary read values used when reading are equal to the auxiliary write values used when writing, so that when no error occurred, $[y_5, y_6, y_7, y_8] = [y_5^S, y_6^S, y_7^S, y_8^S]$ applies.

When reading, the conversion of the ternary state values read out from the two associated memory cells into corresponding binary auxiliary read values for the memory cell in which the state value $z_3$ is stored, is to be executed by the function $LH^3$ illustrated in table 7, and for the memory cell in which the state value $z_4$ is stored is to be executed by the function $LH^4$ illustrated in table 8.

It is illustrated in table 9, how corresponding binary auxiliary read values $y_5, y_6, y_7, y_8$ are assigned to the binary input values $x_4, x_5, x_6$. For example, as already stated above, for all value combinations of $x_4, x_5, x_6$ which are not listed in table 9, $y_5 = y_6 = y_7 = y_8 = 0$ may be set. The assignment by table 9 is described by the function $k_2(x_4, x_5, x_6)$. It is no difficulty for a person skilled in the art to determine a combinational circuit $Sk_2$ from table 9 which realizes the function $k_2$.

It is assumed here that the auxiliary write values $y_5^S, y_6^S, y_7^S, y_8^S$ are determined by the same function $k_2$ as the auxiliary read values, so that the subcircuit $Sk_2$ 91 is simply a combinational circuit $Sk_2$, which realizes the function $k_2$ described in table 9.

From the pairs $y_5, y_6$ and $y_7, y_8$, which are equal to the corresponding pairs of auxiliary read values or auxiliary write values, then, the ternary state values $z_3$ and $z_4$ are determined by functions $q_3$ and $q_4$ according to tables 13 and 14, wherein the ternary state values $z_3$ and $z_4$ are stored into the ternary memory Sp 13. Here, the possible state values of $z_3$ are designated as $A_0, A_1, A_2$ and the possible state values of $z_4$ are designated as $B_0, B_1, B_2$.

Table 13 describes the function $q_3$ and table 14 describes the function $q_4$.

TABLE 13

$q_3(y_5, y_6)$

| $y_5$ | $y_6$ | $z_3$ |
|---|---|---|
| 0 | 0 | 0 |
| 0 | 1 | 1 |
| 1 | 1 | 2 |
| 1 | 0 | — |

TABLE 14

$q_4(y_7, y_8)$

| $y_7$ | $y_8$ | $z_4$ |
|---|---|---|
| 0 | 0 | 0 |
| 1 | 0 | 1 |
| 1 | 1 | 2 |
| 0 | 1 | — |

As before, the columns of tables 13 and 14, marked by $y_i$, comprise binary values and the columns marked by $z_j$ comprise ternary values. The functions $q_3$ and $q_4$ are realized by circuits $Sq_3$ and $Sq_4$, which execute a digital to analog conversion, and whose realization by an analog to digital converter is no difficulty for a person skilled in the art.

The realization of the coder Cod 12 and the corrector Cor 17 is now to be explained for a special embodiment for a special linear code, wherein eight binary input values $x_1, \ldots, x_8$ are to be stored. These eight binary input values, as described above, are transformed into 10 binary auxiliary read values $y_1, \ldots, y_{10}$, which represent the data or information bits of the linear code C. The code C comprises 10 information bits $y_1, \ldots, y_{10}$ and 5 check bits $c_1, \ldots, c_5$. The code C may be described by a (10, 15)-G-matrix G and by a (5, 15)-H-matrix H. As an example of a generator matrix, the following generator matrix G is chosen.

$$G = \begin{pmatrix} 1 & 0 & 0 & 0 & 0 & 0 & 0 & 0 & 0 & 0 & 1 & 1 & 1 & 0 & 0 \\ 0 & 1 & 0 & 0 & 0 & 0 & 0 & 0 & 0 & 0 & 1 & 1 & 0 & 1 & 0 \\ 0 & 0 & 1 & 0 & 0 & 0 & 0 & 0 & 0 & 0 & 1 & 1 & 0 & 0 & 1 \\ 0 & 0 & 0 & 1 & 0 & 0 & 0 & 0 & 0 & 0 & 1 & 0 & 1 & 1 & 0 \\ 0 & 0 & 0 & 0 & 1 & 0 & 0 & 0 & 0 & 0 & 1 & 0 & 1 & 0 & 1 \\ 0 & 0 & 0 & 0 & 0 & 1 & 0 & 0 & 0 & 0 & 1 & 0 & 0 & 1 & 1 \\ 0 & 0 & 0 & 0 & 0 & 0 & 1 & 0 & 0 & 0 & 0 & 1 & 1 & 1 & 0 \\ 0 & 0 & 0 & 0 & 0 & 0 & 0 & 1 & 0 & 0 & 0 & 1 & 1 & 0 & 1 \\ 0 & 0 & 0 & 0 & 0 & 0 & 0 & 0 & 1 & 0 & 0 & 1 & 0 & 1 & 1 \\ 0 & 0 & 0 & 0 & 0 & 0 & 0 & 0 & 0 & 1 & 0 & 0 & 1 & 1 & 1 \end{pmatrix} \quad (1)$$

The G-matrix has the following form $$G = (I_{10}, P_{10,5}). \quad (2)$$

Here, $1_{10}$ is the 10-dimensional identity matrix and $P_{10,5}$ with $$P_{10,5} = \begin{pmatrix} 1 & 1 & 1 & 0 & 0 \\ 1 & 1 & 0 & 1 & 0 \\ 1 & 1 & 0 & 0 & 1 \\ 1 & 0 & 1 & 1 & 0 \\ 1 & 0 & 1 & 0 & 1 \\ 1 & 0 & 0 & 1 & 1 \\ 0 & 1 & 1 & 1 & 0 \\ 0 & 1 & 1 & 0 & 1 \\ 0 & 1 & 0 & 1 & 1 \\ 0 & 0 & 1 & 1 & 1 \end{pmatrix} \quad (3)$$

is the parity matrix.

The check bits $c_1, \ldots, c_5$ are determined by $$c_1, c_2, c_3, c_4, c_5 = (y_1, y_2, y_3, y_4, y_5, y_6, y_7, y_8, y_9, y_{10}) \cdot P_{10,5} \quad (4)$$

so that $c_1 = y_1 \oplus y_2 \oplus y_3 \oplus y_4 \oplus y_5 \oplus y_6$ $c_2 = y_1 \oplus y_2 \oplus y_3 \oplus y_7 \oplus y_8 \oplus y_9$ $c_3 = y_1 \oplus y_4 \oplus y_5 \oplus y_7 \oplus y_8 \oplus y_{10}$ $c_4 = y_2 \oplus y_4 \oplus y_6 \oplus y_7 \oplus y_9 \oplus y_{10}$ $c_5 = y_3 \oplus y_5 \oplus y_6 \oplus y_8 \oplus y_9 \oplus y_{10}$ being realized by the subcircuit Bincode 109 in FIG. 10. In this special example C is a binary code and as a special case the circuit Bincode implements the check-bit generation of the code C. A person skilled in the art understands that the considered code C is a Hsiao code which may correct all 1-bit errors and detect all 2-bit errors.

The implementation of the check bits $c_1, \ldots, c_5$ determined from the auxiliary read values $y_1, \ldots, y_{10}$ by XOR operations is not a difficulty for a person skilled in the art and is thus not to be explained in more detail.

The pairs $[y_1, y_2], [y_3, y_4], [y_5, y_6], [y_7, y_8], \ldots$, of auxiliary read values which are each derived from a ternary state value stored in a ternary memory cell each only take on three different values, e.g. the values [0,0], [0,1], [1,1]. Pairs of check bits, however, take on four different values, which is why a pair of check bits may not be stored in a ternary memory cell. This is to be explained for the pair $[c_1, c_2]$ of check bits.

If all auxiliary read values are equal 0, $y_1 = y_2 = \ldots = y_{10} = 0$, then $[c_1, c_2] = [0, 0]$.

If $[y_1, y_2] = [0, 1]$ and if all other auxiliary read values are equal to 0, then $[c_1, c_2] = [1, 1]$.

If $[y_3, y_4] = [1, 1]$ and if all other auxiliary read values are equal to 0, then $[c_1, c_2] = [0, 1]$.

If $[y_1, y_2] = [0, 1]$ and if $[y_3, y_4] = [1, 1]$ and if all other auxiliary read values are equal to 0, then $[c_1, c_2] = [1, 0]$.

A pair of check bits may thus not be stored in one single ternary memory cell.

In the following, one possible implementation of the corrector Corr will now be described for the considered linear code C. The error correction is executed so that from the read out possible erroneous memory states $z_1', \ldots, z_8'$, the auxiliary read values $y_1', \ldots, y_{10}'$ are formed, as described, and then these auxiliary read values and the possibly erroneous check bits $c_1', \ldots, c_5'$ by the corrector Korr 1016 the correction vector $e = e_1, \ldots, e_{10}$ is determined.

The error correction is executed using the H-matrix H of the code C which is as known determined to be $H = (P_{5,10}^T, 1_5) = (h_1, \ldots, h_{15})$, wherein $P_{5,10}^T$ is the transposed matrix of the matrix $P_{10,5}$ in which lines and columns are exchanged and $1_5$ is the 5-dimensional identity matrix, so that $$H = \begin{pmatrix} 1 & 1 & 1 & 1 & 1 & 1 & 0 & 0 & 0 & 0 & 1 & 0 & 0 & 0 & 0 \\ 1 & 1 & 1 & 0 & 0 & 0 & 1 & 1 & 1 & 0 & 0 & 1 & 0 & 0 & 0 \\ 1 & 0 & 0 & 1 & 1 & 0 & 1 & 1 & 0 & 1 & 0 & 0 & 1 & 0 & 0 \\ 0 & 1 & 0 & 1 & 0 & 1 & 1 & 0 & 1 & 1 & 0 & 0 & 0 & 1 & 0 \\ 0 & 0 & 1 & 0 & 1 & 1 & 0 & 1 & 1 & 1 & 0 & 0 & 0 & 0 & 1 \end{pmatrix} \quad (5)$$

applies. Here, $h_i$ for $i = 1, \ldots, 15$ are the columns of the H-matrix H.

All columns of the H-matrix H are different and each column $h_i$, $i = 1, \ldots, 15$ either contains one 1 or three 1s, i.e. an odd number of ones.

As illustrated by FIG. 6a, the corrector 17a comprises a syndrome generator 61a which for $k = 10$ and $l = 5$ comprises the possible erroneous auxiliary read values $y_1', \ldots, y_{10}'$ and the possibly erroneous check bits $c_1', \ldots, c_5'$ read out from the memory according to the following relation $$s = [s_1, \ldots, s_5]^T = H \cdot [y_1', \ldots, y_{10}', c_1', \ldots, c_5']^T \quad (6)$$

form an error syndrome s, as it is conventional for a linear code so that the individual components $s_1, \ldots, s_5$ of the error syndrome are determined to be $s_1 = c_1' \oplus y_1' \oplus y_2' \oplus y_3' \oplus y_4' \oplus y_5' \oplus y_6'$ $s_2 = c_2' \oplus y_1' \oplus y_2' \oplus y_3' \oplus y_7' \oplus y_8' \oplus y_9'$ $s_3 = c_3' \oplus y_1' \oplus y_4' \oplus y_5' \oplus y_7' \oplus y_8' \oplus y_{10}'$ $s_4 = c_4' \oplus y_2' \oplus y_4' \oplus y_6' \oplus y_7' \oplus y_9' \oplus y_{10}'$ $s_5 = c_5' \oplus y_3' \oplus y_5' \oplus y_6' \oplus y_8' \oplus y_9' \oplus y_{10}'$ Here, $[y_1', \ldots, y_{10}', c_1', \ldots, c_5']^T$ is the transposed column vector of the row vector $[y_1', \ldots, y_{10}', c_1', \ldots, c_5']$, and $[s_1, \ldots, s_5]^T$ is the transposed column vector of the row vector $[s_1, \ldots, s_5]$ of the components of the syndrome.

The implementation of the syndrome generator 61a, which realizes the indicated equations for the components of the error syndrome $s_1, s_2, s_3, s_4, s_5$, for example by using XOR gates, or by using a commercial synthesis tool, is no difficulty for a person skilled in the art.

From the error syndrome s, the decoder 62a determines the associated correction vector $e = e_1, \ldots, e_{10}$ for the auxiliary read values $y_1', \ldots, y_{10}'$, which are the information bits of the considered linear error-correcting code C. Table 15 represents the table of values of the decoder 52.

TABLE 15

| $s_1$ | $s_2$ | $s_3$ | $s_4$ | $s_5$ | $e_1$ | $e_2$ | $e_3$ | $e_4$ | $e_5$ | $e_6$ | $e_7$ | $e_8$ | $e_9$ | $e_{10}$ |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 |
| 1 | 1 | 1 | 0 | 0 | 1 | 0 | 0 | 0 | 0 | 0 | 0 | 0 | 0 | 0 |
| 1 | 1 | 0 | 1 | 0 | 0 | 1 | 0 | 0 | 0 | 0 | 0 | 0 | 0 | 0 |
| 1 | 1 | 0 | 0 | 1 | 0 | 0 | 1 | 0 | 0 | 0 | 0 | 0 | 0 | 0 |
| 1 | 0 | 1 | 1 | 0 | 0 | 0 | 0 | 1 | 0 | 0 | 0 | 0 | 0 | 0 |
| 1 | 0 | 1 | 0 | 1 | 0 | 0 | 0 | 0 | 1 | 0 | 0 | 0 | 0 | 0 |
| 1 | 0 | 0 | 1 | 1 | 0 | 0 | 0 | 0 | 0 | 1 | 0 | 0 | 0 | 0 |
| 0 | 1 | 1 | 1 | 0 | 0 | 0 | 0 | 0 | 0 | 0 | 1 | 0 | 0 | 0 |
| 0 | 1 | 1 | 0 | 1 | 0 | 0 | 0 | 0 | 0 | 0 | 0 | 1 | 0 | 0 |
| 0 | 1 | 0 | 1 | 1 | 0 | 0 | 0 | 0 | 0 | 0 | 0 | 0 | 1 | 0 |
| 0 | 0 | 1 | 1 | 1 | 0 | 0 | 0 | 0 | 0 | 0 | 0 | 0 | 0 | 1 |

All in all there are $32=2^5$ different syndrome values. Corresponding correction values are associated to 11 syndrome values of those in table 15.

For all syndrome values not listed in table 15, the values for $e_1, \ldots, e_{10}$ may be random, which may serve for optimizing the decoder. For example, all of those values may be determined to be 0. If the error syndrome is equal to 0, then no correction takes place, as is illustrated in the first line of table 15, as then $e=0, \ldots, 0$. If it applies to the error syndrome that $s=h_i$, ($i \in \{1, \ldots, 10\}$), then the i-th component of the auxiliary read values is corrected, which corresponds to the correction of a 1-bit error. In this case, for the i-th component, $e_i=1$ applies. All other components of e are 0. If $s=[1, 1, 0, 0]^T=h_3$, then $e=[0, 0, 1, 0, 0, 0, 0, 0, 0, 0]^T$ and the third component of the auxiliary read values is corrected.

Figure 11:
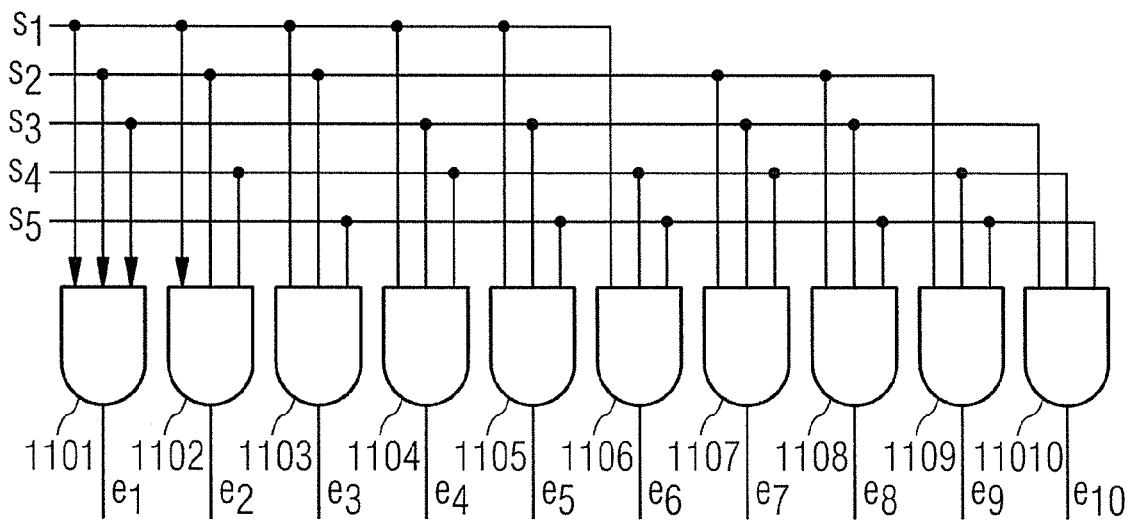
FIG. 11 is an example of a decoder circuit of a linear code according to prior art.

One possible decoder circuit is illustrated in FIG. 11.

The decoder circuit of FIG. 11 has 5 binary inputs which carry the components $s_1, s_2, s_3, s_4, s_5$, and 10 binary outputs which output the components $e_1, \ldots, e_{10}$. It comprises 10 AND gates 110i, i=1, . . . , 10, each having three inputs, wherein the output of the AND gate 110i carries the value $e_i$.

The input of the decoder carrying the component $s_1$ is connected each to a first input of the AND gates 1101, 1102, 1103, 1104, 1105 and 1106. The input of the decoder carrying the component $s_2$ is connected to a second input of the AND gates 1101, 1102, 1103 and to a first input of the AND gates 1107, 1108 1109, each. The input of the decoder carrying the component $s_3$ is connected to a first input of the AND gate 11010, each to a second input of the AND gates 1104, 1105, 1107, 1108 and to the third input of the AND gate 1101. The input of the decoder carrying the component $s_4$ is connected to a second input of the AND gates 1106, 1109, 1010 and to the third input of the AND gates 1102, 1104, 1107, each. The input of the decoder carrying the component $s_5$ is each connected to the third input of the AND gates 1103, 1105, 1106, 1108, 1109, 11010.

Figure 12:
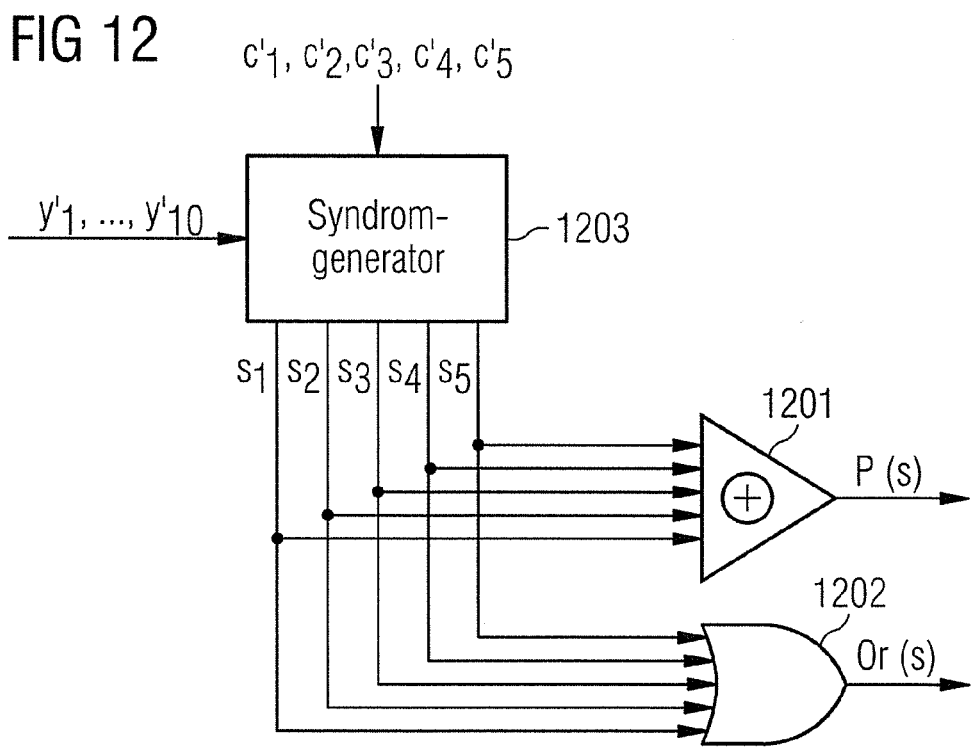
FIG. 12 is an example of an error detection circuit according to prior art.

FIG. 12 shows a possible error detection circuit for the described embodiment. It comprises a syndrome generator 1203 as it was also used for the corrector 17a in FIG. 6a, a 5 input XOR tree 1201 and a 5 input OR tree 1202. The syndrome generator has 10 first binary inputs at which the possibly erroneous auxiliary read values $y_1', \ldots, y_{10}'$ are applied and 5 further inputs which carry the possibly erroneous check bits $c_1', \ldots, c_3'$ and 5 outputs at which the syndrome bits $s_1, s_2, s_3, s_4, s_5$ were output. The 5 outputs of the syndrome generator are connected both to 5 inputs of the XOR tree 1201, which outputs the parity $P(s)=s_1 \oplus s_2 \oplus \ldots \oplus s_5$ at its output, and are also connected to the 5 inputs of the OR tree 1202, which outputs the OR operation $OR(s)=s_1 \lor s_2 \lor \ldots \lor s_5$ of the syndrome components.

If only 1-bit errors and 2-bit errors are differentiated, as all columns $h_i$ of the H matrix H comprise odd numbers of 1s, the following applies:

A 1-bit error exists, when $P(s)=1$ and $OR(s)=1$.

A 2-bit error exists, when $P(s)=0$ and $OR(s)=1$.

Figure 13:
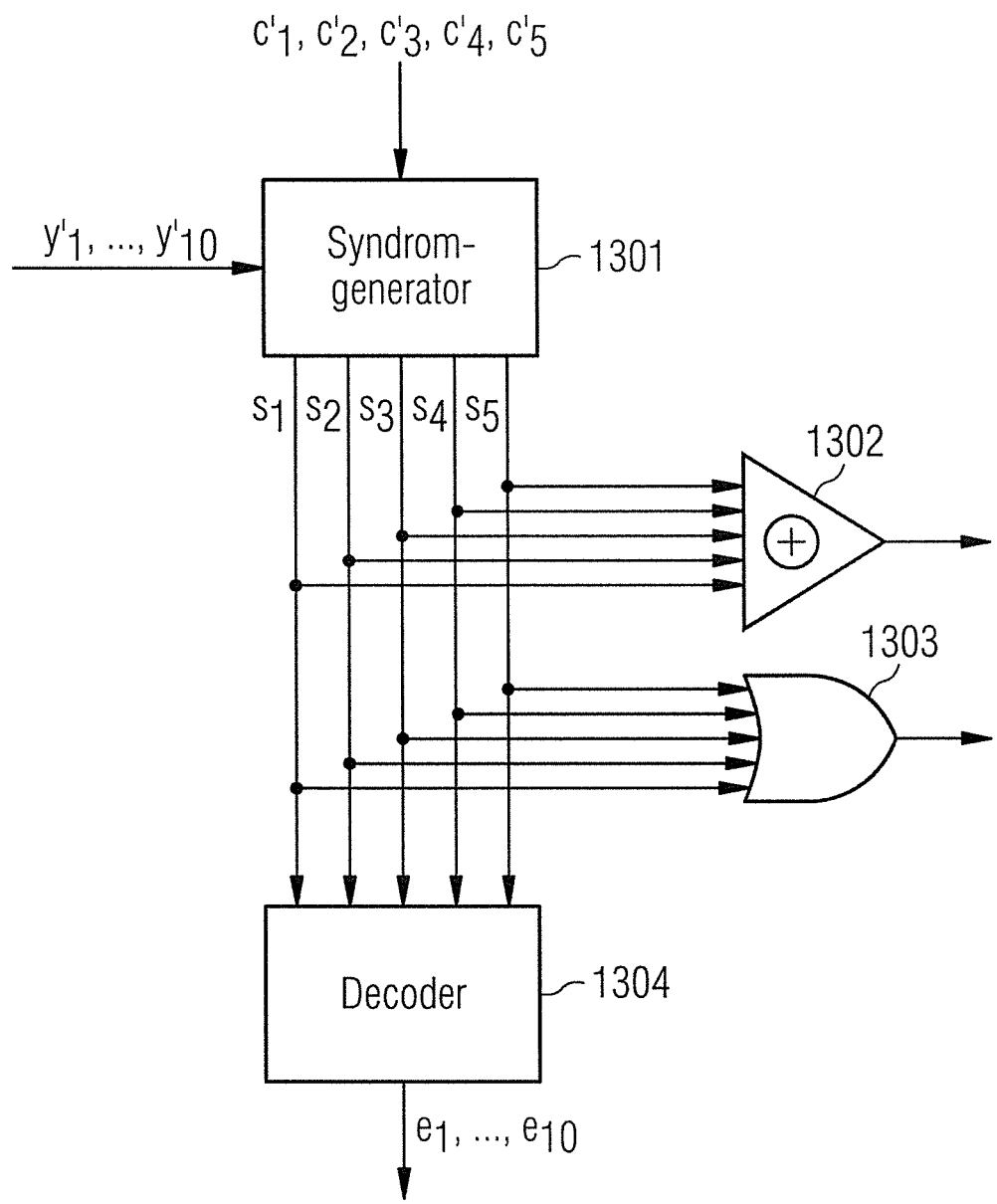
FIG. 13 is an example of a common realization of an error detection circuit and a corrector according to prior art.

FIG. 13 shows a joint realization of the correction circuit and the error detection circuit. As the syndrome generator 1301 may be used both for error correction and also for error detection, it is possible to implement only one syndrome generator, and to connect its outputs, which carry the components $s_1, \ldots, s_5$, simultaneously to the corresponding inputs of the decoder 1304, to the inputs of the XOR tree 1302 and to the inputs of the OR tree 1203, so that the corrector Cor 17 and the circuit for error detection Det 120 are realized together, here.

The functioning of the considered embodiment is now to be explained.

In a memory with a subcircuit BT according to FIG. 3c the binary values $x_1, \ldots, x_8=0, 0, 1, 1, 0, 1, 1, 1$ are to be stored. The subcircuit BT in turn, as illustrated in FIG. 3c, comprises the subcircuits $BT_1$ 38, $BT_2$ 39, $BT_3$ 310 and $BT_4$ 311, wherein both subcircuits $BT_1$ and $BT_2$ realize the same function f as illustrated in table 6.

The subcircuit $BT_1$ transforms the bits $x_1, x_2, x_3=001$ according to table 6 into the ternary states $2_{ter}, 1_{ter}$. The subcircuit $BT_2$ transforms the bits $x_4, x_5, x_6=101$ of table 6 into the ternary states $0_{ter}, 2_{ter}$. The subcircuit $BT_3$ maps the bit $x_7=1$ into the ternary state $1_{ter}$, just like the subcircuit $BT_4$ maps the bit $x_8=1$ into the ternary state $1_{ter}$. The ternary states $2_{ter}, 1_{ter}, 0_{ter}, 2_{ter}, 1_{ter}, 1_{ter}$ are written into the first 6 memory cells of the memory Sp 13.

The encoder Cod 12 transforms the 8 binary input values $x_1, \ldots, x_8=0, 0, 1, 1, 0, 1, 1, 1$ into the five binary check bits $c_1, \ldots, c_5$.

The functioning of the encoder may, as described, be understood so that it first of all functionally transforms its input values into the corresponding auxiliary read values, and generates the corresponding check bits from the auxiliary read values using here a linear code C, although these two steps do not have to be executed separately, for example due to the common optimization of the corresponding subcircuits.

According to table 9, the bits $x_1, x_2, x_3=0, 0, 1$ are first of all transformed into the auxiliary read values $y_1, y_2, y_3, y_4=1, 1, 0, 1$, the bits $x_4, x_5, x_6=101$ are transformed into the auxiliary read values $y_5, y_6, y_7, y_8=0, 0, 1, 1$ and bit $x_7=1$ is transformed into $y_9=1$ and bit $x_8=1$ is transformed into $y_{10}=1$ by the encoder. From the resulting auxiliary read values 1101001111, the binary check bits $c_1, \ldots, c_5$ are determined by $$c_1, c_2, c_3, c_4, c_5 = (1,1,0,1,0,0,1,1,1,1) \cdot P = 1,1,1,1,1$$

as it may be directly calculated. The binary check bits $c_1, c_2, c_3, c_4, c_5=1, 1, 1, 1, 1$ are transformed by the subcircuits $bt_1$ 1010, . . . , $bt_5$ 1011 into the ternary states $1_{ter}, 1_{ter}, 1_{ter}, 1_{ter}, 1_{ter}$, and are each written into a separate one of five further cells of the memory Sp 1013, so that all in all, the values $z_1, \ldots, z_4, z_5, z_6, c_1, \ldots, c_5 = 2_{ter}, 1_{ter}, 0_{ter}, 2_{ter}, 1_{ter}, 1_{ter}, 1_{ter}, 1_{ter}, 1_{ter}, 1_{ter}, 1_{ter}$ are written into the ternary memory.

If no error occurs, then the state values $z_1', \ldots, z_4', z_5', z_6', c_1', \ldots, c_5' = 2_{ter}, 1_{ter}, 0_{ter}, 2_{ter}, 1_{ter}, 1_{ter}, 1_{ter}, 1_{ter}, 1_{ter}, 1_{ter}, 1_{ter}$ are read out. The ternary values $z_1', \ldots, z_6' = 2_{ter}, 1_{ter}, 0_{ter}, 2_{ter}, 1_{ter}, 1_{ter}$ are transformed by the subcircuit LH 16, which is illustrated in detail in FIG. 4, into the auxiliary read values $y_1'y_2'=LH^1(2_{ter})=11$, $y_3'$, $y_4'=LH^2(1_{ter})=01$, $y_5'y_6'=LH^3(0_{ter})=00$, $y_7'$, $y_8'=LH^4(2_{ter})=11$, $y_9'=LH^5(1_{ter})=1$, $y_{10}'=LH^6(1_{ter})=1$, using table 8 for $LH^1$, $LH^2$, $LH^3$ and $LH^4$. The ternary states $1_{ter}, \ldots, 1_{ter}$, which correspond to the check bits $c_1, \ldots, c_5$, are transformed by the corresponding subcircuit $tb_1$ 151, ..., $tb_5$ 155 into binary values $1_{bin}, \ldots, 1_{bin}$, so that the auxiliary read values y'=(1, 1, 0, 1, 0, 0, 1, 1, 1, 1) are output by the subcircuit LH 16. These auxiliary read values and the check bits $c_1', \ldots, c_5'$=1, 1, 1, 1, 1 read out from the memory are applied to the corresponding inputs of the corrector 17. In its syndrome generator 61a of FIG. 6a, the corrector forms the error syndrome $$(s_1, \ldots, s_5)^T = H \cdot (1,1,0,1,0,0,1,1,1,1,1,1,1,1,1)^T = (0,0,0,0,0)^T,$$

which is again simply calculated, and the decoder 62a according to table 15, first line, outputs the correction vector $e=e_1, \ldots, e_{10}=0, 0$, whose components are combined in the XOR circuit 18a with the auxiliary read values y' to the corrected auxiliary read values $$y^c = y_1^c, \ldots, y_{10}^c = y_1' \oplus 0, \ldots, y_{10}' \oplus 0 = 1,1,0,1,0,0,1,1,1,1 = y' \oplus e.$$

From the corrected auxiliary read values $y^c$, the subcircuit BB 19 forms the corrected output values $x^c$. The subcircuit BB 19 is set as illustrated in FIG. 7c. The subcircuit BB1 78 transforms the corrected auxiliary read values $y_1^c, \ldots, y_4^c=1, 1, 0, 1$ according to Table 10 into the corrected output values $x_1^c, x_2^c, x_3^c=0, 0, 1$. The subcircuit $BB_2$ 79 transforms the corrected auxiliary read values $y_5^c, \ldots, y_8^c=0, 0, 1, 1$ according to Table 10 into the corrected output values $x_4^c, x_5^c, x_6^c=1, 0, 1$. The subcircuit $BB_3$ 710 transforms the corrected auxiliary read values $y_9^c=1$ into the corrected output value $x_7^c=1$. The subcircuit $BB_4$ 711 transforms the corrected auxiliary read value $y_{10}^c=1$ into the corrected output value $x_8=1$. At the circuit output thus the corrected result $x_1^c, \ldots, x_8^c=0, 0, 1, 1, 0, 1, 1, 1$ is output.

It is now assumed that the ternary state $z_1=2$ written into the memory is corrupted erroneously into the state $z_1'=1$ when reading out. Then when reading out of the memory, the state values $z_1', \ldots, z_4', z_5', z_6', c_1', \ldots, c_5'=1_{ter}, 1_{ter}, 0_{ter}, 2_{ter}, 1_{ter}, 1_{ter}, 1_{ter}, 1_{ter}, 1_{ter}, 1_{ter}, 1_{ter}$ are read out. The ternary values $z_1', \ldots, z_6', =1_{ter}, 1_{ter}, 0_{ter}, 2_{ter}, 1_{ter}, 1_{ter}$ are transformed by the subcircuit LH 16, illustrated in detail in FIG. 4, using table 8, into the auxiliary read values $y_1'$ $y_2'=LH^1(1_{ter})=01$, $y_3'$ $y_4'=LH^2(1_{ter})=01$, $y_5'$ $y_6'=LH^3(0_{ter})=00$, $y_7'$ $y_8'=LH^4(2_{ter})=11$, $y_9'=LH^5(1_{ter})=1$, $y_{10}'=LH^6(1_{ter})=1$, so that the auxiliary read values y'=(0, 1, 0, 1, 0, 0, 1, 1, 1, 1) are output by the subcircuit LH 16. These auxiliary read values and the check bits $c_1', \ldots, c_5'$=1, 1, 1, 1, 1 read out from the memory are applied to the corresponding inputs of the corrector 17. In its syndrome generator 61a of FIG. 6, the corrector forms the error syndrome $$(s_1, \ldots, s_5)^T = H \cdot (0,1,0,1,0,0,1,1,1,1,1,1,1,1,1)^T = (1,1,1,0,0)^T,$$

and the decoder 620, according to Table 15, second line, outputs the correction vector $e=e_1, \ldots, e_{10}=1, 0, \ldots, 0$, which is combined in the XOR circuit 18a with the auxiliary read values y' into the corrected auxiliary read values $$y^c = y_1^c, \ldots, y_{10}^c = y_1' \oplus 1, y_2' \oplus 0, \ldots, y_{10}' \oplus 0 = 1,1,0,1,0,0,1,1,1,1 = y' \oplus e.$$

Likewise, it may be gathered from FIG. 11 that for the syndrome 1, 1, 1, 0, $0=s_1, s_2, s_3, s_4, s_5$, the AND gate 1101 outputs the value $e_1=1$ at its output, while for all other AND gates 110i, i=2, ..., 10, $e_i=0$ applies. The error that the stored ternary value $2_{ter}$ was erroneously corrupted into $1_{ter}$ has been corrected in the auxiliary read values. From the corrected auxiliary read values $y^c$, the subcircuit BB 19, as described, forms the corrected output values $x^c$.

At the circuit output, thus, again the corrected result $x_1^c, \ldots, x_8^c=0, 0, 1, 1, 0, 1, 1, 1$ is output.

If an error detection circuit Det 120 exists, which as in FIG. 12 comprises the syndrome generator 51, the XOR tree 1201 and the OR tree 1202, then it applies for the error syndrome $s_1, \ldots, s_5=1, 1, 1, 0, 0$ that for the parity P(s) of the component of error syndrome P(s)=1 applies and for the OR operation OR(s)=1 applies, so that a 1-bit error is indicated.

Embodiments provide circuitry configured to store and to error correct sequences $x_1, \ldots, x_n$ of binary data with n≥3, which may be stored in a memory comprising memory cells which may take on ternary states, wherein from the sequences of binary states certain ternary values are stored in memory cells which may take on ternary states, and wherein when reading from the memory of possibly erroneous ternary values from the memory cells, which may take on ternary states, binary auxiliary read values are formed, wherein an encoder exists which outputs binary check bits at its outputs depending on the data $x_1, \ldots, x_n$ being input at its at least n binary inputs, wherein outputs of the encoder, which carry a binary check bit, are connected to a data input of a memory cell of the memory when writing into the memory, wherein a data input of a memory cell connected to an output of the encoder is not connected to any further output of the encoder, and wherein the encoder is configured, so that the binary check bits determined by the encoder and the binary auxiliary read values in the error-free case, form a codeword of an error-correcting code.

According to some embodiments, the encoder is implemented so that the encoder comprises, apart from n binary inputs for the input of the data values $x_1, \ldots, x_n$ furthermore q binary inputs for the input of binary values $A=A_1, \ldots, A_q=F(a_1, \ldots, a_Q)$ determined from the address bits $(a=a_1, \ldots, a_Q)$, wherein F is a unique mapping of Q-digit binary values into q-digit binary values, wherein Q is the word width of the memory address and wherein 1≤q≤Q applies, and wherein the encoder is configured, so that the binary check bits determined by the encoder, the values $A_1 \ldots, A_q$ determined from the address bits and the binary auxiliary read values form in the error-free case a codeword of an error-correcting code.

Some embodiments provide circuitry for storing of sequences of binary values $x_1, \ldots, x_n$ in a memory, wherein n≥3, wherein memory cells of a non-empty subset of memory cells of the memory may take on three state values, and wherein all memory cells which may not take on three states values may take on two state values, with the following features:

1. A subcircuit BT with n binary inputs and M outputs for the transformation of n binary input values $x_1, \ldots, x_n$ into M output values $$z_1, \ldots, z_m, z_{m+1}, \ldots, z_M = BT(x_1, \ldots, x_n)$$

exists, wherein 2≤m≤M and wherein M<n and wherein n≥4, wherein the output values $z_1, \ldots, z_m$ may take on three different values depending on the input values, and wherein the output values $z_{m+1}, \ldots, z_M$ may take on at most two different values depending on the input values, 2. The M outputs of the subcircuit BT are fed into M data inputs of a memory Sp, wherein, when writing into the memory, the output values $z_1, \ldots, z_m$ of the subcircuit BT are stored into memory cells, which may take on 3 states, and wherein the output values $z_{m+1}, \ldots, z_M$ are stored in memory cells which may take on at least two states, 3. A subcircuit LH exists for determining binary auxiliary read values $$y_1', \ldots, y_k' = LH(z_1', \ldots, z_m', z_{m+1}', \ldots, z_M')$$

with M inputs and k outputs, wherein, when reading from the memory, m first inputs of the subcircuit LH are connected to the data outputs of the memory cells of memory Sp, into which, when writing the ternary values $z_1, \ldots, z_m$ are written, and from which, when reading, the possibly erroneous ternary values $z_1', \ldots, z_m'$ are read out, and the further M−m inputs of the subcircuit LH are connected to the data outputs of the memory cells into which, when writing, the values $z_{m+1}, \ldots, z_M$ are written, and from which, when reading, the possible erroneous values $z_{m+1}', \ldots, z_M'$ are read out, and which outputs k binary auxiliary read values $y_1', \ldots, y_k'$ with k≥m+M at its k outputs.

4. An encoder Cod with n binary inputs and l binary outputs exist for determining l binary check bits $c_1, \ldots, c_l$ from the n binary input values $x_1, \ldots, x_n$ with $$c_1, \ldots, c_l = Cod(x_1, \ldots, x_n)$$

wherein at n binary inputs of the encoder Cod, the binary input values $x_1, \ldots, x_n$ are applied, and at l binary outputs, corresponding binary check bits $c_1, \ldots, c_l$ are output, and wherein the encoder is configured, so that it determines the check bits $c_1, \ldots c_l$ from the input values $x_1, \ldots, x_n$ so that the bits $$y_1, \ldots, y_k, c_1, \ldots, c_l$$

form a codeword of an error-correcting code C of the length k+l with k data bits and l check bits and the bits $$y_1, \ldots, y_k = LH[BT(x_1, \ldots, x_n)]$$

are functionally determined by the subsequent transformations of the data bits $x_1, \ldots, x_n$ by the subcircuit BT and LH, 5. For j=1, ..., l, the output of the encoder Cod carrying the check bit $c_j$ is connected to the data input of a j-th memory cell when writing into the memory, wherein the data input of this j-th memory cell is connected to no further output of the encoder, 6. A corrector Cor for an error-correcting code C with l first binary inputs and k second binary inputs exist, wherein for j=1, ..., l, the j-th input of the l first inputs of the corrector is connected to the data output of the memory cell, which is connected to the j-th output of the encoder when writing so that when an error occurred at its j-th input, the value $c_j'$ of the possibly erroneous j-th check bit is applied, and when no error occurred the correct value $c_j$ of the j-th check bit is applied, and wherein at the k bits wide second input of the corrector, the possibly erroneous auxiliary read values $y_1', \ldots, y_k'$ output by the subcircuit LH are applied and the corrector is configured so that it outputs a correction vector $e = e_1, \ldots, e_k$ at its k bit wide output so that $$y_1, \ldots, y_k = [y_1' op_1 e_1], \ldots, [y_k' op_k e_k]$$

applies, when an error which may be corrected by the error-correcting code C occurs and $op_1, \ldots, op_k$ are uniquely invertible binary operations, and where the correction vector e is equal to the zero vector $e^0 = e_1^0, \ldots, e_k^0$, when no error occurred, where $e_i^0$ is for i=1, ..., k the zero element of the operation $op_i$.

7. A combinational circuit Vkn with a k bit wide first input and a k bit wide second input and a k bit wide output exist, wherein the first k bit wide input is connected to the k bit wide output of the subcircuit LH which carries the possibly erroneous auxiliary read values $y_1', \ldots, y_k'$, and the second k bit wide input is connected to the k bit wide output of the corrector Cor which carries the correction vector $e = e_1, \ldots, e_k$, wherein the combinational circuit is configured so that it outputs at its k output the corrected auxiliary read value $$y_1^{cor}, \ldots, y_k^{cor} = [y_1' op_1 e_1], \ldots, [y_k' op_k e_k]$$

wherein $op_1, \ldots, op_k$ are uniquely invertible operations and $y_1^{cor}, \ldots, y_k^{cor} = y_1, \ldots, y_k$ applies when no error or an error correctable by the code C occurred, 8. A subcircuit BB for the transformation of the binary corrected auxiliary read values $y_1^{cor}, \ldots, y_k^{cor}$ into n binary corrected data bits $x_1^{cor}, \ldots, x_n^{cor} = BB[y_1^{cor}, \ldots, y_k^{cor}]$ exist which is configured so that when $y_1^{cor}, \ldots, y_k^{cor} = y_1, \ldots, y_k$ applies, also $x_1, \ldots, x_n = x_1^{cor}, \ldots, x_n^{cor}$ applies, 9. The subcircuit BT 11, LH 16 and BB 19 are configured so that the input values $x = x_1, \ldots, x_n$ are reproduced at least when no error occurred after the subsequent transformations of the input values by the subcircuit BT, LH and BB and $$BB\{LH[BT(x_1, \ldots, x_n)]\} = x_1, \ldots, x_n$$

applies.

In some embodiments, the encoder is implemented so that check bits determined by the encoder additionally depend on values of address bits of the write address $a = a_1, \ldots, a_Q$, and the corrector is implemented so that the correcting vector determined by the corrector additionally depends on corresponding values of address bits of the read address $a' = a_1', \ldots, a_Q'$.

According to embodiments, the encoder comprises in addition to n binary inputs for the inputs of the data bits $x_1, \ldots x_n$ further q, q≥1 binary inputs for the input of q bits $A_1, \ldots, A_q$ derived from the address bits of the read address $a = a_1, \ldots, a_Q$ $$A_1, \ldots, A_q = F(a_1, \ldots, a_Q)$$

wherein F is a unique assignment of the bits $A_1, \ldots, A_q$ to the bits $a_1, \ldots, a_Q$ of the read address, and wherein the encoder is configured so that $c_1, \ldots, c_l, y_1, \ldots, y_k, A_1, \ldots, A_q$ is a codeword of an error-correcting code C and wherein the corrector, apart from the l binary inputs for the input of the possibly erroneous check bits $c_1' \ldots c_l'$ and the k possibly erroneous auxiliary read values $y_1', \ldots, y_k'$ comprises further q binary inputs for the input of q bits $A_1', \ldots, A_q'$ derived from the Q address bits of the read address $a' = a_1', \ldots, a_Q'$, $$A_1', \ldots, A_q' = F(a_1', \ldots, a_Q').$$

In some embodiments, the corrector, apart from k binary outputs for the output of the correction values $e_1, \ldots, e_k$ for the correction of the auxiliary read values $y_1', \ldots, y_k'$ comprises further q binary outputs for the output of correction values $e_1^A, \ldots, e_q^A$ for the correction of the bits $A_1', \ldots, A_q'$ derived from the address bits of the read address.

According to embodiments, q=1 applies and $$A_1 = F(a_1, \ldots, a_Q) = a_1 \oplus \ldots \oplus a_Q$$

is the parity of the write address and $$A_1' = F(a_1', \ldots, a_Q') = a_1' \oplus \ldots \oplus a_Q'$$

is the parity of the read address.

In embodiments, $q = Q$, $A_1, \ldots, A_Q = a_1, \ldots, a_q$ and $A_1', \ldots, A_Q' = a_1', \ldots, a_q'$ applies.

According to some embodiments, the outputs of the corrector carrying the correction values $e_1^A, \ldots, e_q^A$ are fed into q inputs of an error detection circuit which, when the correction value $e_1^A, \ldots, e_q^A$ correspond to an address correction indicates an address error at its output.

In embodiments, the error detection circuit is realised as a NOR circuit with q inputs in which the q inputs are connected to the q correction values $e_1^A, \ldots, e_q^A$ of the outputs of the corrector.

According to some embodiments, the code C is a linear code.

In embodiments, the corrector is a series circuit of a syndrome generator and a decoder.

According to embodiments, the corrector is a series connection of a syndrome generator and a decoder and the syndrome generator is connected to an address error determiner which outputs a signal "address error" when the error syndrome determined by the syndrome generator corresponds to an address error.

In some embodiments, for $j=1, \ldots, l$ the j-th output for the check bit $c_j$ of the encoder, the check bit $c_j$ is connected to the input of a subcircuit $bt_j$ for the transformation of a binary value $c_j$ into a ternary value $c_j^{ter}$ in which the output when writing is connected to the data input of a memory cell for storing the ternary value $c_j^{ter}$, and wherein when reading the data output of the ternary memory cell for storing the ternary value $c_j^{ter}$ is connected to the input of a subcircuit $tb_j$ for the transformation of a ternary value $c_j^{ter'}$ into a binary value $c_j'$, in which the output is connected to the corresponding inputs of the corrector, wherein $tb_j[bt_j(c_j)]=c_j$ applies.

According to embodiments, the binary value 0 is transformed into a minimum ternary value by the subcircuit $bt_j$, and wherein the value 1 is transformed into a maximum ternary value by the subcircuit $bt_j$.

In embodiments, the binary value 0 is transformed into a maximum ternary value by the subcircuit $bt_j$, and wherein the value 1 is transformed into a minimum ternary value by the subcircuit $bt_j$.

According to embodiments, for at least one $j \in \{1, \ldots, l\}$, the j-th output of the coder, when writing, is connected directly to the data input of a memory cell for storing a binary value $c_j$, and wherein, when reading, the data output of the memory cell for storing the binary value $c_j$ is directly connected to the corresponding input of the corrector.

In some embodiments, the code C is a linear code with a generator matrix $G=(l, P)$ and the coder is implemented so that the check bits $c=c_1, \ldots, c_l$ are determined according to the relation $$c=c_1, \ldots, c_l = '(LH[BT(x_1, \ldots, x_n)]) \cdot P = (y_1, \ldots, y_k) \cdot P$$

wherein G is a (k, k+l) matrix when the address bits are not included in error detection and the check bits are determined according to the relation $$c=c_1, \ldots, c_l = \{LH[BT(x_1, \ldots, x_n)], A_1, \ldots, A_q\} \cdot$$
$$P = (y_1, \ldots, y_k, A_1, \ldots, A_q) \cdot P,$$

wherein G is a (k+q, k+l+q) matrix when the address bits are included in error detection via the bits $A_1, \ldots, A_q$ derived from the address bits $a_1, \ldots, a_Q$.

According to embodiments, the subcircuit BT 11 for the transformation of the input values $x_1, \ldots, x_n$ into the output values $z_1, \ldots, z_m, z_{m+1}, \ldots, z_M$ is a series connection of a subcircuit BSS 94 for the transformation of the input values $x_1, \ldots, x_n$ into k binary auxiliary write values $y_1^s, \ldots, y_k^s$ and a subcircuit BTS 95 for the transformation of the binary auxiliary write values $y_1^s, \ldots, y_k^s$ into the output values $z_1, \ldots, z_m, z_{m+1}, \ldots, z_M$ of the circuit BT 11.

In embodiments, the subcircuit BSS is implemented so that the auxiliary write values $y_1^s, \ldots, y_k^s$ determined by the subcircuit BSS are equal to the error-free auxiliary read values $y_1, \ldots, y_k$ determined by the subcircuits BB and LH, and the encoder is implemented so that it determines the check bits $c_1, \ldots, c_l$ using the auxiliary write values output by the subcircuit BBS.

According to embodiments, the encoder is implemented so that the check bits $c=c_1, \ldots, c_l$ are determined according to the relation $$c=c_1, \ldots, c_l = BBS(x_1, \ldots, x_n) \cdot P = (y_1^s, \ldots, y_k^s) \cdot P$$

wherein G is a (k, k+l) matrix when the address bits are not included in error detection and are determined according to the relation $$c=c_1, \ldots, c_l = \{BBS(x_1, \ldots, x_n), A_1, \ldots, A_q\} \cdot$$
$$P = (y_1^s, \ldots, y_k^s, A_1, \ldots, A_q) \cdot P,$$

wherein G is a (k+q, k+l+q) matrix when the address bits are included in error detection via the bits $A_1, \ldots, A_q$ derived from the address bits $a_1, \ldots, a_Q$.

According to an embodiment, the subcircuit LH 16 for determining binary auxiliary read values $y_1', \ldots, y_k' = LH(z_1', \ldots, z_M')$ from the state values $z_1', \ldots, z_M'$ read out from the memory is implemented so that component-wise to each ternary state component $y_i'$, $i=1, \ldots, m$ at least two binary auxiliary read values are assigned and to each binary state component $z_{m+1}, \ldots, z_M$ at least one binary auxiliary read value is assigned, and so that $k \geq m+M$ applies, Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of embodiments can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to embodiments comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. A circuitry, comprising:
a memory comprising a plurality of memory cells, wherein one or more of the plurality of memory cells of the memory are each configured to take on one of at least three different states;
a first subcircuit configured to generate a plurality of output values based on a sequence of binary values, wherein each of the plurality of output values is equal to one of at least three different basic values, wherein the first subcircuit is configured to store each of the output values as a state value in a different one of the one or more memory cells which are each configured to take on one of the at least three different states;
a second subcircuit configured to read the state value from each of at least one of the memory cells which are configured to take on one of the at least three different states, wherein the state value is one the three different basic values, wherein the second subcircuit is furthermore configured to determine binary auxiliary read values based on the state value of each of the at least one of the memory cells, and
an encoder configured to generate one or more binary check bits based on at least a portion of the sequence of binary values, wherein an error-correcting code comprises a plurality of codewords, and wherein the encoder is configured to generate the one or more binary check bits so that the binary auxiliary read values and the one or more binary check bits together form one of the codewords of the error-correcting code, when the binary auxiliary read values and the one or more binary check bits are error-free,
wherein the encoder is configured to store each of the generated one or more check bits in one or more of the memory cells of the memory, such that each of the one or more check bits is stored in a different one of the memory cells of the memory, wherein each one of the memory cells in which a check bit is stored is configured to take on one of at least two different states.

2. The circuitry according to claim 1,
wherein the one or more of the plurality of memory cells of the memory, which are each configured to take on one of at least three different states, are ternary memory cells, wherein the ternary memory cells are configured to take on one of exactly three different states,
wherein the first subcircuit is configured to generate the plurality of output values such that each of the plurality of output values has one of exactly three different basic values, wherein the first subcircuit is configured to store each of the output values as a state value in a different one of the ternary memory cells, and
wherein the second subcircuit is configured to read the one or more state values from at least one of the ternary memory cells, wherein each of the one or more state values has one of exactly three different basic values, wherein the second subcircuit is furthermore configured to determine the binary auxiliary read values based on the one or more state values.

3. The circuitry according to claim 1,
wherein the circuitry furthermore comprises a corrector and a combinational circuit,
wherein the second subcircuit is configured to feed the binary auxiliary read values into the corrector and into the combinational circuit,
wherein the corrector is configured to read the one or more check bits from one or more of the memory cells of the memory, and generate the error correction bits based on the binary auxiliary read values and the one or more check bits, and feed the error correction bits into the combinational circuit, and
wherein the combinational circuit is configured to conduct error correction on the binary auxiliary read values based on the error correction bits to obtain binary auxiliary error-free read values, if the error is correctable by the error-correcting code.

4. The circuitry according to claim 3, wherein the combinational circuit is configured to conduct error correction such that the binary auxiliary error-free read values and the one or more check bits form one of the codewords of the error-correcting code.

5. The circuitry according to claim 3, wherein the circuitry further comprises a third subcircuit configured to transform the binary auxiliary error-free read values into n binary error-corrected data bits, wherein n is an integer.

6. The circuitry according to claim 2,
wherein the sequence of binary values comprises n bits, wherein n is an integer, and n≥3,
wherein the encoder comprises at least n encoder input ports configured to receive the binary data,
wherein the encoder comprises one or more encoder output ports,
wherein the encoder is configured to receive the sequence of binary values at the at least n encoder input ports,
wherein the encoder is configured to output the one or more binary check bits at the one or more encoder output ports,
wherein one or more of the encoder output ports, which are configured to carry one or more of the binary check bits, respectively, are connected to an input port of one of the memory cells of the memory, respectively, when writing into the memory,
wherein each input port of each of the memory cells which is connected to one of the output ports of the encoder is not connected to any further output port of the encoder, and
wherein the encoder is configured so that the one or more binary check bits and the binary auxiliary read values determined by the encoder in the error-free case form one of the codewords of the error-correcting code.

7. The circuitry according to claim 1, wherein the encoder is configured to generate the one or more binary check bits based on address bits $a=a_1, \ldots, a_Q$.

8. The circuitry according to claim 7, wherein the encoder is configured to generate the one or more binary check bits such that the binary check bits determined by the encoder, binary values $A_1 \ldots, Aq$ depending on the address bits $a=a_1, \ldots, a_Q$ and the binary auxiliary read values form in the error-free case a codeword of an error-correcting code.

9. The circuitry according to claim 6,
wherein the encoder is implemented so that the encoder comprises furthermore q binary inputs for the input of binary values $A_1, \ldots, A_q$, wherein $A_1, \ldots, A_q = F(a_1, \ldots, a_Q)$ applies, wherein $a_1, \ldots, a_Q$ are address bits, wherein F is a unique mapping of Q-digit binary values into q-digit binary values, wherein Q is the word width of a memory address of the memory, wherein $1 \leq q \leq Q$ applies, and wherein the encoder is configured, so that the binary check bits determined by the encoder, the values $A_1 \ldots, Aq$ determined from the address bits and the binary auxiliary read values form in the error-free case a codeword of an error-correcting code.

10. A circuitry, comprising:
a memory comprising a plurality of memory cells, wherein one or more of the plurality of memory cells of the memory are ternary memory cells each being configured to take on one of three different states;
a first subcircuit configured to generate a plurality of output values, based on a sequence of binary values, wherein each of the plurality of output values has one of three different basic values, wherein the first subcircuit is configured to store each of the output values as a state value in a different one of the one or more ternary memory cells which are each configured to take on one of the three different states;
a second subcircuit configured to read the state value from each of at least one of the ternary memory cells which are configured to take on one of the three different states, wherein the state value is one of the three different basic values, wherein the second subcircuit is furthermore configured to determine binary auxiliary read values based on the state value of each of the at least one of the ternary memory cells;
an encoder configured to generate one or more binary check bits based on at least a portion of the sequence of binary values, wherein an error-correcting code comprises a plurality of codewords, and wherein the encoder is configured to generate the one or more binary check bits so that the binary auxiliary read values and the one or more binary check bits together form one of the codewords of the error-correcting code, when the binary auxiliary read values and the one or more binary check bits are error-free, wherein the encoder is configured to store each of the generated one or more check bits in one or more of the memory cells of the memory, such that each of the one or more check bits is stored in a different one of the memory cells of the memory, wherein each one of the memory cells in which a check bit is stored is configured to take on one of at least two different states;
a corrector;
a combinational circuit; and
a third subcircuit,
wherein the second subcircuit is configured to feed the binary auxiliary read values into the corrector and into the combinational circuit,
wherein the corrector his configured to read the one or more check bits from one or more of the memory cells of the memory, wherein the corrector is configured to generate the error correction bits based on the binary auxiliary read values and the one or more check bits, and wherein the corrector is configured to feed the error correction bits into the combinational circuit,
wherein the combinational circuit is configured to conduct error correction on the binary auxiliary read values based on the error correction bits to obtain binary auxiliary error-free read values, and
wherein the third subcircuit is configured to transform the binary auxiliary error-free read values into n binary corrected data bits.

11. A circuitry being configured to store sequences of binary values $x_1, \ldots, x_n$ in a memory comprising memory cells, wherein $n \geq 4$, wherein each of the memory cells of the memory is either configured to take on one of three state values or to take on one of two state values, wherein at least one of the memory cells of the memory is configured to take on one of three state values, and wherein the circuitry comprises:
a first subcircuit having n binary inputs and M outputs, wherein the first subcircuit is configured to transform n binary input values $x_1, \ldots, x_n$ into M output values $z_1, \ldots, z_m, z_{m+1}, \ldots, z_M = BT(x_1, \ldots, x_n)$, wherein $2 \leq m \leq M$, wherein $M < n$, wherein each of the output values $z_1, \ldots, z_m$ has one of three different values depending on the binary input values, and wherein each of the output values $z_{m+1}, \ldots, z_M$ has one of at most two different values depending on the binary input values, wherein the first subcircuit has M outputs which are connected with M data inputs of the memory, wherein, when writing into the memory, the output values $z_1, \ldots, z_m$ of the first subcircuit are stored into the memory cells of the memory, which are configured to take on one of three states, and wherein the output values $z_{m+1}, \ldots, z_M$ are stored in memory cells which are configured to take on one of at least two state values;
a second subcircuit configured to determine binary auxiliary read values $y_1', \ldots, y_k' = LH(z_1', \ldots, z_m', z_{m+1}', \ldots, z_M')$, wherein the second subcircuit has M inputs and k outputs, wherein, when reading from the memory, m first inputs of the inputs of the second subcircuit are connected to the data outputs of the memory cells of memory, into which, when writing, the ternary values $z_1, \ldots, z_m$ are written, and from which, when reading, ternary values $z_1', \ldots, z_m'$ are read out which are erroneous or not erroneous, and further M−m inputs of the second subcircuit are connected to the data outputs of the memory cells into which, when writing, the values $z_m, \ldots, z_M$ are written, and from which, when reading, the values $z_{m+1}', \ldots, z_M'$ are read out which are erroneous or not erroneous, and wherein the second subcircuit outputs k binary auxiliary read values $y_1', \ldots, y_k'$ with $k \geq m+M$ at its k outputs;
an encoder with n binary inputs and l binary outputs configured to determine l binary check bits $c_1, \ldots, c_l$ from the n binary input values $x_1, \ldots, x_n$ with $c_1, \ldots, c_l = \text{Cod}(x_1, \ldots, x_n)$, wherein at n binary inputs of the encoder, the binary input values $x_1, \ldots, x_n$ are applied, and at l binary outputs of the encoder, binary check bits $c_1, \ldots, c_l$ determined by the binary input values $x_1, \ldots, x_n$ are output, and wherein the encoder is configured to determine the check bits $c_1, \ldots c_l$ from the binary input values $x_1, \ldots, x_n$ so that bits $y_1, \ldots, y_k$, $c_1, \ldots, c_l$ form a codeword of an error-correcting code of the length k+l with k data bits and l check bits, such that each of the binary check bits is stored in a different one of the memory cells.

12. The circuitry according to claim 11, wherein bits $y_1, \ldots, y_k = LH[BT(x_1, \ldots, x_n)]$ are determined by transformations of the binary input values $x_1, \ldots, x_n$ by the first subcircuit and by the second subcircuit, wherein, for $j=1, \ldots, l$, the output of the encoder carrying the check bit $c_j$ is connected to the data input of a j-th memory cell when writing into the memory, wherein the data input of this j-th memory cell is connected to no further output of the encoder.

13. The circuitry according to claim 12, wherein the circuitry further comprises a corrector for an error-correcting code with l first binary inputs and k second binary inputs, wherein for $j=1, \ldots, l$, the j-th input of the l first inputs of the corrector is connected to the data output of the memory cell, which is connected to the j-th output of the encoder when writing so that when an error occurs at its j-th input, the value $c'_j$ of the j-th check bit, which is erroneous or not erroneous, is applied, and when no error occurs the corrected value $c_j$ of the j-th check bit is applied, and wherein at the k bits wide second input of the corrector, the auxiliary read values $y_1', \ldots, y_k'$, which are erroneous or not erroneous, output by the second subcircuit are applied, and wherein the corrector is configured to output a correction vector $e=e_1, \ldots, e_k$ at its k bit wide output so that $y_1, \ldots, y_k = [y_1' \text{ op}_1 e_1], \ldots, [y_k' \text{ op}_k e_k]$ applies, when an error which may be corrected by the error-correcting code occurs and $\text{op}_1, \ldots, \text{op}_k$ are uniquely invertible binary operations.

14. The circuitry according to claim 13, wherein the circuitry further comprises a combinational circuit with a k bit wide first input and a k bit wide second input and a k bit wide output, wherein the first k bit wide input of the combinational circuit is connected to the k bit wide output of the second subcircuit which carries the auxiliary read values $y_1', \ldots, y_k'$, which are erroneous or not erroneous, and wherein the second k bit wide input of the combinational circuit is connected to the k bit wide output of the corrector which carries the correction vector $e=e_1, \ldots, e_k$, and wherein the combinational circuit is configured to output at its k outputs the corrected auxiliary read value $y_1^{cor}, \ldots, y_k^{cor} = [t_1' \text{ op}_1 e_1], \ldots, [y_k' \text{ op}_k e_k]$, wherein $\text{op}_1, \ldots, \text{op}_k$ are uniquely invertible operations, and wherein $y_1^{cor}, \ldots, y_k^{cor} = y_1, \ldots, y_k$ applies when no error or an error correctable by the code exist.

15. The circuitry according to claim 14, wherein the circuitry further comprises a third subcircuit configured to transform the binary corrected auxiliary read values $y_1^{cor}, \ldots, y_k^{cor}$ into n binary corrected data bits $x_1^{cor}, \ldots, x_n^{cor} = BB[y_1^{cor}, \ldots, y_k^{cor}]$, wherein the third subcircuit is configured so that when $y_1^{cor}, \ldots, y_k^{cor} = y_1, \ldots, y_k$ applies, also $x_1, \ldots x_n = x_1^{cor}, \ldots, x_n^{cor}$ applies.

16. The circuitry according to claim 15, wherein the first subcircuit, the second subcircuit and the third subcircuit are configured so that the input values $x = x_1, \ldots, x_n$ are reproduced at least when no error occurred after the subsequent transformations of the input values by the first subcircuit, by the second subcircuit and by the third subcircuit, and wherein $BB\{LH[BT(x_1, \ldots, x_n)]\} = x_1, \ldots, x_n$ applies.

17. The circuitry according to claim 16, wherein the encoder is configured so that check bits determined by the encoder furthermore depend on values of address bits of a write address $a = a_1, \ldots, a_Q$, and wherein the corrector is configured so that the correcting vector determined by the corrector additionally depends on corresponding values of address bits of a read address.

18. The circuitry according to claim 17,
wherein the encoder comprises, in addition to n binary inputs for the inputs of the binary input values $x_1, \ldots x_n$, further q binary inputs for the input of q bits $A_1, \ldots, A_q$, $q \geq 1$, derived from the address bits of the read address, wherein $A_1, \ldots, A_q = F(a_1, \ldots, a_Q)$ applies,
wherein F is a unique assignment of the bits $A_1, \ldots, A_q$ to the bits $a_1, \ldots, a_Q$ of the read address, and wherein the encoder is configured so that $c_1, \ldots, c_l, y_1, \ldots, y_k, A_1, \ldots, A_q$ is a codeword of an error-correcting code,
wherein the corrector, apart from the l binary inputs for the input of the check bits $c_1' \ldots c_l'$, which are erroneous or not erroneous, and the k auxiliary read values $y_1', \ldots, y_k'$, which are erroneous or not erroneous, comprises further q binary inputs for the input of q bits $A_1', \ldots, A_q'$ derived from the Q address bits of the read address, and
wherein $A_1', \ldots, A_q' = F(a_1', \ldots, a_Q')$ applies.

19. The circuitry according to claim 18, wherein the corrector, apart from k binary outputs for the output of the correction values $e_1, \ldots, e_k$ for the correction of the auxiliary read values $y_1', \ldots, y_k'$, comprises further q binary outputs for the output of correction values $e_1^A, \ldots, e_q^A$ for the correction of the bits $A_1', \ldots, A_q'$ derived from the address bits of the read address.

20. The circuitry according to claim 18, wherein q=1 and $A_1 = F(a_1, \ldots, a_Q) = a_1 \oplus \ldots \oplus a_Q$ is the parity of the read address and
$A_1' = F(a_1', \ldots, a_Q') = a_1' \oplus \ldots \oplus a_Q'$ is the parity of the write address.

21. The circuitry according to claim 18,
wherein $q = Q$, $A_1, \ldots, A_Q = a_1, \ldots, a_q$ and $A_1', \ldots, A_Q' = a_1', \ldots, a_q'$.

22. The circuitry according to claim 19, wherein the outputs of the corrector carrying the correction values $e_1^A, \ldots, e_q^A$ are fed into q inputs of an error detection circuit which, when the correction value $e_1^A, \ldots, e_q^A$ corresponds to an address correction and indicates an address error at its output.

23. The circuitry according to claim 22, wherein the error detection circuit comprises a NOR circuit with q inputs in which the q inputs are connected to the q correction values $e_1^A, \ldots, e_q^A$ of the outputs of the corrector.

24. The circuitry according to claim 16, wherein the code is a linear code.

25. The circuitry according to claim 16, wherein the corrector comprises a series connected circuit of a syndrome generator and a decoder.

26. The circuitry according to claim 17, wherein the corrector comprises a series connection of a syndrome generator and a decoder, and the syndrome generator is connected to an address error determiner which outputs a signal "address error" when the error syndrome determined by the syndrome generator corresponds to an address error.

27. The circuitry according to claim 16, wherein for $j=1, \ldots, l$ the j-th output of the encoder, wherein the check bit $c_j$ is connected to the input of a fourth subcircuit for the transformation of a binary value $c_j$ into a ternary value $c_j^{ter}$ in which the output when writing is connected to the data input of a memory cell for storing the ternary value $c_j^{ter}$, and wherein when writing the data output of the ternary memory cell for storing the ternary value $c_j^{ter}$ is connected to the input of a fifth subcircuit for the transformation of a ternary value $c_j^{ter'}$ into a binary value $c'_j$, in which the output is connected to the corresponding inputs of the corrector, wherein $tb_j[bt_j(c_j)] = c_j$ applies.

28. The circuitry according to claim 27, wherein the binary value 0 is transformed into a minimum ternary value by the fourth subcircuit, and wherein the value 1 is transformed into a maximum ternary value by the fourth subcircuit.

29. The circuitry according to claim 27, wherein the binary value 0 is transformed into a maximum ternary value by the fourth subcircuit, and wherein the value 1 is transformed into a minimum ternary value by the fourth subcircuit.

30. The circuitry according to claim 16, wherein for at least one $j \in \{1, \ldots, l\}$, the j-th output of the coder, when writing, is connected directly to a data input of a memory cell for storing a binary value $c_j$, and wherein, when reading, the data output of the memory cell employed for storing the binary value $c_j$, is directly connected to the corresponding input of the corrector.

31. The circuitry according to claim 16, wherein the code is a linear code with a generator matrix $G=(I, P)$ and the coder is implemented so that the check bits $c=c_1, \ldots, c_l$ are determined according to the relation $$c = c_1, \ldots, c_l = LH[BT(x_1, \ldots, x_n)] \cdot P = (y_1, \ldots, y_k) \cdot P$$

wherein G is a (k, k+l)-matrix, I is a k-dimensional identity matrix and P is a (k, l)-parity matrix, when the address bits are not included in error correction or error detection, where k indicates the number of the binary auxiliary read values, where l indicates the number of the check bits.

32. The circuitry according to claim 16, wherein the code is a linear code with a generator matrix $G=(I, P)$ and the coder is implemented so that the check bits $c=c_1, \ldots, c_l$ are determined according to the relation $$c = c_1, \ldots, c_l = \{LH[BT(x_1, \ldots, x_n)], A_1, \ldots, A_q\} \cdot P = (y_1, \ldots, y_k, A_1, \ldots, A_{ij}) \cdot P$$

wherein G is a (k+q, k+q+l)-matrix, I is a (k+q) identity matrix and P is a (k+q, l)-parity matrix when the address bits are used for error detection via the bits $A_1, \ldots, A_q$ derived from the address bits $a_1, \ldots, a_Q$, where k indicates the number of the binary auxiliary read values, where l indicates the number of the check bits, and where q indicates the number of the bits $A_1, \ldots, A_q$ derived from the address bits $a_1, \ldots, a_Q$.

33. The circuitry according to claim 16, wherein the first subcircuit for the transformation of the input values $x_1, \ldots, x_n$ into the output values $z_1, \ldots, z_m, z_{m+1}, \ldots, z_M$ is a series connection of a sixth subcircuit for the transformation of the input values $x_1, \ldots, x_n$ into k binary auxiliary write values $y_1^s, \ldots, t_k^s$ and a seventh subcircuit for the transformation of the binary auxiliary write values $y_1^s, \ldots, y_k^s$ into the output values $z_1, \ldots, z_m, z_{m+1}, \ldots, z_M$ of the first subcircuit.

34. The circuitry according to claim 33, wherein the sixth subcircuit is implemented so that the auxiliary write values $y_1^s, \ldots, y_k^s$ determined by the sixth subcircuit are equal to the error-free auxiliary read values $y_1, \ldots, y_k$ determined by the second subcircuit and the third subcircuit, and the encoder is implemented so that it determines the check bits $c_1, \ldots, c_l$ using the auxiliary write values output by the sixth subcircuit.

35. The circuitry according to claim 31, wherein the encoder is implemented so that the check bits $c=c_1, \ldots, c_l$ are determined according to the relation $$c = c_1, \ldots, c_l = BBS(x_1, \ldots, x_n) \cdot P = (y_1^s, \ldots, y_k^s) \cdot P,$$

wherein P is the (k, l)-parity matrix of the error-correcting code.

36. The circuitry according to claim 32, wherein the encoder is configured so that the check bits $c=c_1, \ldots, c_l$ are determined according to the relation $$c = c_1, \ldots, c_l = \{BBS(x_1, \ldots, x_n), A_1, \ldots, A_q\} \cdot P = (y_1^s, \ldots, y_k^s, A_1, \ldots, A_q) \cdot P$$

wherein P is a (k+q, l)-parity matrix when the address bits are utilized for error detection via the bits $A_1, \ldots, A_q$ derived from the address bits $a_1, \ldots, a_Q$.

37. The circuitry according to claim 16, wherein the second subcircuit for determining binary auxiliary read values $y_1', \ldots, y_k' = LH(z_1', \ldots, z_M')$ from the state values $z_1', \ldots, z_M'$ read out from the memory is configured so that component-wise to each ternary state component $z_i'$, i=1, \ldots, m at least two binary auxiliary read values are assigned and to each binary state component $z_{m+1}, \ldots, z_M$ at least one binary auxiliary read value is assigned, and so that $k \geq m+M$ applies.

38. Circuitry for storing binary data $x_1, \ldots, x_n$ and for error correction with a binary code, wherein the circuitry comprises:
a ternary memory circuitry comprising a ternary memory with ternary memory cells, wherein the ternary memory circuitry is configured such that binary data $x_1, \ldots, x_n$ is writable as encoded ternary states $z_1, \ldots, z_M$ at a write address $a_1, \ldots, a_Q$ in one or more first memory cells of the memory cells of the ternary memory, wherein the first memory cells of the memory cells of the ternary memory are configured to take on one of three different states;
a coder configured to write binary check bits $c_1, \ldots, c_l$ in second memory cells of the memory cells of the ternary memory, wherein the coder is configured to write the binary check bits $c_1, \ldots, c_l$ at a write address $a_1, \ldots, a_Q$ associated with the data bits $x_1, \ldots, x_n$, when the binary check bits $c_1, \ldots, c_l$ are check bits of the data bits $x_1, \ldots, x_n$, and when the data bits $x_1, \ldots, x_n$ are written at the write address $a_1, \ldots, a_Q$,
wherein the ternary memory circuitry is configured to output, when reading at a read address $a_1', \ldots, a_Q'$ of memory cells of the ternary memory, the memory cells configured to take on three different values, state values $z_1', \ldots, z_M'$ and transform the state values $z_1', \ldots, z_M'$ into binary auxiliary read values $y_1', \ldots, y_k'$, which are erroneous or not erroneous, and
wherein the ternary memory circuitry is configured to output, when reading at a read address $a_1', \ldots, a_Q'$ of memory cells of the ternary memory, check bits $c_1', \ldots, c_l'$, which are erroneous or not erroneous, and
wherein the ternary memory circuitry is configured to output, when the write address is equal to the read address and when no error is present, error-free auxiliary read values $y_1, \ldots, y_k$ and error-free check bits $c_1, \ldots, c_l$,
wherein coder comprises a first n-bit wide first input for input of data bits $x_1, \ldots, x_n$ and a further q-bit wide input for input of bits $A_1, \ldots, A_q$ and an l-bit wide output for output of check bits $c_1, \ldots, c_l$ wherein the bits $A_1, \ldots, A_q$ depend on the bits of the write address $a_1, \ldots, a_Q$, wherein the data bits $x_1, \ldots, x_n$, and the corresponding check bits are written to the write address $a_1, \ldots, a_Q$, and wherein the coder is configured such that the check bits $c_1, \ldots, c_l$ are determined from the data bits $x_1, \ldots, x_n$ and the bits $A_1, \ldots, A_q$, so that $$y_1, \ldots, y_k, A_1, \ldots, A_q, c_1, \ldots, c_l$$

is a codeword of the error-correcting code, and wherein the bits $A_1, \ldots, A_q$ are uniquely determined from the bits of the write address $a_1, \ldots, a_Q$, so that the bits $A_1, \ldots, A_q$ are output values of a combinational circuitry with Q binary inputs and q binary outputs, when the write address $a_1, \ldots, a_Q$ is fed into the inputs of said circuitry, wherein q≤Q applies.

39. The circuitry according to claim 38, wherein q=Q, and wherein $a_1, \ldots, a_Q = A_1, \ldots, A_Q$.

40. The circuitry according to claim 38, wherein $A_1 = a_1 \oplus \ldots \oplus a_Q$.

41. The circuitry according to claim 38, wherein the code is a linear code.

42. The circuitry according to claim 39, wherein the code is a linear code.

43. The circuitry according to claim 40, wherein the code is a linear code.

44. The circuitry according to claim 38, wherein the code is a linear code with a generator matrix G=(l, P), and wherein l is a (k+q)-identity matrix, and wherein P is a [(k+q), l]-parity matrix, and wherein the check bits $c_1, \ldots, c_l$ are defined by $$c_1, \ldots, c_l = (y_1, \ldots, y_k, A_a, \ldots, A_Q) \cdot P.$$

45. A method, comprising:
generating a plurality of output values based on a sequence of binary values, wherein each of the plurality of output values has one of at least three different basic values;
storing each of the output values as a state value in a different one of one or more memory cells of a plurality of memory cells of a memory, wherein the one or more memory cells, in which the output values are stored, are each configured to take on one of at least three different states;
reading one or more of the state values from at least one of the memory cells which are configured to take on one of the at least three different states, wherein each of the one or more state values has one of at the at least three different basic values, wherein the binary auxiliary read values are determined based on the one or more state values;
generating one or more binary check bits so that the binary auxiliary read values and the one or more binary check bits together form one of the codewords of the error-correcting code, when the binary auxiliary read values $y_1', \ldots, y_k'$ and the one or more binary check bits $c_1, \ldots, c_l$ are error-free; and
storing each of the generated one or more check bits in one or more of the memory cells of the memory, such that each of the one or more check bits is stored in a different one of the memory cells of the memory, wherein each one of the memory cells in which a check bit is stored is configured to take on one of at least two different states.

* * * * *

UNITED STATES PATENT AND TRADEMARK OFFICE
CERTIFICATE OF CORRECTION

PATENT NO. : 8,935,590 B2
APPLICATION NO. : 13/664495
DATED : January 13, 2015
INVENTOR(S) : Thomas Kern et al.

Page 1 of 1

It is certified that error appears in the above-identified patent and that said Letters Patent is hereby corrected as shown below:

In the Claims

Column 46, Claim 10, Line 10 Please replace "…the corrector his configured…" with --…the corrector is configured…--

Column 47, Claim 14, Line 50 Please replace "…value $y_1^{cor},…,y_k^{cor}=[t_1'\ op_1\ e_1],…,[y_k'\ op_k\ e_k]$, wherein…" with -- …value $y_1^{cor},…,y_k^{cor} = [y_1'\ op_1\ e_1],…,[y_k'\ op_k\ e_k]$, wherein… --

Signed and Sealed this
Seventh Day of April, 2015

Michelle K. Lee
*Director of the United States Patent and Trademark Office*